US 11,953,675 B2

(12) United States Patent
Sugimoto et al.

(10) Patent No.: US 11,953,675 B2
(45) Date of Patent: Apr. 9, 2024

(54) OPTICAL DEVICE PRODUCTION METHOD

(71) Applicant: HAMAMATSU PHOTONICS K.K., Hamamatsu (JP)

(72) Inventors: Tatsuya Sugimoto, Hamamatsu (JP); Tomofumi Suzuki, Hamamatsu (JP); Kyosuke Kotani, Hamamatsu (JP); Yutaka Kuramoto, Hamamatsu (JP); Daiki Suzuki, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 18/072,227

(22) Filed: Nov. 30, 2022

(65) Prior Publication Data
US 2023/0138044 A1 May 4, 2023

Related U.S. Application Data

(63) Continuation of application No. 16/761,294, filed as application No. PCT/JP2018/029117 on Aug. 2, 2018.

(30) Foreign Application Priority Data

Nov. 15, 2017 (JP) ................................ 2017-220237

(51) Int. Cl.
*B81B 3/00* (2006.01)
*B81C 1/00* (2006.01)
(Continued)

(52) U.S. Cl.
CPC ........ *G02B 26/0841* (2013.01); *B81B 3/0045* (2013.01); *B81C 1/00555* (2013.01);
(Continued)

(58) Field of Classification Search
CPC ............ B81B 3/0045; B81B 2201/042; B81B 2203/0109; B81B 2203/0154;
(Continued)

(56) References Cited

U.S. PATENT DOCUMENTS 6,507,138 B1  1/2003 Rodgers et al.
6,541,831 B2  4/2003 Lee et al.
(Continued)

FOREIGN PATENT DOCUMENTS

CN  1619351 A  5/2005
CN  1650214 A  8/2005
(Continued)

OTHER PUBLICATIONS

Anonymous, "Michelson Interferometer—Definition and Applications", URL:https://www.azooptics.com/Article.aspx?ArticleID=698, May 6, 2014, XP093017159.
(Continued)

*Primary Examiner* — Moazzam Hossain
(74) *Attorney, Agent, or Firm* — Faegre Drinker Biddle & Reath LLP

(57) ABSTRACT

An optical device includes a support portion a movable unit and a pair of torsion bars disposed on both sides of the movable unit on a first axis. The movable unit includes a main body portion, a ring-shaped portion surrounding the main body portion when viewed from a predetermined direction perpendicular to the first axis, two connection portions connecting the main body portion and the ring-shaped portion to each other, and a rib portion provided to the main body portion. Each of the two connection portions includes two connection regions that are separated from each other by a space and the each of the two connection region connects the main body portion and the ring-shaped portion to each other. The rib portion includes four extending portions radially extending between a center of the main body portion and the four connection regions respectively when viewed from the predetermined direction.

10 Claims, 28 Drawing Sheets

(51) Int. Cl.
  *G02B 7/182* (2021.01)
  *G02B 26/08* (2006.01)
  *G02B 26/10* (2006.01)
  *H02N 1/00* (2006.01)

(52) U.S. Cl.
  CPC ......... *G02B 7/1821* (2013.01); *G02B 26/105* (2013.01); *H02N 1/008* (2013.01); *B81B 2201/042* (2013.01); *B81C 2201/013* (2013.01); *B81C 2201/0174* (2013.01); *B81C 2201/0198* (2013.01)

(58) Field of Classification Search
  CPC ...... B81B 2201/033; B81B 2203/0136; B81B 2203/04; B81C 1/00555; B81C 2201/013; B81C 2201/0174; B81C 2201/0198; G02B 26/0841; G02B 7/1821; G02B 26/0833; G02B 26/001; H02N 1/008; G01J 3/45
  See application file for complete search history.

(56) References Cited

U.S. PATENT DOCUMENTS

| | | |
|---|---|---|
| 7,699,296 B1 | 4/2010 | Knollenberg et al. |
| 8,165,323 B2 | 4/2012 | Zhou |
| 8,353,600 B1 | 1/2013 | Fu |
| 8,729,770 B1 | 5/2014 | Milanovic |
| 11,187,872 B2 | 11/2021 | Sugimoto et al. |
| 2001/0044165 A1 | 11/2001 | Lee et al. |
| 2002/0109894 A1 | 8/2002 | Clark et al. |
| 2004/0004775 A1 | 1/2004 | Turner et al. |
| 2004/0081391 A1 | 4/2004 | Ko et al. |
| 2004/0184135 A1 | 9/2004 | Miles et al. |
| 2004/0232107 A1 | 11/2004 | Kouma et al. |
| 2005/0099665 A1 | 5/2005 | Lee et al. |
| 2005/0194650 A1 | 9/2005 | Hung |
| 2005/0194840 A1 | 9/2005 | Mori et al. |
| 2006/0082250 A1 | 4/2006 | Ko et al. |
| 2008/0123242 A1 | 5/2008 | Zhou |
| 2008/0198249 A1 | 8/2008 | Tanimura et al. |
| 2008/0247029 A1 | 10/2008 | Zhou |
| 2008/0284078 A1 | 11/2008 | Wolter et al. |
| 2009/0107949 A1 | 4/2009 | Kouma et al. |
| 2009/0109512 A1 | 4/2009 | Park |
| 2009/0225387 A1 | 9/2009 | Mizuno et al. |
| 2010/0208347 A1 | 8/2010 | Kouma et al. |
| 2011/0080627 A1 | 4/2011 | He et al. |
| 2011/0090551 A1 | 4/2011 | Pirk et al. |
| 2011/0109194 A1* | 5/2011 | Hung ............... H02N 1/008 310/300 |
| 2011/0205608 A1 | 8/2011 | Mizoguchi |
| 2012/0099176 A1 | 4/2012 | Zhou |
| 2012/0160557 A1 | 6/2012 | Yamada et al. |
| 2012/0162739 A1* | 6/2012 | Yamada ............... G02B 26/101 359/212.1 |
| 2012/0236382 A1 | 9/2012 | Puegner et al. |
| 2013/0083379 A1 | 4/2013 | Tanaka et al. |
| 2013/0194555 A1 | 8/2013 | Davis et al. |
| 2013/0321892 A1 | 12/2013 | Haeberle et al. |
| 2014/0125950 A1 | 5/2014 | Shimada et al. |
| 2014/0137670 A1 | 5/2014 | Hata et al. |
| 2014/0300942 A1 | 10/2014 | Van Lierop et al. |
| 2014/0327946 A1 | 11/2014 | van Lierop et al. |
| 2014/0355091 A1 | 12/2014 | Mizutani |
| 2014/0362460 A1 | 12/2014 | Nozu et al. |
| 2015/0028698 A1 | 1/2015 | Gutierrez |
| 2015/0234176 A1 | 8/2015 | Zhou |
| 2016/0025964 A1 | 1/2016 | Torayashiki et al. |
| 2016/0202473 A1 | 7/2016 | Uchino et al. |
| 2016/0216508 A1 | 7/2016 | Tamamori |
| 2017/0139200 A1 | 5/2017 | Chang et al. |

FOREIGN PATENT DOCUMENTS

| | | |
|---|---|---|
| CN | 1790181 A | 6/2006 |
| CN | 1837892 A | 9/2006 |
| CN | 101246258 A | 8/2008 |
| CN | 101279708 A | 10/2008 |
| CN | 101284642 A | 10/2008 |
| CN | 101290395 A | 10/2008 |
| CN | 101316789 A | 12/2008 |
| CN | 101410744 A | 4/2009 |
| CN | 101786592 A | 7/2010 |
| CN | 101894711 A | 11/2010 |
| CN | 102177465 A | 9/2011 |
| CN | 102265033 A | 11/2011 |
| CN | 102369153 A | 3/2012 |
| CN | 102667497 A | 9/2012 |
| CN | 102712460 A | 10/2012 |
| CN | 102868383 A | 1/2013 |
| CN | 103288034 A | 9/2013 |
| CN | 103803478 A | 5/2014 |
| CN | 203825034 U | 9/2014 |
| CN | 104216109 A | 12/2014 |
| CN | 104272167 A | 1/2015 |
| CN | 104348326 A | 2/2015 |
| CN | 104428439 A | 3/2015 |
| CN | 104964678 A | 10/2015 |
| CN | 105453408 A | 3/2016 |
| CN | 105492879 A | 4/2016 |
| CN | 105594114 A | 5/2016 |
| CN | 105826252 A | 8/2016 |
| CN | 105899995 A | 8/2016 |
| CN | 106500682 A | 3/2017 |
| CN | 106597016 A | 4/2017 |
| CN | 106604887 A | 4/2017 |
| CN | 106707415 A | 5/2017 |
| EP | 1677086 A1 | 7/2006 |
| EP | 3015901 A1 | 5/2016 |
| EP | 3070508 A1 | 9/2016 |
| JE | 2010-054944 A | 3/2010 |
| JP | H8-506857 A | 7/1996 |
| JP | 2000-214407 A | 8/2000 |
| JP | 2002-524271 A | 8/2002 |
| JP | 2002-326197 A | 11/2002 |
| JP | 2003-029178 A | 1/2003 |
| JP | 2004-177543 A | 6/2004 |
| JP | 2004-215534 A | 8/2004 |
| JP | 2004-325578 A | 11/2004 |
| JP | 2005-010453 A | 1/2005 |
| JP | 2005-275198 A | 10/2005 |
| JP | 2006-343481 A | 12/2006 |
| JP | 2007-155965 A | 6/2007 |
| JP | 2007-183400 A | 7/2007 |
| JP | 2007-188073 A | 7/2007 |
| JP | 2008-055516 A | 3/2008 |
| JP | 2008-083122 A | 4/2008 |
| JP | 2009-171394 A | 7/2009 |
| JP | 2010-008611 A | 1/2010 |
| JP | 2010-029976 A | 2/2010 |
| JP | 2010-085506 A | 4/2010 |
| JP | 2010-128116 A | 6/2010 |
| JP | 2010-184334 A | 8/2010 |
| JP | 2011-069954 A | 4/2011 |
| JP | 2011-175044 A | 9/2011 |
| JP | 2012-042666 A | 3/2012 |
| JP | 2012-108165 A | 6/2012 |
| JP | 2012-133242 A | 7/2012 |
| JP | 2012-184962 A | 9/2012 |
| JP | 2012-198298 A | 10/2012 |
| JP | 2012-524295 A | 10/2012 |
| JP | 2012-528343 A | 11/2012 |
| JP | 2013-009447 A | 1/2013 |
| JP | 2013-016651 A | 1/2013 |
| JP | 2013-080068 A | 5/2013 |
| JP | 2013-148707 A | 8/2013 |
| JP | 2014-006418 A | 1/2014 |
| JP | 2014-023207 A | 2/2014 |
| JP | 2014-035429 A | 2/2014 |
| JP | 2014-115267 A | 6/2014 |
| JP | 2014-215534 A | 11/2014 |

(56) References Cited

FOREIGN PATENT DOCUMENTS

| | | |
|---|---|---|
| JP | 2014-235260 A | 12/2014 |
| JP | 2014-238581 A | 12/2014 |
| JP | 2015-093340 A | 5/2015 |
| JP | 2015-102483 A | 6/2015 |
| JP | 2015-219516 A | 12/2015 |
| JP | 2016-085299 A | 5/2016 |
| JP | 2016-114798 A | 6/2016 |
| JP | 2016-151681 A | 8/2016 |
| JP | 2016-200834 A | 12/2016 |
| JP | 2016-212221 A | 12/2016 |
| JP | 2017-058418 A | 3/2017 |
| JP | 2017-070163 A | 4/2017 |
| JP | 2017-129783 A | 7/2017 |
| TW | 201531709 A | 8/2015 |
| TW | I563290 B | 12/2016 |
| TW | 201717371 A | 5/2017 |
| TW | 201718896 A | 6/2017 |
| TW | I588533 B | 6/2017 |
| WO | WO 94/018697 | 8/1994 |
| WO | WO 00/013210 A2 | 3/2000 |
| WO | WO 2009/124607 A1 | 10/2009 |
| WO | WO 2010/121185 A1 | 10/2010 |
| WO | WO 2010/136358 A2 | 12/2010 |
| WO | WO 2011/091012 A2 | 7/2011 |
| WO | WO 2013/046612 A1 | 4/2013 |
| WO | WO 2015/068400 | 5/2015 |
| WO | WO 2016/002453 A1 | 1/2016 |

OTHER PUBLICATIONS

International Preliminary Report on Patentability dated Jan. 16, 2020 for PCT/JP2018/025634.

International Preliminary Report on Patentability dated Jan. 16, 2020 for PCT/JP2018/025635.

International Preliminary Report on Patentability dated Jan. 16, 2020 for PCT/JP2018/025636.

International Preliminary Report on Patentability dated Jan. 16, 2020 for PCT/JP2018/025637.

International Preliminary Report on Patentability dated Jan. 16, 2020 for PCT/JP2018/025638.

International Preliminary Report on Patentability dated Jan. 16, 2020 for PCT/JP2018/025639.

International Preliminary Report on Patentability dated Jan. 16, 2020 for PCT/JP2018/025640.

Sandner, Thilo et al., "Out-of-plane translatory MEMS actuator with extraordinary large stroke for optical path length modulation in miniaturized FTIR Spectrometers," SENSOR+TEST Conferences 2011, Proceedings IRS2, Jun. 9, 2011, p. 151-p. 156.

International Preliminary Report on Patentability dated May 28, 2020 for PCT/JP2018/032760.

International Preliminary Report on Patentability dated May 28, 2020 for PCT/JP2018/029117.

Sun Fengming et al., "MEMS Based Micro Displacement Sensor and Its Application", Chinese Journal of Sensors and Actuators, vol. 26, No. 2, Feb. 2013, p. 293-p. 296.

Akin Aydemir et al., "A new design and a fabrication approach to realize a high performance three axes capacitive MEMS accelerometer", Sensors and Actuators A Physical, vol. 244, Jul. 15, 2016, p. 324-p. 333.

Sandner Thilo et al., "Translatory MEMS actuator and their system integration for miniaturized Fourier transform spectrometers", MOEMS and Miniaturized Systems XI, SPIE, 1000 20th St. Bellingham WA 98225-6705 USA, vol. 8252, No. 1, Mar. 8, 2012, p. 1-p. 10, XP060023646.

\* cited by examiner

Fig. 13A
(a)
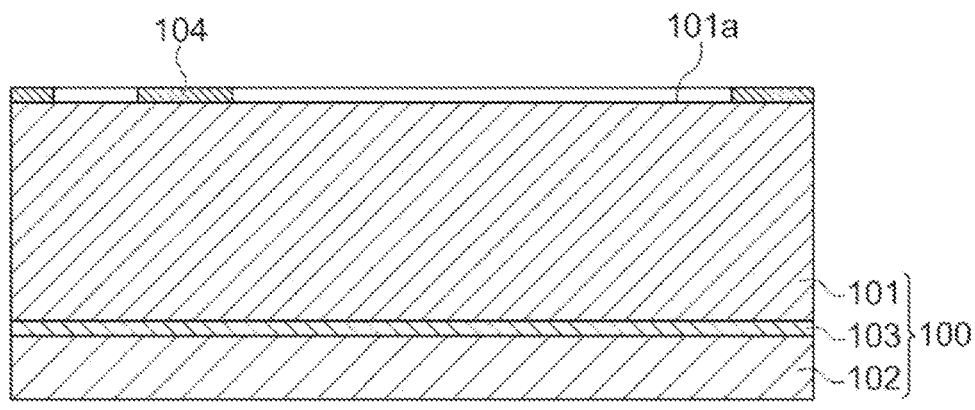
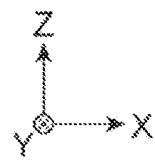
Fig. 13B
(b)
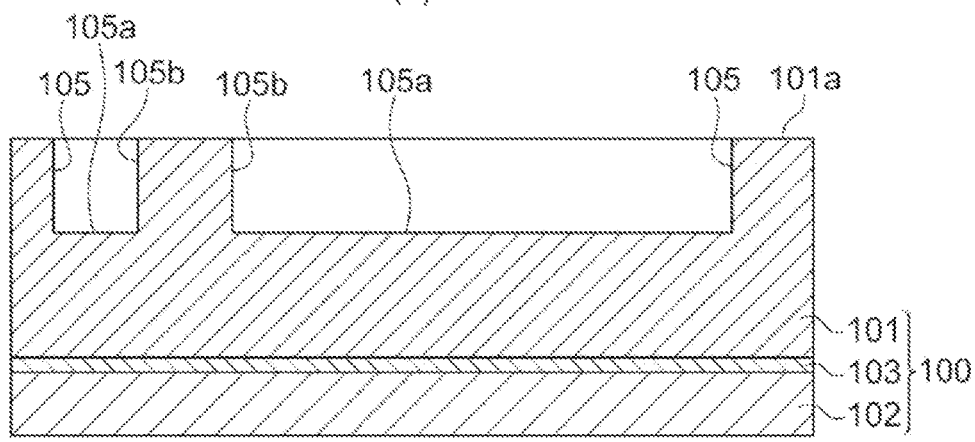
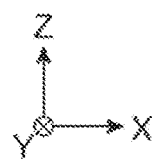

Fig. 14A
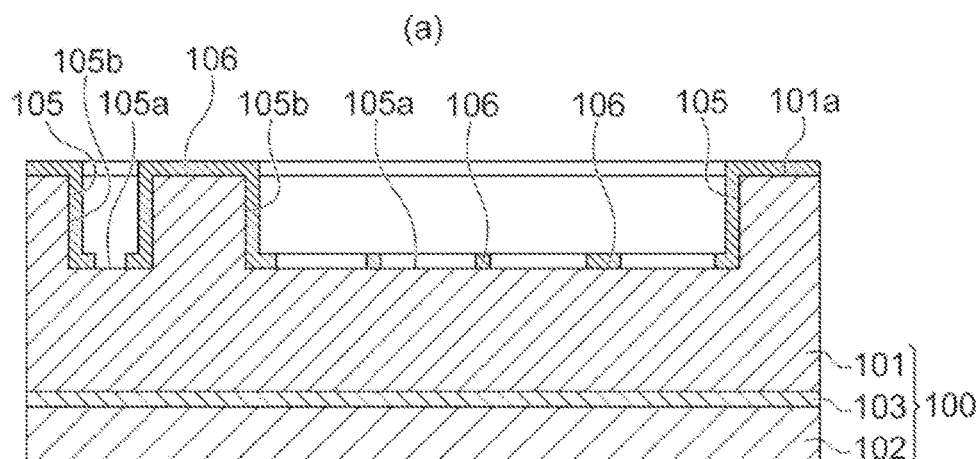
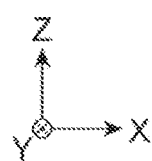
Fig. 14B
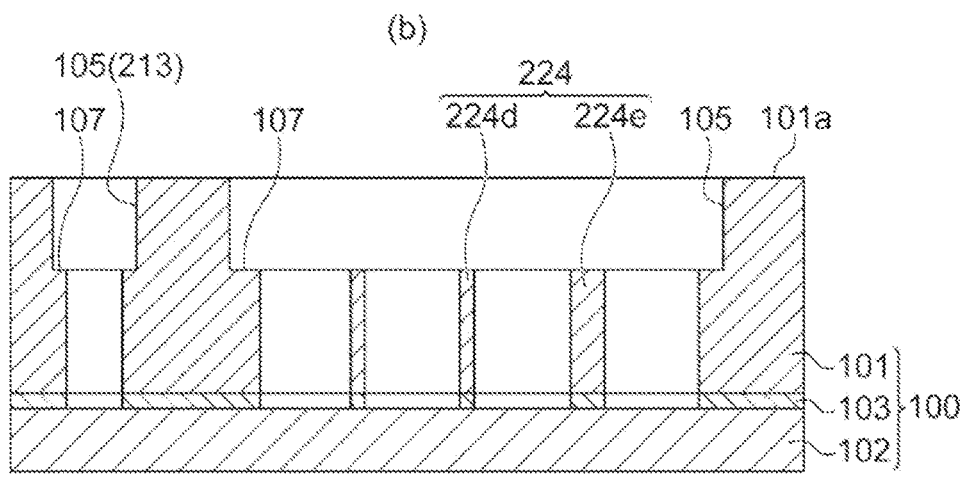
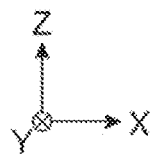

(a)

(b)

(a)

(b)

(a)

(b)

(a)

(b)

OPTICAL DEVICE PRODUCTION METHOD

TECHNICAL FIELD

The present disclosure relates to a method for manufacturing an optical device.

BACKGROUND ART

As a micro electro mechanical systems (MEMS) device constituted by a silicon on insulator (SOI) substrate, there is known an optical device including a base, a movable unit, an elastic support portion connected between the base and the movable unit, and an optical function unit disposed on the movable unit (for example, refer to Patent Literature 1).

CITATION LIST

Patent Literature

Patent Literature 1: US Unexamined Patent Publication No. 2008/0284078

SUMMARY OF INVENTION

Technical Problem

In the above-described optical device, it is considered to provide a rib portion to the movable unit or the elastic support portion so as to suppress deformation of the movable unit or the elastic support portion during movement. In the optical device, it is required to form the rib portion with accuracy from the viewpoint of controllability of the movable unit or the like.

An object of an aspect of the present disclosure is to provide a method for manufacturing an optical device capable of forming the rib portion with accuracy.

Solution to Problem

According to an aspect of the present disclosure, there is provided a method for manufacturing an optical device, the optical device includes: a base, a movable unit, an elastic support portion connected between the base and the movable unit, and an optical function unit disposed on the movable unit, the base, the movable unit, and the elastic support portion being constituted by a semiconductor substrate including a first semiconductor layer, a second semiconductor layer, and an insulating layer disposed between the first semiconductor layer and the second semiconductor layer, the base being constituted by the first semiconductor layer, the second semiconductor layer, and the insulating layer, at least one of the movable unit and the elastic support portion including a rib portion constituted at least by the first semiconductor layer and disposed on the second semiconductor layer, and the first semiconductor layer constituting the rib portion being thinner than the first semiconductor layer constituting the base. The method includes: a first step of preparing the semiconductor substrate that includes a portion corresponding to the base, the movable unit, and the elastic support portion; a second step of forming a first resist layer in a region corresponding to the base on a surface of the first semiconductor layer which is opposite to the insulating layer after the first step; a third step of forming a depression in the first semiconductor layer by etching the first semiconductor layer up to an intermediate portion in a thickness direction using the first resist layer as a mask after the second step; a fourth step of forming a second resist layer in a region corresponding to the rib portion on a bottom surface of the depression, a side surface of the depression, and the surface of the first semiconductor layer which is opposite to the insulating layer after the third step; and a fifth step of forming the rib portion by etching the first semiconductor layer until reaching the insulating layer using the second resist layer as a mask after the fourth step.

In the optical device obtained by the method for manufacturing the optical device, the first semiconductor layer constituting the rib portion is thinner than the first semiconductor layer constituting the base. Accordingly, it is possible to realize protection of the rib portion by suppressing the rib portion from protruding from the base while suppressing deformation of the movable unit and/or the elastic support portion by the rib portion. On the other hand, in a typical manufacturing method, it is difficult to form the rib portion with accuracy. In contrast, in the method for manufacturing the optical device, the rib portion is formed by two-stage etching using the first resist layer and the second resist layer as a mask. Hence, it is possible to form the rib portion with accuracy.

In the first step, the semiconductor substrate in which the first semiconductor layer is thicker than the second semiconductor layer may be prepared. In this case, in the obtained optical device, it is possible to secure the thickness of the rib portion, and it is possible to more appropriately suppress deformation of the movable unit and/or the elastic support portion.

The method for manufacturing the optical device according to the aspect of the present disclosure may further include a sixth step of forming the optical function unit on a surface of the second semiconductor layer on a side of the insulating layer after the fifth step. In this case, it is possible to protect the optical function unit by the base and the rib portion, and for example, it is possible to suppress damage of the optical function unit due to direct contact, for example, during transportation.

The rib portion may include a plurality of portions having widths different from each other. According to the method for manufacturing the optical device of the present disclosure, even in a case where the rib portion includes a plurality of portions having widths different from each other, it is possible to form the rib portion with accuracy.

The elastic support portion may support the movable unit so that the movable unit is capable of moving along a direction that intersects a main surface of the base. According to the method for manufacturing the optical device of the present disclosure, in the case of manufacturing the optical device, it is possible to form the rib portion with accuracy.

The elastic support portion may support the movable unit so that the movable unit is capable of swinging around a predetermined axial line. According to the method for manufacturing the optical device of the present disclosure, in the case of manufacturing the optical device, it is possible to form the rib portion with accuracy.

The optical device may further include a fixed comb electrode provided to the base and including a plurality of fixed comb fingers, and a movable comb electrode provided to at least one of the movable unit and the elastic support portion and including a plurality of movable comb fingers disposed alternately with the plurality of fixed comb fingers. According to the method for manufacturing the optical device of the present disclosure, in the case of manufacturing the optical device, it is possible to form the rib portion with accuracy.

The optical device may further include a coil or a piezoelectric element provided ton the movable unit. According to the method for manufacturing the optical device of the present disclosure, in the case of manufacturing the optical device, it is possible to form the rib portion with accuracy.

The rib portion may be constituted by the first semiconductor layer and the insulating layer. According to the method for manufacturing the optical device of the present disclosure, in the case of manufacturing the optical device, it is possible to form the rib portion with accuracy.

Advantageous Effects of Invention

According to the aspect of the present disclosure, it is possible to provide a method for manufacturing an optical device which is capable of forming a rib portion with accuracy.

BRIEF DESCRIPTION OF DRAWINGS

FIG. 13A and FIG. 13B are views for describing a method for manufacturing the mirror device according to the first embodiment.

FIG. 14A and FIG. 14B are views for describing the method for manufacturing the mirror device according to the first embodiment.

DESCRIPTION OF EMBODIMENTS

Figure 1:
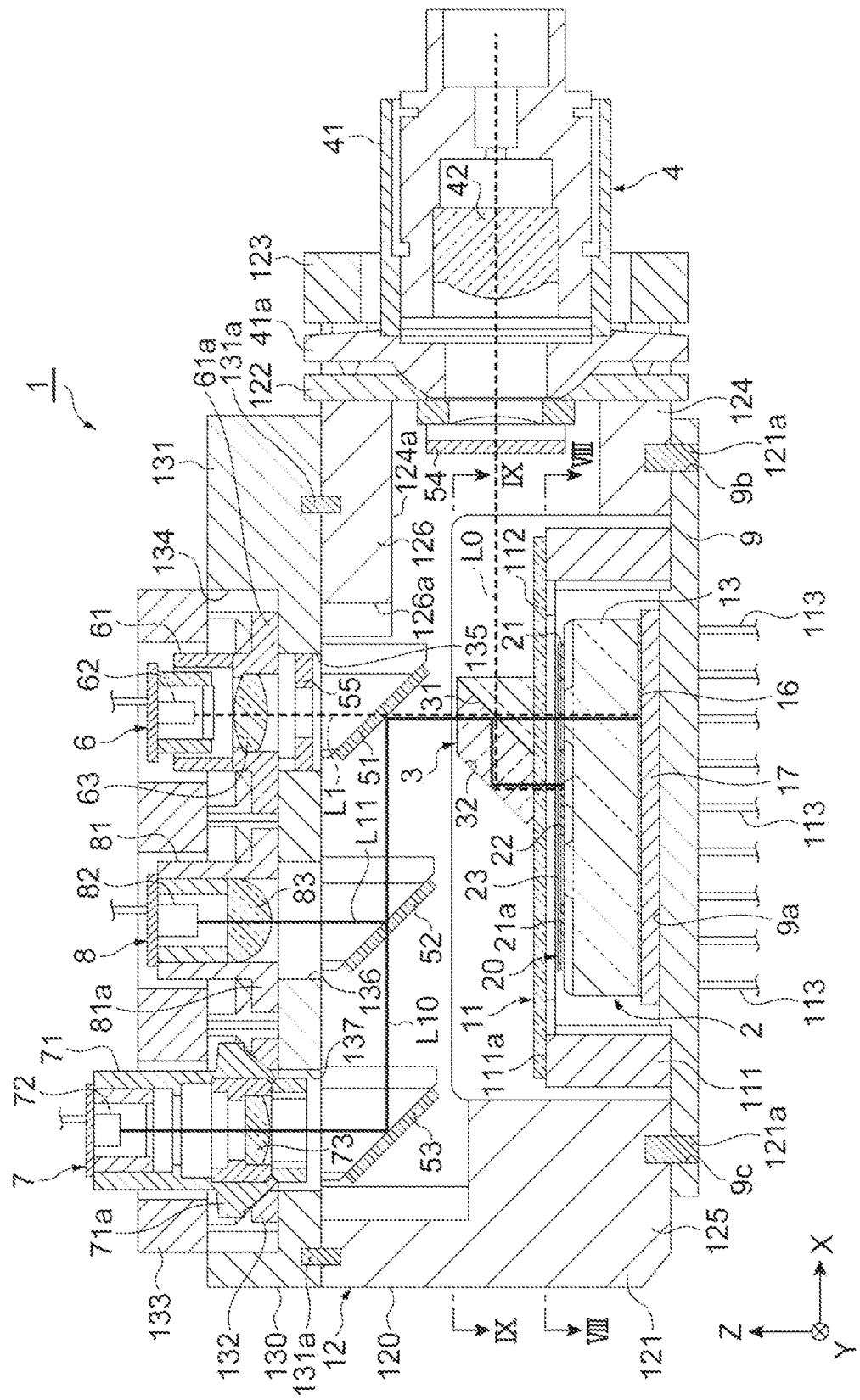
FIG. 1 is a cross-sectional view of an optical module of a first embodiment.

Hereinafter, an embodiment of the present disclosure will be described in detail with reference to the accompanying drawings. The same reference numeral will be given to the same or equivalent parts in the respective drawings, and redundant description thereof will be omitted.

First Embodiment

[Configuration of Optical Module]

As illustrated in FIG. 1, an optical module 1 includes a mirror unit 2, a beam splitter unit 3, a light incident unit 4, a first light detector 6, a second light source 7, a second light detector 8, a support 9, a first support structure 11, and a second support structure 12. The mirror unit 2 is disposed on one side of the support 9 in a Z-axis direction (a first direction), and is attached to the support 9, for example, by an adhesive. For example, the support 9 is formed of copper tungsten, and has a rectangular plate shape. The mirror unit 2 includes a movable mirror 22 that moves in the Z-axis direction, and a fixed mirror 16 of which a position is fixed (details thereof will be described later). For example, the Z-axis direction is a vertical direction, and the one side in the Z-axis direction is an upper side.

The beam splitter unit 3 is disposed on one side of the mirror unit 2 in the Z-axis direction, and is supported by the first support structure 11. The first support structure 11 is attached to the support 9, for example, by an adhesive. The light incident unit 4 is disposed on one side of the beam splitter unit 3 in an X-axis direction (a third direction perpendicular to the first direction), and is supported by the second support structure 12. The first light detector 6, the second light source 7, and the second light detector 8 are disposed on the one side of the beam splitter unit 3 in the Z-axis direction, and are supported by the second support structure 12. The second support structure 12 is attached to the support 9, for example, by a bolt.

In the optical module 1, an interference optical system is constituted by the beam splitter unit 3, the movable mirror 22, and the fixed mirror 16 with respect to each of measurement light L0 and laser light L10. The interference optical system constituted with respect to each of the measurement light L0 and the laser light L10 is, for example, a Michelson interference optical system.

With regard to the measurement light L0, interference light L1 of measurement light is detected as follows. That is, when the measurement light L0 that is incident from a first light source (not illustrated) through a measurement target (not illustrated) or the measurement light L0 that is generated from the measurement target (for example, light emitted from the measurement target itself, or the like) is incident to the beam splitter unit 3 from the light incident unit 4, the measurement light L0 is divided into a part and the remainder in the beam splitter unit 3. The part of the measurement light L0 is reflected by the movable mirror 22 that reciprocates in the Z-axis direction, and returns to the beam splitter unit 3. On the other hand, the remainder of the measurement light L0 is reflected by the fixed mirror 16 and returns to the beam splitter unit 3. The part and the remainder of the measurement light L0, which return to the beam splitter unit 3, are emitted from the beam splitter unit 3 as the interference light L1, and the interference light L1 of the measurement light is detected by the first light detector 6.

With regard to the laser light L10, interference light L11 of laser light is detected as follows. That is, when the laser light L10 emitted from the second light source 7 is incident to the beam splitter unit 3, the laser light L10 is divided into a part and the remainder in the beam splitter unit 3. The part of the laser light L10 is reflected by the movable mirror 22 that reciprocates in the Z-axis direction, and returns to the beam splitter unit 3. On the other hand, the remainder of the laser light L10 is reflected by the fixed mirror 16 and returns to the beam splitter unit 3. The part and the remainder of the laser light L10, which return to the beam splitter unit 3, are emitted from the beam splitter unit 3 as the interference light L11, and the interference light L11 of the laser light is detected by the second light detector 8.

According to the optical module 1, measurement of a position of the movable mirror 22 in the Z-axis direction can be measured based on a detection result of the interference light L11 of the laser light, and spectral analysis with respect to the measurement target can be performed based on a measurement result of the position, and a detection result of the interference light L1 of the measurement light.

[Configuration of Mirror Unit]

Figure 2:
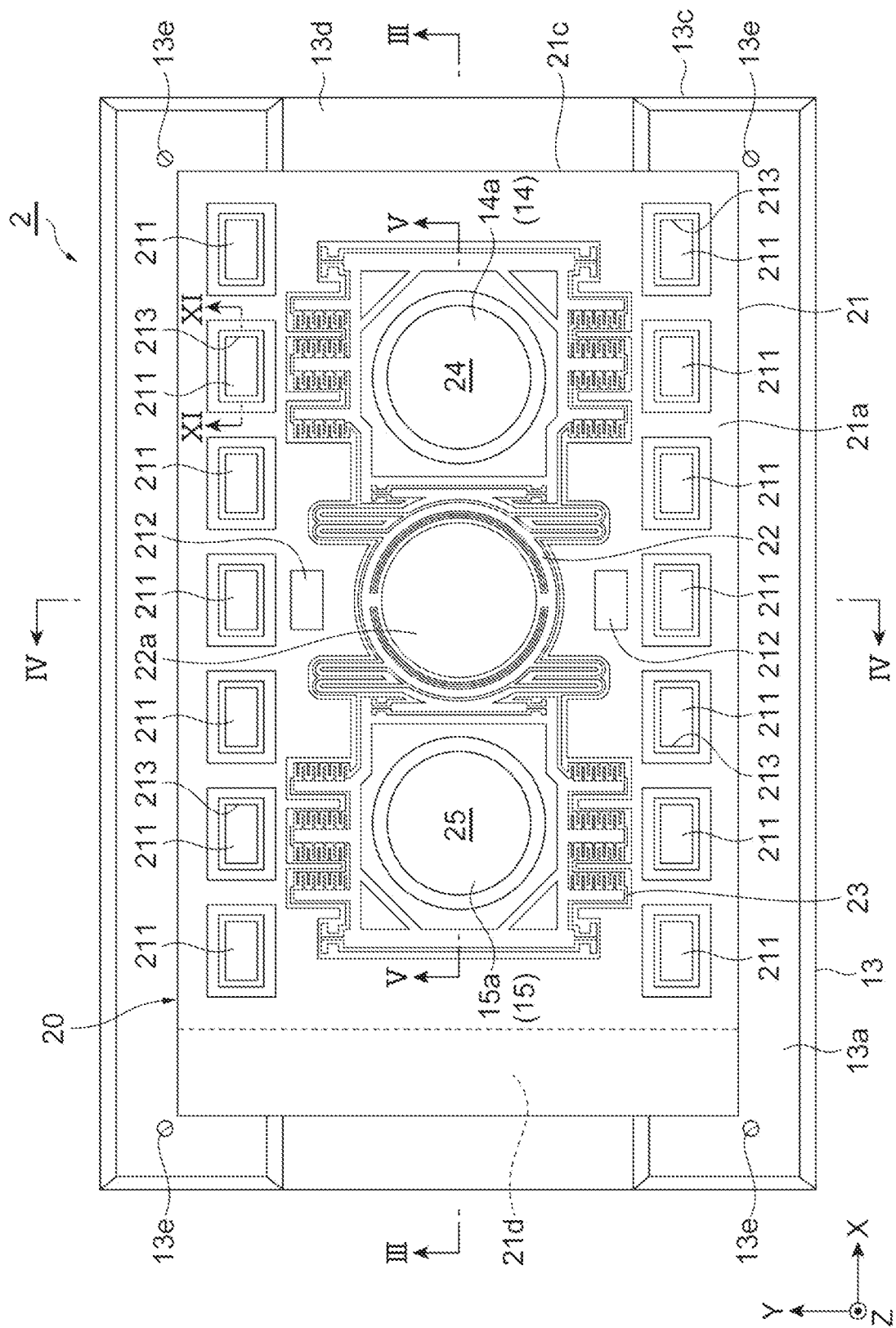
FIG. 2 is a plan view of a mirror unit illustrated in FIG. 1.
Figure 3:
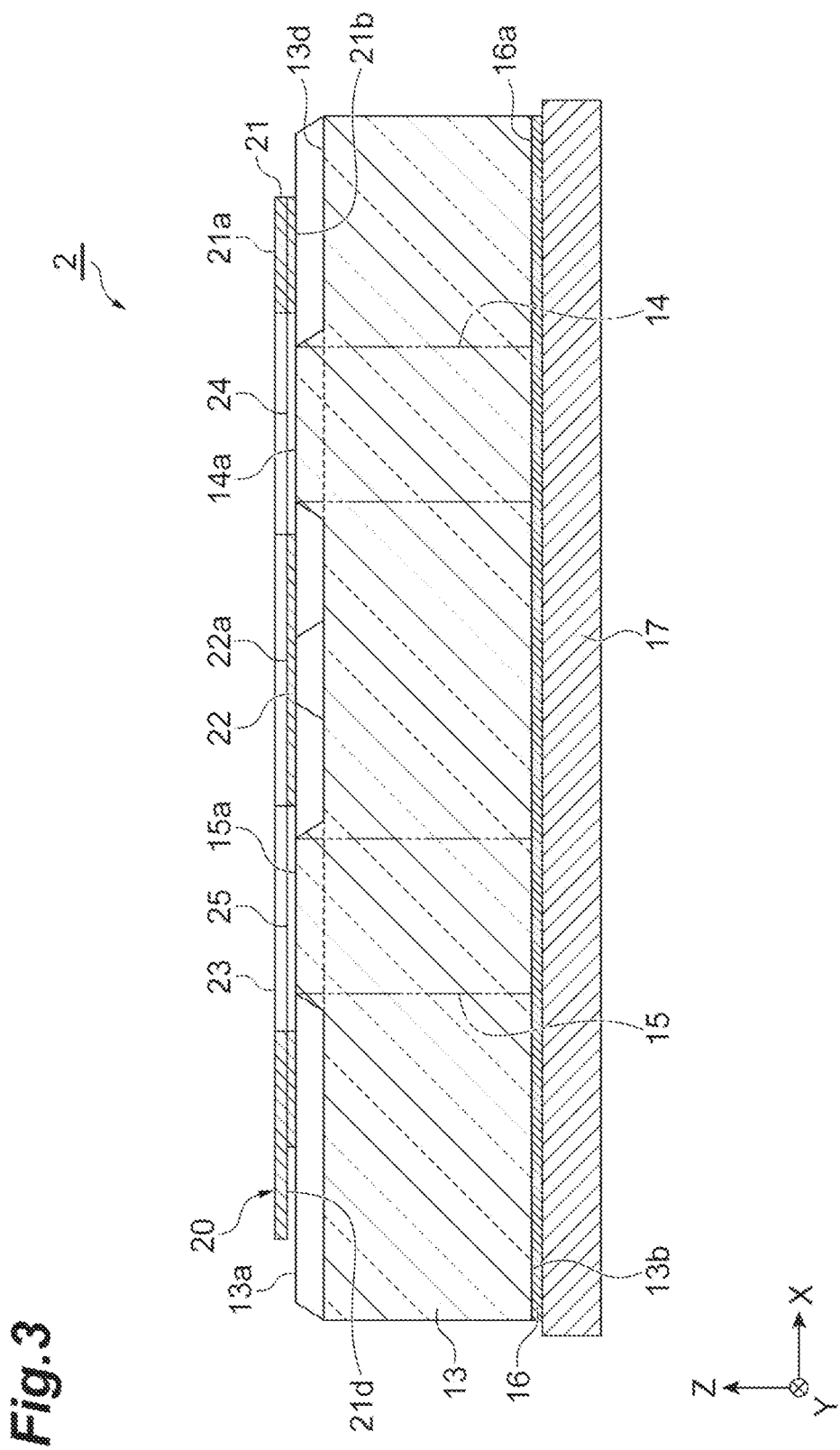
FIG. 3 is a cross-sectional view of the mirror unit taken along line III-III illustrated in FIG. 2.
Figure 4:
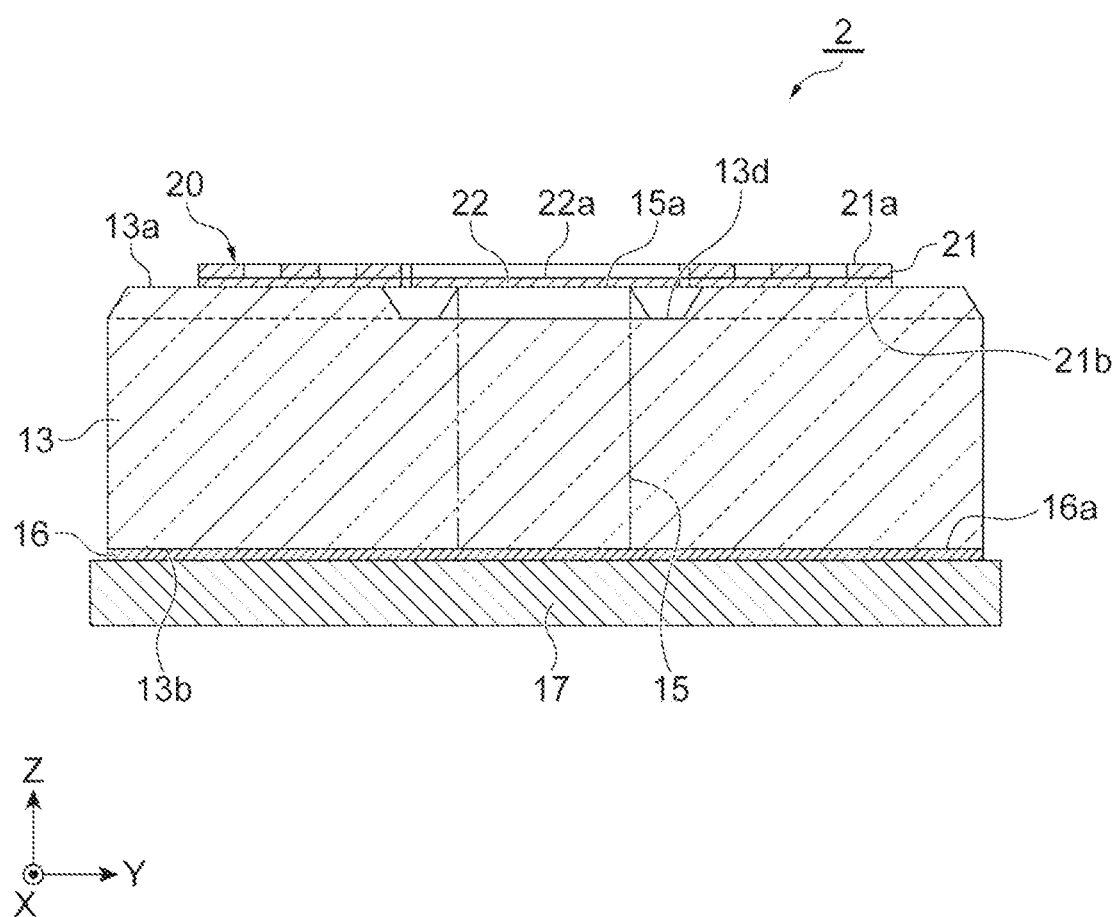
FIG. 4 is a cross-sectional view of the mirror unit taken along line IV-IV illustrated in FIG. 2.

As illustrated in FIG. 2, FIG. 3, and FIG. 4, the mirror unit 2 includes a mirror device (optical device) 20, an optical function member 13, the fixed mirror 16, and a stress mitigation substrate 17. The mirror device 20 includes a base 21, a movable mirror 22, and a drive unit 23.

The base 21 includes a first surface 21a (surface on the one side in the Z-axis direction) and a second surface 21b opposite to the first surface 21a. Each of the first surface 21a and the second surface 21b is a main surface of the base 21. For example, the base 21 has a rectangular plate shape, and a size of approximately 10 mm×15 mm×0.35 mm (thickness). The movable mirror 22 includes a mirror surface (optical function member) 22a, and a movable unit 22b in which the mirror surface 22a is disposed. The movable mirror 22 (movable unit 22b) is supported in the base 21 so that the movable mirror 22 can move in the Z-axis direction perpendicular to the first surface 21a (a first direction perpendicular to the first surface). The drive unit 23 moves the movable mirror 22 in the Z-axis direction.

A pair of light passage openings 24 and 25 are provided in the mirror device 20. The pair of light passage openings 24 and 25 are respectively disposed on both sides of the movable mirror 22 in the X-axis direction. The light passage opening (first light passage portion) 24 constitutes a first portion of an optical path between the beam splitter unit 3 and the fixed mirror 16. In this embodiment, the light passage opening 25 does not function as a light passage opening.

Figure 5:
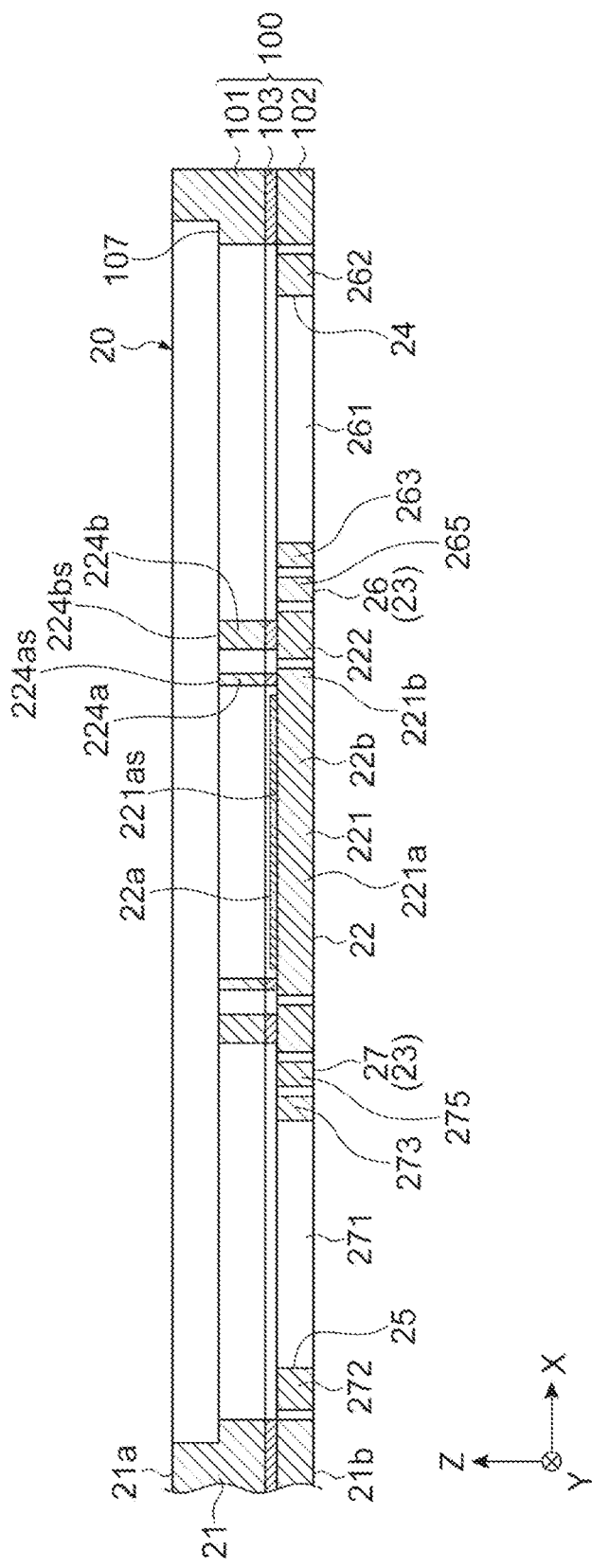
FIG. 5 is a schematic cross-sectional view of a mirror device taken along line V-V illustrated in FIG. 2.
Figure 6:
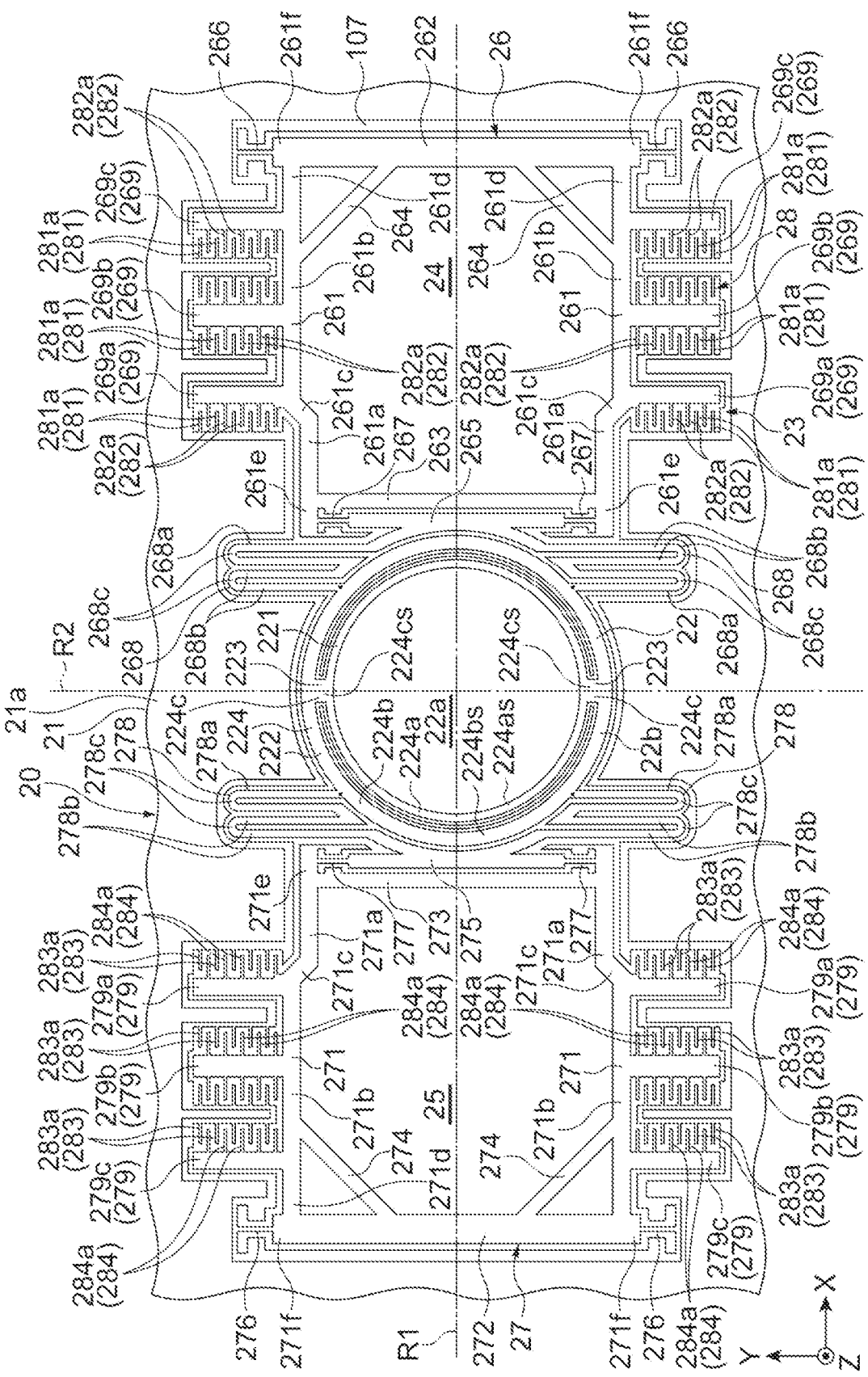
FIG. 6 is a partially enlarged view of the mirror device illustrated in FIG. 2.
Figure 7:
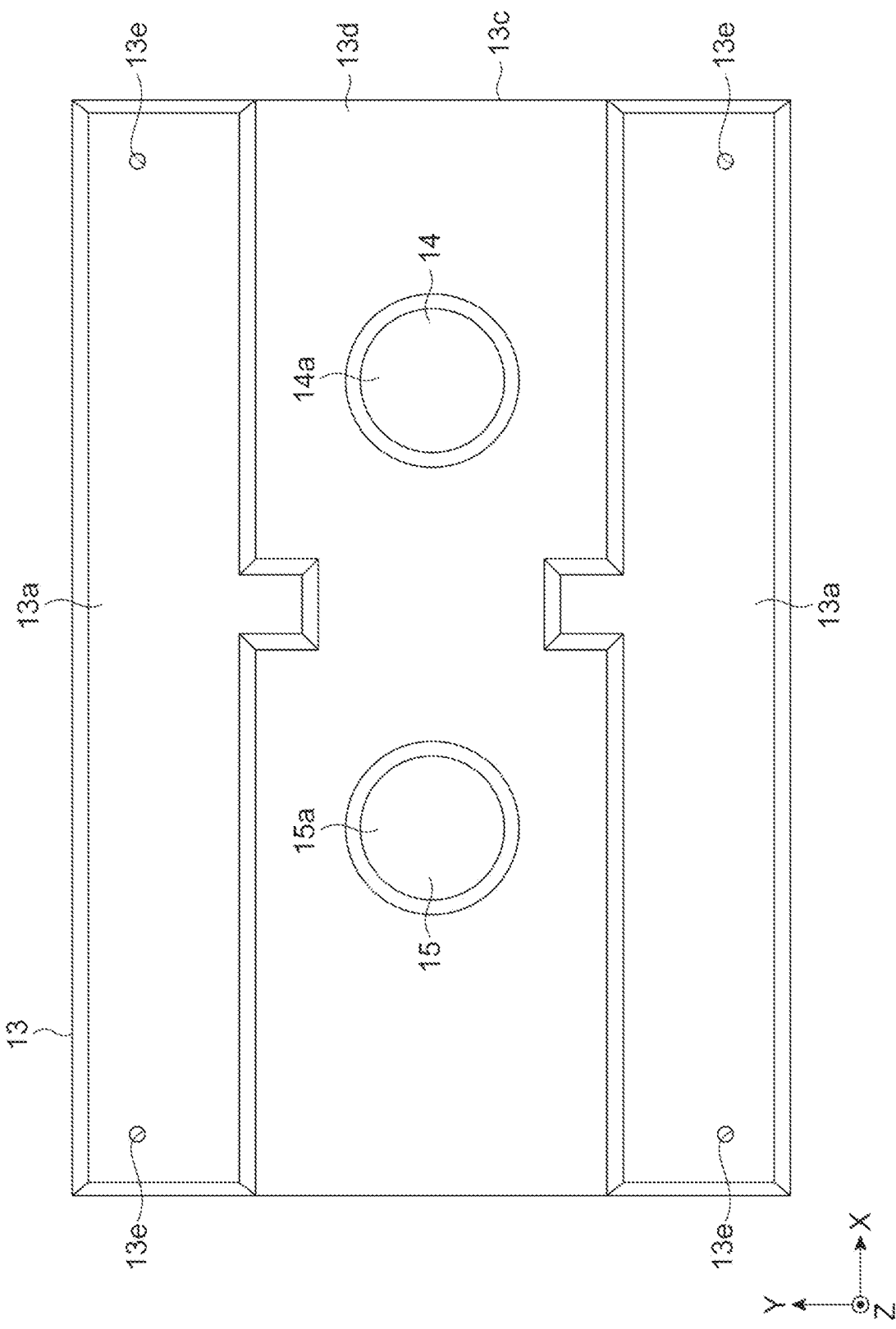
FIG. 7 is a plan view of an optical function member illustrated in FIG. 2.

Here, a configuration of the mirror device 20 will be described in detail with reference to FIG. 2, FIG. 5, and FIG. 6. FIG. 5 is a schematic cross-sectional view of the mirror device 20 illustrated in FIG. 3, and FIG. 5 schematically illustrates the mirror device 20, for example, in a state in which dimensions in the Z-axis direction are enlarged in comparison to actual dimensions.

The base 21, the movable unit 22b of the movable mirror 22, and the drive unit 23 are constituted by a silicon on insulator (SOI) substrate (semiconductor substrate) 100. That is, the mirror device 20 is constituted by the SOI substrate 100. For example, the mirror device 20 is formed in a rectangular plate shape. The SOI substrate 100 includes a support layer 101, a device layer 102, and an intermediate layer 103. The support layer 101 is a first silicon layer (a first semiconductor layer). The device layer 102 is a second silicon layer (a second semiconductor layer). The intermediate layer 103 is an insulating layer disposed between the support layer 101 and the device layer 102. The SOI substrate 100 includes the support layer 101, the intermediate layer 103, and the device layer 102 in this order from the one side in the Z-axis direction.

The base 21 is constituted by a part of the support layer 101, the device layer 102, and the intermediate layer 103. The first surface 21a of the base 21 is a surface of the support layer 101 which is opposite to the intermediate layer 103. The second surface 21b of the base 21 is a surface of the device layer 102 which is opposite to the intermediate layer 103. The support layer 101 that constitutes the base 21 is thicker than the device layer 102 that constitutes the base 21. For example, the thickness of the support layer 101 that constitutes the base 21 is approximately four times the thickness of the device layer 102 that constitutes the base 21. As will be described later, in the mirror unit 2, the second surface 21b of the base 21 and a third surface 13a of the optical function member 13 are jointed to each other (refer to FIG. 3 and FIG. 4).

The movable mirror 22 is disposed in a state in which an intersection between an axial line R1 and an axial line R2 is set as the central position (gravity center position). The axial line R1 is a straight line that extends in the X-axis direction. The axial line R2 is a straight line that extends in a Y-axis direction (a second direction perpendicular to the first direction and the third direction). When viewed from the Z-axis direction, in the mirror device 20, a portion other than a portion that overlaps a sixth surface 21d of the base 21 to be described later has a shape linearly symmetric to each of the axial line R1 and the axial line R2.

The movable mirror 22 (movable unit 22b) includes an arrangement portion 221, a frame portion 222, a pair of connection portions 223, and a rib portion 224. The arrangement portion 221, the frame portion 222, and the pair of connection portions 223 are constituted by a part of the device layer 102. The arrangement portion 221 has a circular shape when viewed from the Z-axis direction. The arrangement portion 221 includes a central portion 221a and an edge portion 221b. For example, the mirror surface 22a is provided on a surface 221as of the central portion 221a on the one side in the Z-axis direction by forming a metal film (metal layer) thereon. The mirror surface 22a extends perpendicular to the Z-axis direction, and has a circular shape. The surface 221as of the central portion 221a is a surface on the intermediate layer 103 side in the device layer 102. The mirror surface 22a is located on the other side in the Z-axis direction in comparison to the first surface 21a of the base 21. In other words, the first surface 21a is located on the one side in the Z-axis direction in comparison to the mirror surface 22a. The edge portion 221b surrounds the central portion 221a when viewed from the Z-axis direction.

The frame portion 222 extends in an annular shape to surround the arrangement portion 221 with a predetermined gap from the arrangement portion 221 when viewed from the Z-axis direction. For example, the frame portion 222 has a circular ring shape when viewed from the Z-axis direction. Each of the pair of connection portions 223 connects the arrangement portion 221 and the frame portion 222 to each other. The pair of connection portions 223 are respectively disposed on both sides of the arrangement portion 221 in the Y-axis direction.

The rib portion 224 is constituted by the support layer 101 and the intermediate layer 103 disposed on the device layer 102. The rib portion 224 is disposed at the periphery of the mirror surface 22a. The rib portion 224 includes an inner rib portion 224a, an outer rib portion 224b, and a pair of connection rib portions 224c. The inner rib portion 224a is disposed on a surface of the edge portion 221b on the one side in the Z-axis direction. The inner rib portion 224a surrounds the mirror surface 22a when viewed from the Z-axis direction. For example, an outer edge of the inner rib portion 224a extends along an outer edge of the arrangement portion 221 with a predetermined gap from the outer edge of the arrangement portion 221 when viewed from the Z-axis direction. An inner edge of the inner rib portion 224a extends along an outer edge of the mirror surface 22a with a predetermined gap from the outer edge of the mirror surface 22a when viewed from the Z-axis direction. An end surface 224as of the inner rib portion 224a on the one side in the Z-axis direction is located on the one side in the Z-axis direction in comparison to the mirror surface 22a.

The outer rib portion 224b is disposed on a surface of the frame portion 222 on the one side in the Z-axis direction. The outer rib portion 224b surrounds the inner rib portion 224a and the mirror surface 22a when viewed from the Z-axis direction. For example, an outer edge of the outer rib portion 224b extends along an outer edge of the frame portion 222 with a predetermined gap from the outer edge of the frame portion 222 when viewed from the Z-axis direction. An inner edge of the outer rib portion 224b extends along an inner edge of the frame portion 222 with a predetermined gap from the inner edge of the frame portion 222 when viewed from the Z-axis direction. An end surface 224bs of the outer rib portion 224b on the one side in the Z-axis direction is located on the one side in the Z-axis direction in comparison to the mirror surface 22a.

The pair of connection rib portions 224c are respectively disposed on surfaces of the pair of connection portions 223 on the one side in the Z-axis direction. The connection rib portions 224c connect the inner rib portion 224a and the outer rib portion 224b to each other. End surfaces 224cs of the connection rib portions 224c on the one side in the Z-axis direction are located on the one side in the Z-axis direction in comparison to the mirror surface 22a.

The thickness of the inner rib portion 224a, the thickness of the outer rib portion 224b, and the thickness of the respective connection rib portions 224c in the Z-axis direction are the same as each other. That is, the thickness of the support layer 101 that constitutes the inner rib portion 224a, the outer rib portion 224b, and the respective connection rib portions 224c is the same in each case. The end surface 224as of the inner rib portion 224a, the end surface 224bs of the outer rib portion 224b, and the end surfaces 224cs of the respective connection rib portions 224c are located on the same plane perpendicular to the Z-axis direction. The support layer 101 that constitutes the inner rib portion 224a, the outer rib portion 224b, and the respective connection rib portions 224c is thinner than the support layer 101 that constitutes the base 21. Accordingly, the end surfaces 224as, 224bs, and 224cs are located on the other side in the Z-axis direction in comparison to the first surface 21a of the base 21. In other words, the first surface 21a is located on the one side in the Z-axis direction in comparison to the end surfaces 224as, 224bs, and 224cs.

When viewed from the Z-axis direction, a width of the outer rib portion 224b is wider than a width of the inner rib portion 224a. The width of the inner rib portion 224a when viewed from the Z-axis direction is a length of the inner rib portion 224a in a direction perpendicular to the extending direction of the inner rib portion 224a, and is a length of the inner rib portion 224a in a radial direction of the inner rib portion 224a in this embodiment. This is also true of a width of the outer rib portion 224b when viewed from the Z-axis direction. A width of each of the connection rib portions 224c is larger than the width of each of the inner rib portion 224a and the outer rib portion 224b. The width of each of the connection rib portion 224c is a length of each of the connection rib portion 224c along the extending direction of the inner rib portion 224a.

The drive unit 23 includes a first elastic support unit 26, a second elastic support unit 27, and an actuator unit 28. The first elastic support unit 26, the second elastic support unit 27, and the actuator unit 28 are constituted by a part of the device layer 102.

Each of the first elastic support unit 26 and the second elastic support unit 27 is connected between the base 21 and the movable mirror 22. The first elastic support unit 26 and the second elastic support unit 27 support the movable mirror 22 so that the movable mirror 22 (movable unit 22b) can move in the Z-axis direction.

The first elastic support unit 26 includes a pair of levers 261, a first link member 262, a second link member 263, a pair of beam members 264, an intermediate member 265, a pair of first torsion bars (first torsion support portions) 266, a pair of second torsion bars (second torsion support portions) 267, a pair of non-linearity mitigation springs 268, and a plurality of electrode support portions 269.

The pair of levers 261 are respectively disposed on both sides of the light passage opening 24 in the Y-axis direction, and face each other in the Y-axis direction. Each of the levers 261 has a plate shape that extends along a plane perpendicular to the Z-axis direction. The lever 261 includes a first portion 261a, a second portion 261b disposed on a side opposite to the movable mirror 22 with respect to the first portion 261a, and a third portion 261c connected to the first portion 261a and the second portion 261b. The first portion 261a and the second portion 261b extend in the X-axis direction. A length of the first portion 261a in the X-axis direction is shorter than a length of the second portion 261b in the X-axis direction. The third portions 261c of the pair of levers 261 obliquely extend to be spaced away from each other as going away from the movable mirror 22.

The first link member 262 bridges first ends 261d of the pair of levers 261 on a side opposite to the movable mirror 22. The first link member 262 has a plate shape that extends along a plane perpendicular to the Z-axis direction, and extends in the Y-axis direction. The second link member 263 bridges second ends 261e of the pair of levers 261 on the movable mirror 22 side. The second link member 263 has a plate shape that extends along a plane perpendicular to the Z-axis direction, and extends in the Y-axis direction. A width of the second link member 263 in the X-axis direction is narrower than a width of the first link member 262 in the X-axis direction. A length of the second link member 263 in the Y-axis direction is shorter than a length of the first link member 262 in the Y-axis direction.

The pair of beam members 264 respectively bridge the second portions 261b of the pair of levers 261 and the first link member 262. The respective beam members 264 have a plate shape that extends along a plane perpendicular to the Z-axis direction. The pair of beam members 264 obliquely extend to approach each other as going away from the movable mirror 22. The pair of levers 261, the first link member 262, the second link member 263, and the pair of beam members 264 define the light passage opening 24. The light passage opening 24 has a polygonal shape when viewed from the Z-axis direction. For example, the light passage opening 24 is a cavity (hole). Alternatively, a material having optical transparency with respect to the measurement light L0 and the laser light L10 may be disposed in the light passage opening 24.

The intermediate member 265 has a plate shape that extends along a plane perpendicular to the Z-axis direction, and extends in the Y-axis direction. The intermediate member 265 is disposed between the movable mirror 22 and the second link member 263 (in other words, between the movable mirror 22 and the light passage opening 24). The intermediate member 265 is connected to the movable mirror 22 through the non-linearity mitigation springs 268 as to be described later.

The pair of first torsion bars 266 respectively bridge the first end 261d of one lever 261 and the base 21, and the first end 261d of the other lever 261 and the base 21. That is, the pair of first torsion bars 266 are respectively connected between the pair of levers 261 and the base 21. The first torsion bars 266 extend in the Y-axis direction. The pair of first torsion bars 266 are disposed on the same central line parallel to the Y-axis direction. In this embodiment, the central line of the first torsion bars 266 and the central line of the first link member 262 are located on the same straight line. A protrusion 261f that protrudes outward in the Y-axis direction is provided in each of the first ends 261d of the levers 261, and each of the first torsion bars 266 is connected to the protrusion 261f.

The pair of second torsion bars 267 respectively bridge the second end 261e of one lever 261 and one end of the intermediate member 265, and the second end 261e of the other lever 261 and the other end of the intermediate member 265. That is, the pair of second torsion bars 267 are respectively connected between the pair of levers 261 and the movable mirror 22. The respective second torsion bars 267 extend in the Y-axis direction. The pair of second torsion bars 267 are disposed on the same central line parallel to the Y-axis direction.

The pair of non-linearity mitigation springs 268 are connected between the movable mirror 22 and the intermediate member 265. That is, the pair of non-linearity mitigation springs 268 are connected between the movable mirror 22 and the second torsion bar 267. Each of the non-linearity mitigation springs 268 includes a meandering portion 268a that extends in a meandering manner when viewed from the Z-axis direction. The meandering portion 268a includes a plurality of straight portions 268b which extend in the Y-axis direction and are aligned in the X-axis direction, and a plurality of folded portions 268c which alternately connect both ends of the plurality of straight portions 268b. One end of the meandering portion 268a is connected to the intermediate member 265, and the other end of the meandering portion 268a is connected to the frame portion 222. In the meandering portion 268a, a portion on the frame portion 222 side has a shape along the outer edge of the frame portion 222.

The non-linearity mitigation spring 268 is constituted as follows. In a state in which the movable mirror 22 has moved in the Z-axis direction, the amount of deformation of the non-linearity mitigation spring 268 around the Y-axis direction becomes smaller than the amount of deformation of each of the first torsion bar 266 and the second torsion bar 267 around the Y-axis direction, and the amount of deformation of the non-linearity mitigation spring 268 in the X-axis direction becomes larger than the amount of deformation of each of the first torsion bar 266 and the second torsion bar 267 in the X-axis direction. Accordingly, it is possible to suppress occurrence of non-linearity in twist deformation of the first torsion bar 266 and the second torsion bar 267, and it is possible to suppress deterioration of control characteristics of the movable mirror 22 due to the non-linearity. The amount of deformation of the first torsion bar 266, the second torsion bar 267, and the non-linearity mitigation spring 268 around the Y-axis direction represents, for example, an absolute value of a twist amount (twist angle). The amount of deformation of the first torsion bar 266, the second torsion bar 267, and the non-linearity mitigation spring 268 in the X-axis direction represents, for example, an absolute value of a deflection amount. The amount of deformation of a member around the Y-axis direction represents the amount of deformation of the member in a peripheral direction of a circle of which the center is set to an axial line that passes through the center of the member and is parallel to the Y-axis. This is also true of first torsion bars 276, second torsion bars 277, and a non-linearity mitigation spring 278 to be described later.

The plurality of electrode support portions 269 include a pair of first electrode support portions 269a, a pair of second electrode support portions 269b, and a pair of third electrode support portions 269c. Each of the electrode support portions 269a, 269b, and 269c has a plate shape that extends along a plane perpendicular to the Z-axis direction, and extends in the Y-axis direction. Each of the electrode support portions 269a, 269b, and 269c extends from the second portion 261b of the lever 261 toward a side opposite to the light passage opening 24. The pair of first electrode support portions 269a are disposed on the same central line parallel to the Y-axis direction. The pair of second electrode support portions 269b are disposed on the same central line parallel to the Y-axis direction. The pair of third electrode support portions 269c are disposed on the same central line parallel to the Y-axis direction. In the X-axis direction, the first electrode support portions 269a, the second electrode support portions 269b, and the third electrode support portions 269c are aligned in this order from the movable mirror 22 side.

The second elastic support unit 27 includes a pair of levers 271, a first link member 272, a second link member 273, a pair of beam members 274, an intermediate member 275, a pair of first torsion bars (first torsion support portions) 276, a pair of second torsion bars (second torsion support portions) 277, a pair of non-linearity mitigation springs 278, and a plurality of electrode support portions 279.

The pair of levers 271 are respectively disposed on both sides of the light passage opening 25 in the Y-axis direction, and face each other in the Y-axis direction. Each of the levers 271 has a plate shape that extends along a plane perpendicular to the Z-axis direction. The lever 271 includes a first portion 271a, a second portion 271b disposed on a side opposite to the movable mirror 22 with respect to the first portion 271a, and a third portion 271c connected to the first portion 271a and the second portion 271b. The first portion 271a and the second portion 271b extend in the X-axis direction. A length of the first portion 271a in the X-axis direction is shorter than a length of the second portion 271b in the X-axis direction. The third portions 271c of the pair of levers 271 obliquely extend to be spaced away from each other as going away from the movable mirror 22.

The first link member 272 bridges first ends 271d of the pair of levers 271 on a side opposite to the movable mirror 22. The first link member 272 has a plate shape that extends along a plane perpendicular to the Z-axis direction, and extends in the Y-axis direction. The second link member 273 bridges second ends 271e of the pair of levers 271 on the movable mirror 22 side. The second link member 273 has a plate shape that extends along a plane perpendicular to the Z-axis direction, and extends in the Y-axis direction. A width of the second link member 273 in the X-axis direction is narrower than a width of the first link member 272 in the X-axis direction. A length of the second link member 273 in the Y-axis direction is shorter than a length of the first link member 272 in the Y-axis direction.

The pair of beam members 274 respectively bridge the second portions 271b of the pair of levers 271 and the first link member 272. The respective beam members 274 have a plate shape that extends along a plane perpendicular to the Z-axis direction. The pair of beam members 274 obliquely extend to approach each other as going away from the movable mirror 22. The pair of levers 271, the first link member 272, the second link member 273, and the pair of beam members 274 define the light passage opening 25. The light passage opening 25 has a polygonal shape when viewed from the Z-axis direction. For example, the light passage opening 25 is a cavity (hole). Alternatively, a material having optical transparency with respect to the measurement light L0 and the laser light L10 may be disposed in the light passage opening 25.

The intermediate member 275 has a plate shape that extends along a plane perpendicular to the Z-axis direction, and extends in the Y-axis direction. The intermediate member 275 is disposed between the movable mirror 22 and the second link member 273 (in other words, between the movable mirror 22 and the light passage opening 25). The intermediate member 275 is connected to the movable mirror 22 through the non-linearity mitigation springs 278 as to be described later.

The pair of first torsion bars 276 respectively bridge the first end 271d of one lever 271 and the base 21, and the first end 271d of the other lever 271 and the base 21. That is, the pair of first torsion bars 276 are respectively connected between the pair of levers 271 and the base 21. The first torsion bars 276 extend in the Y-axis direction. The pair of first torsion bars 276 are disposed on the same central line parallel to the Y-axis direction. In this embodiment, the central line of the first torsion bars 276 and the central line of the first link member 272 are located on the same straight line. A protrusion 271f that protrudes outward in the Y-axis direction is provided in each of the first ends 271d of the levers 271, and each of the first torsion bars 276 is connected to the protrusion 271f.

The pair of second torsion bars 277 respectively bridge the second end 271e of one lever 271 and one end of the intermediate member 275, and the second end 271e of the other lever 271 and the other end of the intermediate member 275. That is, the pair of second torsion bars 277 are respectively connected between the pair of levers 271 and the movable mirror 22. The respective second torsion bars 277 extend in the Y-axis direction. The pair of second torsion bars 277 are disposed on the same central line parallel to the Y-axis direction.

The pair of non-linearity mitigation springs 278 are connected between the movable mirror 22 and the intermediate member 275. That is, the pair of non-linearity mitigation springs 278 are connected between the movable mirror 22 and the second torsion bar 277. Each of the non-linearity mitigation springs 278 includes a meandering portion 278a that extends in a meandering manner when viewed from the Z-axis direction. The meandering portion 278a includes a plurality of straight portions 278b which extend in the Y-axis direction and are aligned in the X-axis direction, and a plurality of folded portions 278c which alternately connect both ends of the plurality of straight portions 278b. One end of the meandering portion 278a is connected to the intermediate member 275, and the other end of the meandering portion 278a is connected to the frame portion 222. In the meandering portion 278a, a portion on the frame portion 222 side has a shape along the outer edge of the frame portion 222.

The non-linearity mitigation spring 278 is constituted as follows. In a state in which the movable mirror 22 has moved in the Z-axis direction, the amount of deformation of the non-linearity mitigation spring 278 around the Y-axis direction becomes smaller than the amount of deformation of each of the first torsion bar 276 and the second torsion bar 277 around the Y-axis direction, and the amount of deformation of the non-linearity mitigation spring 278 in the X-axis direction becomes larger than the amount of deformation of each of the first torsion bar 276 and the second torsion bar 277 in the X-axis direction. Accordingly, it is possible to suppress occurrence of non-linearity in twist deformation of the first torsion bar 276 and the second torsion bar 277, and it is possible to suppress deterioration of control characteristics of the movable mirror 22 due to the non-linearity.

The plurality of electrode support portions 279 includes a pair of first electrode support portions 279a, a pair of second electrode support portions 279b, and a pair of third electrode support portions 279c. Each of the electrode support portions 279a, 279b, and 279c has a plate shape that extends along a plane perpendicular to the Z-axis direction, and extends in the Y-axis direction. Each of the electrode support portions 279a, 279b, and 279c extends from the second portion 271b of the lever 271 toward a side opposite to the light passage opening 25. The pair of first electrode support portions 279a are disposed on the same central line parallel to the Y-axis direction. The pair of second electrode support portions 279b are disposed on the same central line parallel to the Y-axis direction. The pair of third electrode support portions 279c are disposed on the same central line parallel to the Y-axis direction. In the X-axis direction, the first electrode support portions 279a, the second electrode support portions 279b, and the third electrode support portions 279c are aligned in this order from the movable mirror 22 side.

The actuator unit 28 moves the movable mirror 22 in the Z-axis direction. The actuator unit 28 includes a fixed comb electrode 281, a movable comb electrode 282, a fixed comb electrode 283, and a movable comb electrode 284. Positions of the fixed comb electrodes 281 and 283 are fixed. The movable comb electrodes 282 and 284 move in accordance with movement of the movable mirror 22.

The fixed comb electrode 281 is provided on a part of a surface, which faces the electrode support portions 269, of the device layer 102 of the base 21. The fixed comb electrode 281 includes a plurality of fixed comb fingers 281a which extend along a plane perpendicular to the Y-axis direction. The fixed comb fingers 281a are aligned in the Y-axis direction with a predetermined gap therebetween.

The movable comb electrode 282 is provided on a surface of each of the first electrode support portions 269a on the movable mirror 22 side, on surfaces of each of the second electrode support portions 269b on both sides in the X-axis direction, and on a surface of each of the third electrode support portion 269c on the movable mirror 22 side. The movable comb electrode 282 includes a plurality of movable comb fingers 282a which extend along a plane perpendicular to the Y-axis direction. The movable comb fingers 282a are aligned in the Y-axis direction with a predetermined gap therebetween.

In the fixed comb electrode 281 and the movable comb electrode 282, the plurality of fixed comb fingers 281a and the plurality of movable comb fingers 282a are alternately arranged. That is, each of the fixed comb fingers 281a of the fixed comb electrode 281 is located between the movable comb fingers 282a of the movable comb electrode 282. The fixed comb fingers 281a and the movable comb fingers 282a, which are adjacent to each other, face each other in the Y-axis direction. A distance between the fixed comb finger 281a and the movable comb finger 282a, which are adjacent to each other, is approximately several μm.

The fixed comb electrode 283 is provided on a part of a surface, which faces the electrode support portions 279, of the device layer 102 of the base 21. The fixed comb electrode 283 includes a plurality of fixed comb fingers 283a which extend along a plane perpendicular to the Y-axis direction. The fixed comb fingers 283a are aligned in the Y-axis direction with a predetermined gap therebetween.

The movable comb electrode 284 is provided on a surface of each of the first electrode support portion 279a on the movable mirror 22 side, on surfaces of each of the second electrode support portions 279b on both sides in the X-axis direction, and on a surface of each of the third electrode support portion 279c on the movable mirror 22 side. The movable comb electrode 284 includes a plurality of movable comb fingers 284a which extend along a plane perpendicular to the Y-axis direction. The movable comb fingers 284a are aligned in the Y-axis direction with a predetermined gap therebetween.

In the fixed comb electrode 283 and the movable comb electrode 284, the plurality of fixed comb fingers 283a and the plurality of movable comb fingers 284a are alternately arranged. That is, each of the fixed comb fingers 283a of the fixed comb electrode 283 is located between the movable comb fingers 284a of the movable comb electrode 284. The fixed comb fingers 283a and the movable comb fingers 284a, which are adjacent to each other, face each other in the Y-axis direction. For example, a distance between the fixed comb finger 283a and the movable comb finger 284a, which are adjacent to each other, is approximately several μm.

A plurality of electrode pads 211 are provided in the base 21. The electrode pads 211 are disposed on a surface of the device layer 102 in an opening 213 formed in the first surface 21a of the base 21 to reach the device layer 102. Some of the plurality of electrode pads 211 are electrically connected to the fixed comb electrode 281 or the fixed comb electrode 283 via the device layer 102. Several other electrode pads 211 among the plurality of electrode pads 211 are electrically connected to the movable comb electrode 282 or the movable comb electrode 284 via the first elastic support unit 26 or the second elastic support unit 27. In addition, a pair of electrode pads 212 which can be used as ground electrodes are provided in the base 21. The pair of electrode pads 212 are disposed on the first surface 21a to be located on both sides of the movable mirror 22 in the Y-axis direction.

Figure 11:
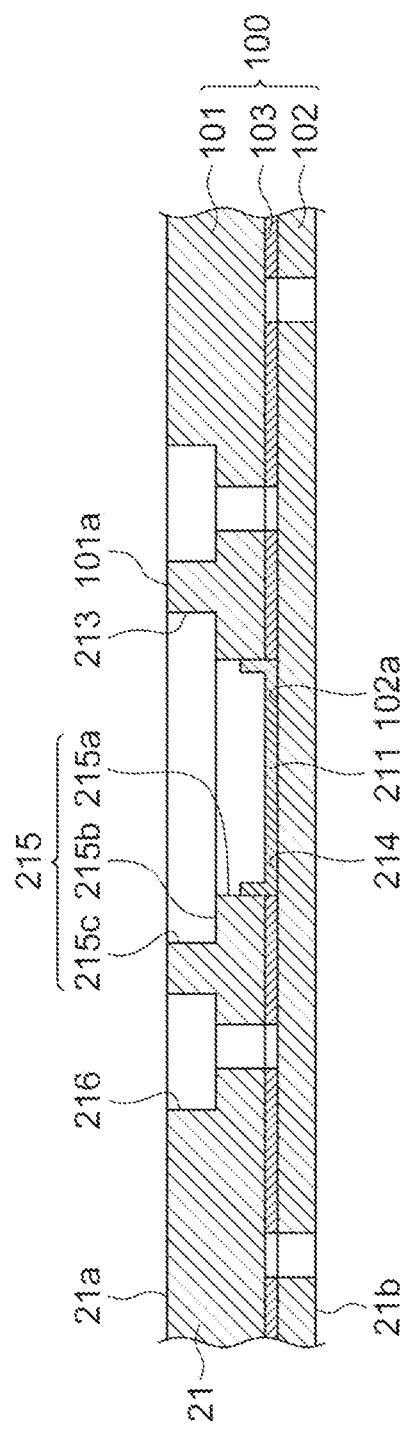
FIG. 11 is a schematic cross-sectional view of the mirror device taken along line XI-XI illustrated in FIG. 2.

A configuration of the periphery of the electrode pads 211 will be described with reference to FIG. 11. Hereinafter, description will be made with reference to one electrode pad 211, but other electrode pads 211 also have the same configuration. As illustrated in FIG. 11, each of the electrode pads 211 is disposed on a surface 102a of the device layer 102 on one side in the Z-axis direction in an opening 213 formed in a surface 101a of the support layer 101 on one side in the Z-axis direction to reach the device layer 102.

The opening 213 includes a bottom surface 214 constituted by the surface 102a, and a lateral surface 215 constituted by the support layer 101 and the intermediate layer 103. For example, the bottom surface 214 has a rectangular shape. The lateral surface 215 includes a first surface 215a that extends continuously from the bottom surface 214 and approximately vertically to the bottom surface 214, a stepped surface 215b that extends continuously from the first surface 215a and in approximately parallel to the bottom surface 214, and a second surface 215c that extends continuously from the stepped surface 215b and approximately vertically to the bottom surface 214. The stepped surface 215b extends in an annular shape along an edge of the opening 213 when viewed from the Z-axis direction.

The electrode pad 211 is disposed along an entire surface of the bottom surface 214. In addition, the electrode pad 211 extends along the bottom surface 214 and the lateral surface 215. More specifically, the electrode pad 211 is formed so that the electrode pad 211 reaches the first surface 215a of the lateral surface 215 and does not reach the stepped surface 215b of the lateral surface 215. For example, the electrode pad 211 is constituted by a metal film (metal layer). For example, the metal film is formed by sputtering using a hard mask. The metal film that constitutes the electrode pad 211 is thicker than a metal film that constitutes the mirror surface 22a.

The base 21 includes a groove 216 formed in the surface 101a of the support layer 101 to reach the device layer 102. The groove 216 extends in an annular shape to surround the opening 213 when viewed from the Z-axis direction. For example, the groove 216 has a rectangular shape when viewed from the Z-axis direction. Because the groove 216 is formed, it is possible to reliably electrically insulate the electrode pads 211 from each other. That is, as in this embodiment, in a case where the metal film that constitutes the electrode pad 211 is formed to reach the lateral surface 215, and the electrode pad 211 is in contact with the support layer 101, there is a concern that the electrode pads 211 may be electrically connected to each other through the support layer 101. In contrast, in the mirror device 20, because the groove 216 is provided, even in the above-described case, it is possible to reliably electrically insulate the electrode pads 211 from each other.

In the mirror device 20 configured as described above, an electric signal for moving the movable mirror 22 in the Z-axis direction, is input to the drive unit 23 through a lead pin 113 to be described later and a wire (not illustrated). Accordingly, for example, an electrostatic force is generated between the fixed comb electrode 281 and the movable comb electrode 282 which face each other, and the fixed comb electrode 283 and the movable comb electrode 284 which face each other so that the movable mirror 22 moves to one side in the Z-axis direction. At this time, the first torsion bars 266 and 276 and the second torsion bars 267 and 277 in the first elastic support unit 26 and the second elastic support unit 27 are twisted, and an elastic force is generated in the first elastic support unit 26 and the second elastic support unit 27. In the mirror device 20, when a periodic electric signal is applied to the drive unit 23, it is possible to reciprocate the movable mirror 22 in the Z-axis direction at a resonance frequency level. In this manner, the drive unit 23 functions as an electrostatic actuator.

[Another Configuration of Mirror Unit]

As illustrated in FIG. 2, FIG. 3, FIG. 4, and FIG. 7, the optical function member 13 includes the third surface 13a (a surface on the one side in the Z-axis direction) that faces the second surface 21b of the base 21, and a fourth surface 13b opposite to the third surface 13a. The optical function member 13 is disposed on the other side in the Z-axis direction with respect to the mirror device 20. When viewed from the Z-axis direction, an outer edge 13c of the optical function member 13 is located outside of an outer edge 21c of the base 21. That is, when viewed from the Z-axis direction, the outer edge 13c of the optical function member 13 surrounds the outer edge 21c of the base 21. The optical function member 13 is integrally formed by a material having transparency with respect to the measurement light L0 and the laser light L10. For example, the optical function member 13 is formed in a rectangular plate shape by glass, and has a size of approximately 15 mm×20 mm×4 mm (thickness). For example, the material of the optical function member 13 is selected in accordance with a sensitivity wavelength of the optical module 1. For example, the material is set to glass in a case where the sensitivity wavelength of the optical module 1 is a near infrared region, and the material is set to silicon in a case where the sensitivity wavelength of the optical module 1 is an intermediate infrared region.

A pair of light transmitting portions 14 and 15 are provided in the optical function member 13. The light transmitting portion 14 is a portion, which faces the light passage opening 24 of the mirror device 20 in the Z-axis direction, in the optical function member 13. The light transmitting portion 15 is a portion, which faces the light passage opening 25 of the mirror device 20 in the Z-axis direction, in the optical function member 13. A surface 14a of the light transmitting portion 14 on the mirror device 20 side, and a surface 15a of the light transmitting portion 15 on the mirror device 20 side are located on the same plane as the third surface 13a. The light transmitting portion (second light passage portion) 14 constitutes a second portion (partial portion) of an optical path between the beam splitter unit 3 and the fixed mirror 16. The light transmitting portion 14 is a portion that corrects an optical path difference that occurs between an optical path between the beam splitter unit 3 and the movable mirror 22, and an optical path between the beam splitter unit 3 and the fixed mirror 16. In this embodiment, the light transmitting portion 15 does not function as a light transmitting portion.

The optical function member 13 includes a fifth surface 13d that faces the movable mirror 22 and the drive unit 23 of the mirror device 20. The fifth surface 13d is located on the fourth surface 13b side in comparison to the third surface 13a. The fifth surface 13d extends to the outer edge 13c of the optical function member 13 when viewed from the Z-axis direction. In this embodiment, the fifth surface 13d extends to a pair of opposite sides which extend in the Y-axis direction in the outer edge 13c of the optical function member 13 while surrounding ends of the respective light transmitting portions 14 and 15 on the mirror device 20 side.

The third surface 13a of the optical function member 13 is joined to the second surface 21b of the base 21 by direct bonding (for example, plasma activation bonding, surface-activated room-temperature bonding (SAB), atomic diffusion bonding (ADB), anodic bonding, fusion bonding, hydrophilic bonding, and the like). In this embodiment, the third surface 13a extends to face a plurality of the electrode pads 211 and 212 provided in the base 21 on both sides of the fifth surface 13d in the Y-axis direction. Here, the fifth surface 13d is located on the fourth surface 13b side in comparison to the third surface 13a, and thus the fifth surface 13d is separated from the mirror device 20 in a region where the fifth surface 13d faces the movable mirror 22 and the drive unit 23. In addition, the surface 14a of the light transmitting portion 14 and the surface 15a of the light transmitting portion 15 respectively face the light passage openings 24 and 25 of the mirror device 20. Accordingly, in the mirror unit 2, when the movable mirror 22 reciprocates in the Z-axis direction, the movable mirror 22 and the drive unit 23 are prevented from coming into contact with the optical function member 13.

A sixth surface 21d, which is separated from the optical function member 13 in a state in which the third surface 13a of the optical function member 13 and the second surface 21b of the base 21 are joined to each other, is provided in the base 21 of the mirror device 20. The sixth surface 21d is separated from the optical function member 13 in a region that includes at least a part of an outer edge of the base 21 when viewed from the Z-axis direction. In this embodiment, the sixth surface 21d is formed by removing the device layer 102 and the intermediate layer 103 along one side, which extends in the Y-axis direction, in the outer edge of the base 21 by etching. In addition, a plurality of reference holes 13e are formed in the third surface 13a of the optical function member 13. In this embodiment, the plurality of reference holes 13e are formed in the third surface 13a to correspond to a plurality of corners of the base 21. When the third surface 13a of the optical function member 13 and the second surface 21b of the base 21 are joined to each other, handling of the mirror device 20 is performed in a state in which a portion of the base 21 which corresponds to the sixth surface 21d is gripped, and thus a position of the mirror device 20 in the X-axis direction and the Y-axis direction, and an angle of the mirror device 20 in a plane perpendicular to the Z-axis direction are adjusted based on of the plurality of reference holes 13e formed in the third surface 13a.

As illustrated in FIG. 3 and FIG. 4, the fixed mirror 16 is disposed on the other side (side opposite to the mirror device 20) in the Z-axis direction with respect to the optical function member 13, and a position of the mirror device 20 with respect to the base 21 is fixed. For example, the fixed mirror 16 is formed on the fourth surface 13b of the optical function member 13 by vapor deposition. The fixed mirror 16 includes a mirror surface 16a perpendicular to the Z-axis direction. In this embodiment, the mirror surface 22a of the movable mirror 22, and the mirror surface 16a of the fixed mirror 16 face one side (beam splitter unit 3 side) in the Z-axis direction. The fixed mirror 16 is formed continuously with the fourth surface 13b of the optical function member 13 to reflect light that is transmitted through the respective light transmitting portions 14 and 15 of the optical function member 13. However, a fixed mirror that reflects light transmitted through the light transmitting portion 14, and a fixed mirror that reflects light transmitted through the light transmitting portion 15 may be provided, respectively.

The stress mitigation substrate 17 is attached to the fourth surface 13b of the optical function member 13 via the fixed mirror 16. For example, the stress mitigation substrate 17 is attached to the fixed mirror 16, for example, by an adhesive. When viewed from the Z-axis direction, an outer edge of the stress mitigation substrate 17 is located outside of the outer edge 13c of the optical function member 13. That is, when viewed from the Z-axis direction, the outer edge of the stress mitigation substrate 17 surrounds the outer edge 13c of the optical function member 13. A thermal expansion coefficient of the stress mitigation substrate 17 is closer to a thermal expansion coefficient of the base 21 of the mirror device 20 (more specifically, a thermal expansion coefficient of the support layer 101) in comparison to a thermal expansion coefficient of the optical function member 13. In addition, the thickness of the stress mitigation substrate 17 is closer to the thickness of the base 21 of the mirror device 20 in comparison to the thickness of the optical function member 13. For example, the stress mitigation substrate 17 is formed in a rectangular plate shape by silicon, and has a size of approximately 16 mm×21 mm×0.65 mm (thickness).

Figure 8:
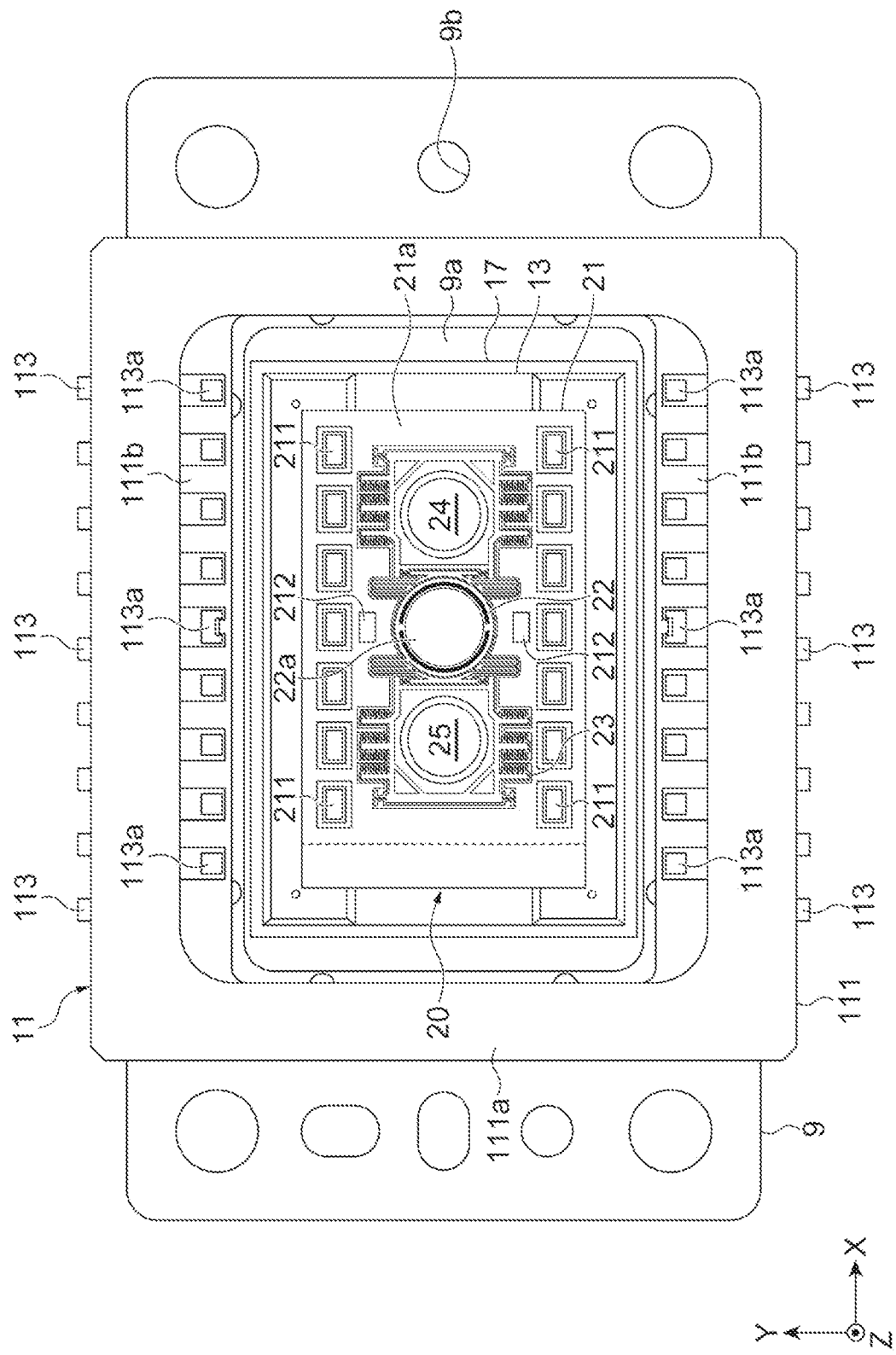
FIG. 8 is a cross-sectional view of the optical module taken along line VIII-VIII illustrated in FIG. 1.

As illustrated in FIG. 1, the mirror unit 2 configured as described above is attached to the support 9 by fixing a surface of the stress mitigation substrate 17 on a side opposite to the optical function member 13 to a surface 9a of the support 9 (surface on the one side in the Z-axis direction), for example, by an adhesive. When the mirror unit 2 is attached to the support 9, as illustrated in FIG. 8, a position of the mirror device 20 in the X-axis direction and the Y-axis direction and an angle of the mirror device 20 in a plane perpendicular to the Z-axis direction are adjusted based on a reference hole 9b formed in the support 9. In FIG. 8, the second support structure 12 is not illustrated.

[Configuration of First Support Structure and Beam Splitter Unit]

As illustrated in FIG. 1 and FIG. 8, the first support structure 11 includes a frame body 111, a light transmitting member 112, and a plurality of lead pins 113. The frame body 111 is formed so as to surround the mirror unit 2 when viewed from the Z-axis direction, and is attached to the surface 9a of the support 9, for example, by an adhesive such as silver solder. For example, the frame body 111 is formed of ceramic, and has a rectangular frame shape. An end surface 111a of the frame body 111 on a side opposite to the support 9 is located on a side opposite to the support 9 in comparison to the first surface 21a of the base 21 of the mirror device 20.

The light transmitting member 112 is formed so as to close an opening of the frame body 111, and is attached to the end surface 111a of the frame body 111, for example, with an adhesive. The light transmitting member 112 is formed of a material having transparency with respect to the measurement light L0 and the laser light L10, and has a rectangular plate shape for example. Here, the end surface 111a of the frame body 111 is located on a side opposite to the support 9 in comparison to the first surface 21a of the base 21 of the mirror device 20, and thus the light transmitting member 112 is separated from the mirror device 20. Accordingly, in the optical module 1, when the movable mirror 22 reciprocates in the Z-axis direction, the movable mirror 22 and the drive unit 23 are prevented from coming into contact with the light transmitting member 112. In the optical module 1, the support 9, the frame body 111, and the light transmitting member 112 constitute a package that accommodates the mirror unit 2.

The respective lead pins 113 are provided in the frame body 111 in such a manner that one end 113a is located inside of the frame body 111, and the other end (not illustrated) is located outside of the frame body 111. The one ends 113a of the lead pins 113 are electrically connected to the electrode pads 211 and 212 corresponding to the lead pins 113 in the mirror device 20 by wires (not illustrated). In the optical module 1, an electric signal for moving the movable mirror 22 in the Z-axis direction is input to the drive unit 23 through the plurality of lead pins 113. In this embodiment, a stepped surface 111b that extends in the X-axis direction on both sides of the optical function member 13 in the Y-axis direction is formed in the frame body 111, and one end 113a of each of the lead pins 113 is disposed on the stepped surface 111b. The lead pin 113 extends in the Z-axis direction on both sides of the support 9 in the Y-axis direction, and the other end of the lead pin 113 is located on the other side in the Z-axis direction in comparison to the support 9.

Figure 10:
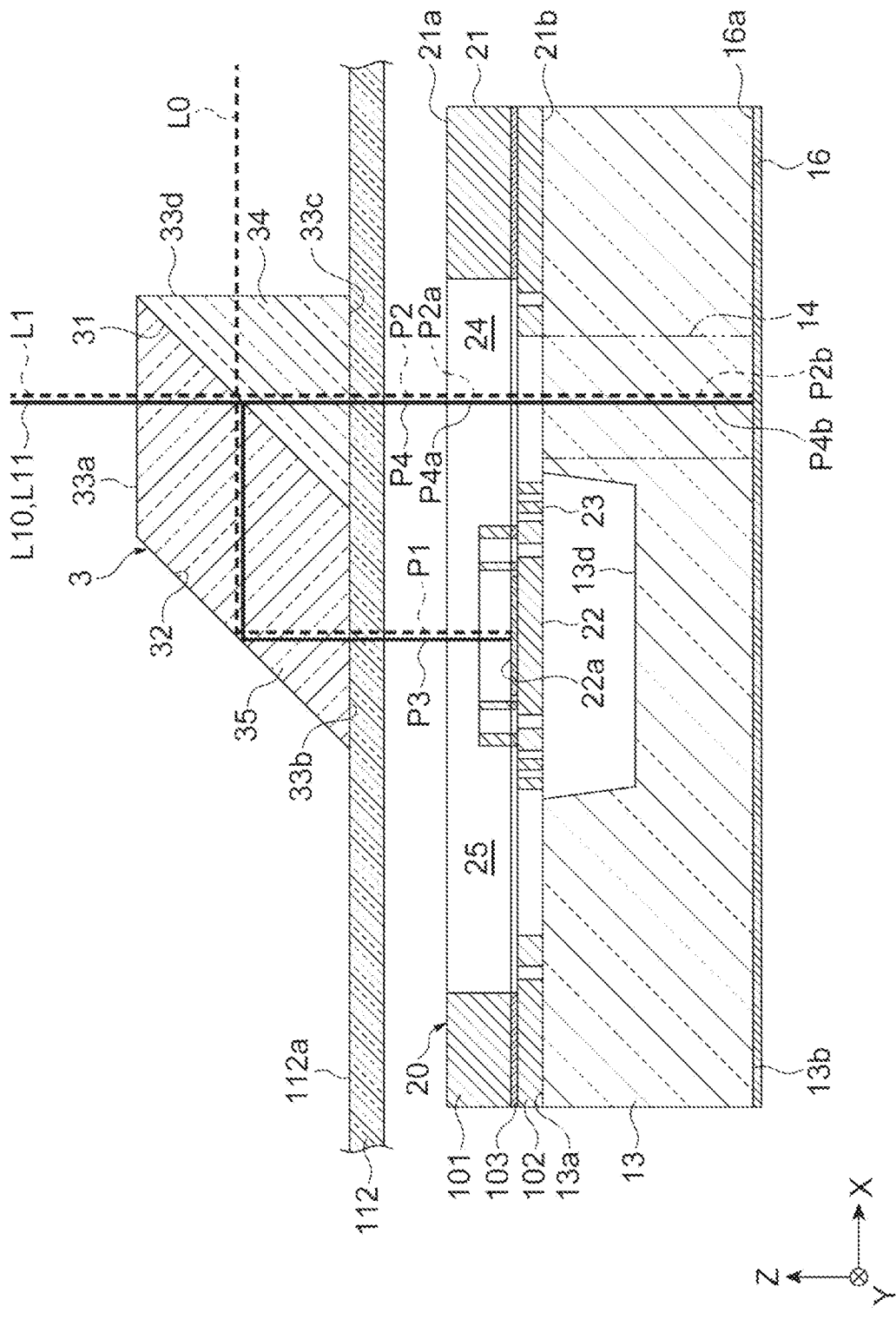
FIG. 10 is a schematic cross-sectional view of the mirror unit and a beam splitter unit illustrated in FIG. 1.

As illustrated in FIG. 10, the beam splitter unit 3 is attached to a surface 112a of the light transmitting member 112 on a side opposite to the mirror device 20, for example, by an optical adhesive that also functions as a refractive index matching agent. The beam splitter unit 3 includes a first mirror surface 31, a second mirror surface 32, and a plurality of optical surfaces 33a, 33b, 33c, and 33d. The beam splitter unit 3 is constituted by joining a plurality of optical blocks 34 and 35. The respective optical blocks 34 and 35 are formed of a material having a refractive index that is the same as or similar to that of the optical function member 13. FIG. 10 is a schematic cross-sectional view of the mirror unit 2 and the beam splitter unit 3 illustrated in FIG. 1, and in FIG. 10, the mirror device 20 is schematically illustrated, for example, in a state in which dimensions in the Z-axis direction are enlarged in comparison to actual dimensions.

The first mirror surface 31 is a mirror surface (for example, a half mirror surface) inclined with respect to the Z-axis direction, and is formed between the optical block 34 and the optical block 35. In this embodiment, the first mirror surface 31 is a surface that is parallel to the Y-axis direction, has an angle of 45° with respect to the Z-axis direction, and is inclined to be spaced away from the light incident unit 4 as it approaches the mirror device 20. The first mirror surface 31 has a function of reflecting a part of the measurement light L0 and allowing the remainder of the measurement light L0 to be transmitted therethrough, and a function of reflecting a part of the laser light L10 and allowing the remainder of the laser light L10 to be transmitted therethrough. For example, the first mirror surface 31 is formed of a dielectric multi-layer film. The first mirror surface 31 overlaps the light passage opening 24 of the mirror device 20, the light transmitting portion 14 of the optical function member 13, and the mirror surface 16a of the fixed mirror 16 when viewed from the Z-axis direction, and overlaps the light incident unit 4 when viewed form the X-axis direction (refer to FIG. 1). That is, the first mirror surface 31 faces the fixed mirror 16 in the Z-axis direction, and faces the light incident unit 4 in the X-axis direction.

The second mirror surface 32 is a mirror surface (for example, a total reflection mirror surface) that is parallel to the first mirror surface 31, and is formed in the optical block 35 to be located on a side opposite to the light incident unit 4 with respect to the first mirror surface 31. The second mirror surface 32 has a function of reflecting the measurement light L0 and a function of reflecting the laser light L10. For example, the second mirror surface 32 is formed of a metal film. The second mirror surface 32 overlaps the mirror surface 22a of the movable mirror 22 of the mirror device 20 when viewed from the Z-axis direction, and overlaps the first mirror surface 31 when viewed from the X-axis direction. That is, the second mirror surface 32 faces the movable mirror 22 in the Z-axis direction, and faces the first mirror surface 31 in the X-axis direction.

The optical surface 33a is a surface perpendicular to the Z-axis direction, and is formed in the optical block 35 to be located on a side opposite to the mirror device 20 with respect to the first mirror surface 31. The optical surface 33b is a surface perpendicular to the Z-axis direction, and is formed in the optical block 35 to be located on the mirror device 20 side with respect to the second mirror surface 32. The optical surface 33c is a surface perpendicular to the Z-axis direction, and is formed in the optical block 34 to be located on the mirror device 20 side with respect to the first mirror surface 31. The optical surface 33b and the optical surface 33c are located on the same plane. The optical surface 33d is a surface perpendicular to the X-axis direction, and is formed in the optical block 34 to be located on the light incident unit 4 side with respect to the first mirror surface 31. The respective optical surfaces 33a, 33b, 33c, and 33d have a function of allowing the measurement light L0 to be transmitted therethrough, and a function of allowing the laser light L10 to be transmitted therethrough.

Figure 9:
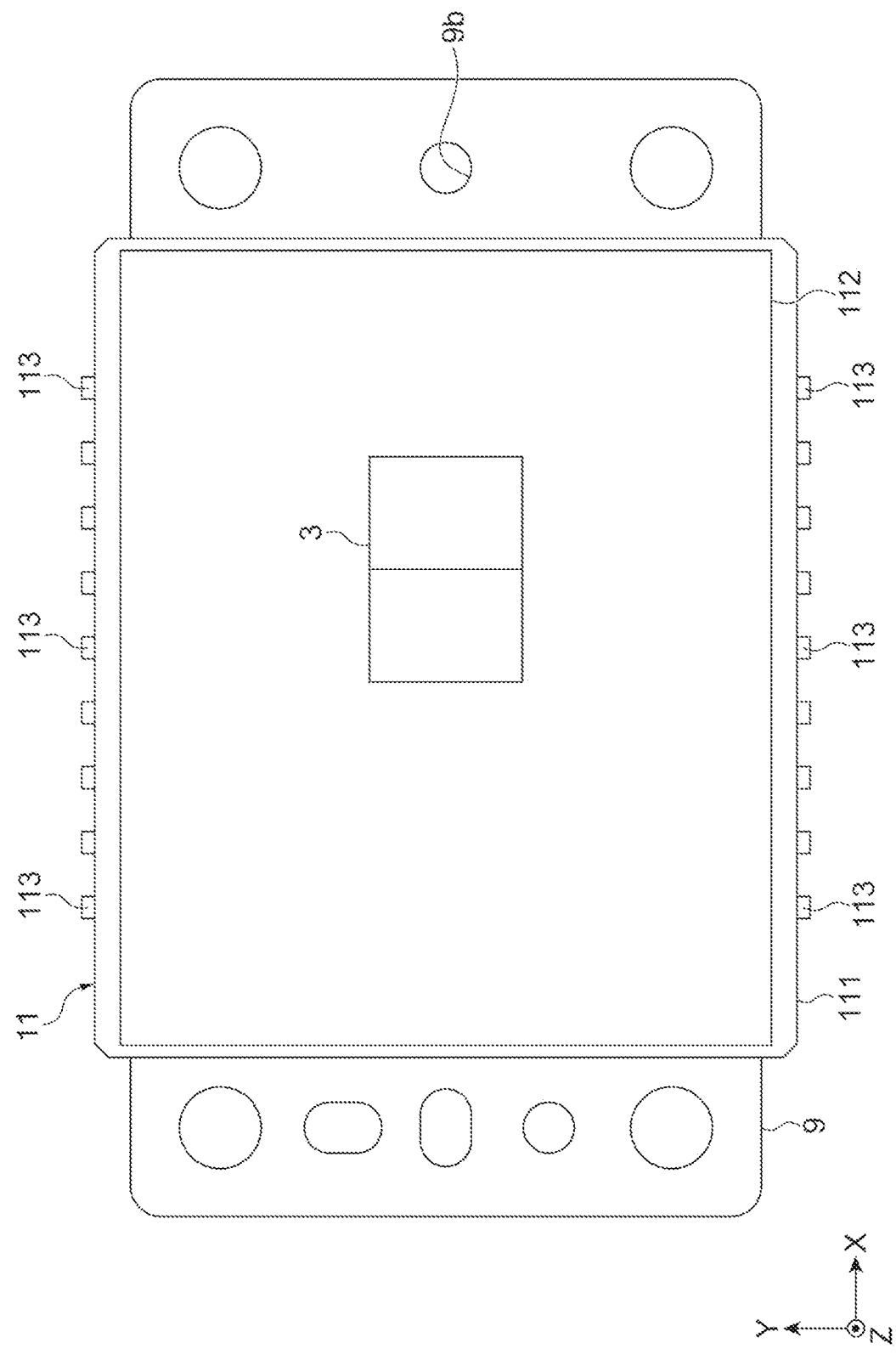
FIG. 9 is a cross-sectional view of the optical module taken along line IX-IX illustrated in FIG. 1.

The beam splitter unit 3 configured as described above is attached to the light transmitting member 112 by fixing the optical surface 33b and the optical surface 33c which are located on the same plane to the surface 112a of the light transmitting member 112, for example, by an optical adhesive. When the beam splitter unit 3 is attached to the light transmitting member 112, as illustrated in FIG. 9, a position of the beam splitter unit 3 in the X-axis direction and the Y-axis direction, and an angle of the beam splitter unit 3 in a plane perpendicular to the Z-axis direction are adjusted based on the reference hole 9b formed in the support 9. In FIG. 9, the second support structure 12 is not illustrated.

Here, the optical path of the measurement light L0 and the optical path of the laser light L10 in the mirror unit 2 and the beam splitter unit 3 will be described in detail with reference to FIG. 10.

As illustrated in FIG. 10, when the measurement light L0 is incident to the beam splitter unit 3 in the X-axis direction through the optical surface 33d, a part of the measurement light L0 is transmitted through the first mirror surface 31, is reflected by the second mirror surface 32, and reaches the mirror surface 22a of the movable mirror 22 through the optical surface 33b and the light transmitting member 112. The part of the measurement light L0 is reflected by the mirror surface 22a of the movable mirror 22, and proceeds on the same optical path P1 in an opposite direction, and is reflected by the first mirror surface 31. The remainder of the measurement light L0 is reflected by the first mirror surface 31, and reaches the mirror surface 16a of the fixed mirror 16 through the optical surface 33c, the light transmitting member 112, the light passage opening 24 of the mirror device 20, and the light transmitting portion 14 of the optical function member 13. The remainder of the measurement light L0 is reflected by the mirror surface 16a of the fixed mirror 16, proceeds on the same optical path P2 in an opposite direction, and is transmitted through the first mirror surface 31. The part of the measurement light L0 reflected by the first mirror surface 31, and the remainder of the measurement light L0 transmitted through the first mirror surface 31 become interference light L1, and the interference light L1 of the measurement light is emitted from the beam splitter unit 3 through the optical surface 33a along the Z-axis direction.

On the other hand, when the laser light L10 is incident to the beam splitter unit 3 in the Z-axis direction through the optical surface 33a, a part of the laser light L10 is reflected by the first mirror surface 31 and the second mirror surface 32, and reaches the mirror surface 22a of the movable mirror 22 through the optical surface 33b and the light transmitting member 112. The part of the laser light L10 is reflected by the mirror surface 22a of the movable mirror 22, proceeds on the same optical path P3 in an opposite direction, and is reflected by the first mirror surface 31. The remainder of the laser light L10 is transmitted through the first mirror surface 31, and reaches the mirror surface 16a of the fixed mirror 16 through the optical surface 33c, the light transmitting member 112, the light passage opening 24 of the mirror device 20, and the light transmitting portion 14 of the optical function member 13. The remainder of the laser light L10 is reflected by the mirror surface 16a of the fixed mirror 16, proceeds on the same optical path P4 in an opposite direction, and is transmitted through the first mirror surface 31. The part of the laser light L10 reflected by the first mirror surface 31, and the remainder of the laser light L10 transmitted through the first mirror surface 31 become interference light L11, and the interference light L11 of the laser light is emitted from the beam splitter unit 3 through the optical surface 33a along the Z-axis direction.

As described above, the light passage opening 24 of the mirror device 20 constitutes a first portion P2a of the optical path P2 of the measurement light L0 and a first portion P4a of the optical path P4 of the laser light L10 in an optical path between the beam splitter unit 3 and the fixed mirror 16. In addition, the light transmitting portion 14 of the optical function member 13 constitutes a second portion P2b of the optical path P2 of the measurement light L0 and a second portion P4b of the optical path P4 of the laser light L10 in the optical path between the beam splitter unit 3 and the fixed mirror 16.

The second portion P2b of the optical path P2 of the measurement light L0 is constituted by the light transmitting portion 14, thus an optical path difference between both the optical paths P1 and P2 is corrected so that a difference between an optical path length (optical path length in consideration of a refractive index of respective media through which the optical path passes) of the optical path P1 of the measurement light L0, and an optical path length of the optical path P2 of the measurement light L0 decreases. Similarly, the second portion P4b of the optical path P4 of the laser light L10 is constituted by the light transmitting portion 14, thus an optical path difference between both the optical paths P3 and P4 is corrected so that a difference between an optical path length of the optical path P3 of the laser light L10 and an optical path length of the optical path P4 of the laser light L10 decreases. In this embodiment, a refractive index of the light transmitting portion 14 is the same as a refractive index of the respective optical blocks which constitute the beam splitter unit 3, and a distance between the first mirror surface 31 and the second mirror surface 32 in the X-axis direction is the same as the thickness of the light transmitting portion 14 in the Z-axis direction (that is, a distance between the surface 14a of the light transmitting portion 14 and the fourth surface 13b of the optical function member 13 in the Z-axis direction).

[Configuration of Second Support Structure, Light Incident Unit, and the Like]

As illustrated in FIG. 1, the second support structure 12 includes a connection unit 120. The connection unit 120 includes a main body portion 121, a frame body 122, and a fixing plate 123. The main body portion 121 includes a pair of side wall portions 124 and 125, and a ceiling wall portion 126. The pair of side wall portions 124 and 125 face each other in the X-axis direction. An opening 124a is formed in the side wall portion 124 on one side in the X-axis direction. The ceiling wall portion 126 faces the support 9 in the Z-axis direction. An opening 126a is formed in the ceiling wall portion 126. For example, the main body portion 121 is integrally formed of a metal. A plurality of positioning pins 121a are provided in the main body portion 121. The main body portion 121 is positioned with respect to the support 9 by inserting the positioning pins 121a into the reference hole 9b and the hole 9c which are formed in the support 9, and is attached to the support 9 in this state, for example, by a bolt.

The frame body 122 is disposed on a surface of the side wall portion 124 on a side opposite to the beam splitter unit 3. An opening of the frame body 122 faces the beam splitter unit 3 through the opening 124a of the side wall portion 124. The light incident unit 4 is disposed in the frame body 122. The fixing plate 123 is a member that fixes the light incident unit 4 disposed in the frame body 122 to the main body portion 121 (details will be described later).

The second support structure 12 further includes a holding unit 130. The holding unit 130 includes a main body portion 131, a frame body 132 and a fixing plate 133. The main body portion 131 is attached to a surface of the ceiling wall portion 126 which is opposite to the support 9. The main body portion 131 is positioned with respect to the main body portion 121 of the connection unit 120 by a plurality of positioning pins 131a, and is attached to the ceiling wall portion 126 in this state, for example, by a bolt. A depression 134 is formed in a surface of the main body portion 131 which is opposite to the support 9. A first light passage hole 135, a second light passage hole 136, and a third light passage hole 137 are formed in a bottom surface of the depression 134. The first light passage hole 135 is formed at a position that faces the first mirror surface 31 of the beam splitter unit 3 in the Z-axis direction. The second light passage hole 136 is formed on the other side of the first light passage hole 135 in the X-axis direction (that is, on a side opposite to the light incident unit 4). The third light passage hole 137 is formed on the other side of the second light passage hole 136 in the X-axis direction.

The frame body 132 is disposed on the bottom surface of the depression 134. An opening of the frame body 132 faces the third light passage hole 137. The second light source 7 is disposed in the frame body 132. The first light detector 6 is disposed on the bottom surface of the depression 134 in a state of facing the first light passage hole 135. The second light detector 8 is disposed on the bottom surface of the depression 134 in a state of facing the second light passage hole 136. The fixing plate 133 is a member that fixes the first light detector 6 and the second light detector 8 which are disposed on the bottom surface of the depression 134, and the second light source 7 disposed in the frame body 132 to the main body portion 131 (details will be described later).

The light incident unit 4 includes a holder 41 and a collimator lens 42. The holder 41 holds the collimator lens 42, and is configured so that an optical fiber (not illustrated) that guides the measurement light L0 can be connected to the holder 41. The collimator lens 42 collimates the measurement light L0 emitted from the optical fiber. When the optical fiber is connected to the holder 41, an optical axis of the optical fiber matches an optical axis of the collimator lens 42.

A flange portion 41a is provided in the holder 41. The flange portion 41a is disposed between the frame body 122 and the fixing plate 123. In this state, fixing plate 123 is attached to the side wall portion 124, for example, by a bolt, and the light incident unit 4 disposed in the frame body 122 is fixed to the main body portion 121. In this manner, the light incident unit 4 is disposed on one side of the beam splitter unit 3 in the X-axis direction, and is supported by the second support structure 12. The light incident unit 4 allows measurement light L0 that is incident from the first light source through a measurement target or measurement light L0 that is generated from the measurement target (in this embodiment, the measurement light L0 guided by the optical fiber) to be incident to the beam splitter unit 3.

A filter 54 is attached to the frame body 122. The filter 54 has a function of cutting off the laser light L10. The filter 54 is disposed in the opening 124a of the side wall portion 124 in a state of being inclined with respect to an optical axis of the light incident unit 4. The filter 54 closes the opening of the frame body 122 when viewed form the X-axis direction. In this manner, the filter 54 is disposed between the light incident unit 4 and the beam splitter unit 3, and is supported by the second support structure 12 in a state of being inclined with respect to an optical axis of the light incident unit 4. In this embodiment, an optical surface of the filter 54 is a surface that is parallel to the Z-axis direction and has an angle of 10° to 20° with respect to the Y-axis direction. The optical axis of the light incident unit 4 is parallel to the X-axis direction.

Accordingly, even when light in the same wavelength range as the laser light L10 is included in the measurement light L0, the light is prevented from being incident to the beam splitter unit 3, and thus it is possible to obtain a position of the movable mirror 22 in the Z-axis direction with accuracy based on a detection result of the interference light L11 of the laser light. In addition, because the filter 54 is inclined with respect to the optical axis of the light incident unit 4, light in the same wavelength range as the laser light L10 is reflected to the outside of an interference optical system, and thus it is possible to reliably prevent the light from being stray light. In this embodiment, light in the same wavelength range as the laser light L10 emitted from the beam splitter unit 3 in the X-axis direction is reflected by the filter 54, and is emitted to the outside of the interference optical system from between the pair of side wall portions 124 and 125 in the main body portion 121 of the second support structure 12. Accordingly, it is possible to reliably prevent the light from being stray light.

The first light detector 6 includes a holder 61, a light detection element 62, and a condensing lens 63. The holder 61 holds the light detection element 62 and the condensing lens 63. The light detection element 62 detects the interference light L1 of the measurement light. For example, the light detection element 62 is an InGaAs photodiode. The condensing lens 63 condenses the interference light L1 of the measurement light incident to the light detection element 62 to the light detection element 62. In the holder 61, an optical axis of the light detection element 62 and an optical axis of the condensing lens 63 match each other.

A flange portion 61a is provided in the holder 61. The flange portion 61a is disposed between the bottom surface of the depression 134 of the main body portion 131, and the fixing plate 133. In this state, the fixing plate 133 is attached to the main body portion 131, for example, by a bolt, and thus the first light detector 6 disposed on the bottom surface of the depression 134 is fixed to the main body portion 131. In this manner, the first light detector 6 is disposed on one side of the beam splitter unit 3 in the Z-axis direction, and is supported by the second support structure 12. The first light detector 6 faces the first mirror surface 31 of the beam splitter unit 3 in the Z-axis direction. The first light detector 6 detects the interference light L1 of the measurement light emitted from the beam splitter unit 3.

The second light detector 8 includes a holder 81, a light detection element 82, and a condensing lens 83. The holder 81 holds the light detection element 82 and the condensing lens 83. The light detection element 82 detects the interference light L11 of the laser light. For example, the light detection element 82 is a Si photodiode. The condensing lens 83 condenses the interference light L11 of the laser light incident to the light detection element 82 to the light detection element 82. In the holder 81, an optical axis of the light detection element 82 and an optical axis of the condensing lens 83 match each other.

A flange portion 81a is provided in the holder 81. The flange portion 81a is disposed between the bottom surface of the depression 134 of the main body portion 131, and the fixing plate 133. In this state, the fixing plate 133 is attached to the main body portion 131, for example, by a bolt, and thus the second light detector 8 disposed on the bottom surface of the depression 134 is fixed to the main body portion 131. In this manner, the second light detector 8 is disposed on one side of the beam splitter unit 3 in the Z-axis direction, and is supported by the second support structure 12. The second light detector 8 detects the interference light L11 of the laser light emitted from the beam splitter unit 3.

The second light source 7 includes a holder 71, a light-emitting element 72, and a collimator lens 73. The holder 71 holds the light-emitting element 72 and the collimator lens 73. The light-emitting element 72 emits the laser light L10. For example, the light-emitting element 72 is a semiconductor laser such as a VCSEL. The collimator lens 73 collimates the laser light L10 emitted from the light-emitting element 72. In the holder 71, an optical axis of the light-emitting element 72 and an optical axis of the collimator lens 73 match each other.

A flange portion 71a is provided in the holder 71. The flange portion 71a is disposed between the frame body 132 and the fixing plate 133. In this state, the fixing plate 133 is attached to the main body portion 131, for example, by a bolt, and thus the second light source 7 disposed in the frame body 132 is fixed to the main body portion 131. In this manner, the second light source 7 is disposed on one side of the beam splitter unit 3 in the Z-axis direction, and is supported by the second support structure 12. The second light source 7 emits the laser light L10 that is to be incident to the beam splitter unit 3.

As described above, the holding unit 130 holds the first light detector 6, the second light detector 8, and the second light source 7 so that the first light detector (first optical device) 6, the second light detector (second optical device) 8, and the second light source (third optical device) 7 face the same side, and the first light detector 6, the second light detector 8, and the second light source 7 are aligned in this order. In this embodiment, on one side of the beam splitter unit 3 in the Z-axis direction, the holding unit 130 holds the first light detector 6, the second light detector 8, and the second light source 7 so that the first light detector 6, the second light detector 8, and the second light source 7 face the other side in the Z-axis direction (that is, the beam splitter unit 3 side). In addition, the holding unit 130 holds the first light detector 6, the second light detector 8, and the second light source 7 so that the first light detector 6, the second light detector 8, and the second light source 7 are aligned in this order from one side (that is, the light incident unit 4 side) in the X-axis direction.

A first mirror 51, a second mirror 52, and a third mirror 53 are attached to the main body portion 131 of the holding unit 130. The first mirror 51 is held by the holding unit 130 to be located on a side opposite to the first light detector 6 with respect to the first light passage hole 135. The second mirror 52 is held by the holding unit 130 to be located on a side opposite to the second light detector 8 with respect to the second light passage hole 136. The third mirror 53 is held by the holding unit 130 to be located on a side opposite to the second light source 7 with respect to the third light passage hole 137.

The first mirror 51 is a dichroic mirror that has a function of allowing the measurement light L0 to be transmitted therethrough and of reflecting the laser light L10, and is inclined with respect to the optical axis of the first light detector 6. The first mirror 51 is disposed between the beam splitter unit 3 and the first light detector 6. That is, the first mirror 51 is disposed to face the beam splitter unit 3 and the first light detector 6. In this embodiment, an optical surface of the first mirror 51 is a surface that is parallel to the Y-axis direction and has an angle of 45° with respect to the Z-axis direction. The optical axis of the first light detector 6 is parallel to the Z-axis direction.

The second mirror 52 is a mirror (for example, a half mirror) that has a function of reflecting a part of the laser light L10 and allowing the remainder of the laser light L10 to be transmitted therethrough, and is parallel to the first mirror 51. The second mirror 52 is disposed to overlap the first mirror 51 when viewed from the X-axis direction, and to overlap the second light detector 8 when viewed from the Z-axis direction. That is, the second mirror 52 is disposed to face the first mirror 51 and the second light detector 8. In this embodiment, an optical surface of the second mirror 52 is a surface that is parallel to the Y-axis direction, and has an angle of 45° with respect to the Z-axis direction.

The third mirror 53 is a mirror (for example, a total reflection mirror) that has a function of reflecting the laser light L10 and is parallel to the second mirror 52. The third mirror 53 is disposed to overlap the second mirror 52 when viewed from the X-axis direction, and overlap the second light source 7 when viewed from the Z-axis direction. That is, the third mirror 53 is disposed to face the second mirror 52 and the second light source 7. In this embodiment, an optical surface of the third mirror 53 is a surface that is parallel to the Y-axis direction, and has an angle of 45° with respect to the Z-axis direction.

An aperture 55 is attached to the main body portion 131 of the holding unit 130. The aperture 55 is held by the holding unit 130 to be located between the first mirror 51 and the first light detector 6. The aperture 55 is a member in which an opening having a circular shape is formed when viewed from the Z-axis direction, and is disposed in the first light passage hole 135.

The interference light L1 of the measurement light, which is emitted from the beam splitter unit 3 in the Z-axis direction, is transmitted through the first mirror 51, is incident to the first light detector 6 through the aperture 55, and is detected by the first light detector 6. On the other hand, the laser light L10 emitted from the second light source 7 is reflected by the third mirror 53, is transmitted through the second mirror 52, is reflected by the first mirror 51, and is incident to the beam splitter unit 3 in the Z-axis direction. The interference light L11 of the laser light, which is emitted from the beam splitter unit 3 in the Z-axis direction, is reflected by the first mirror 51 and the second mirror 52, is incident to the second light detector 8, and is detected by the second light detector 8.

[Method for Manufacturing Mirror Device]

Figure 12:
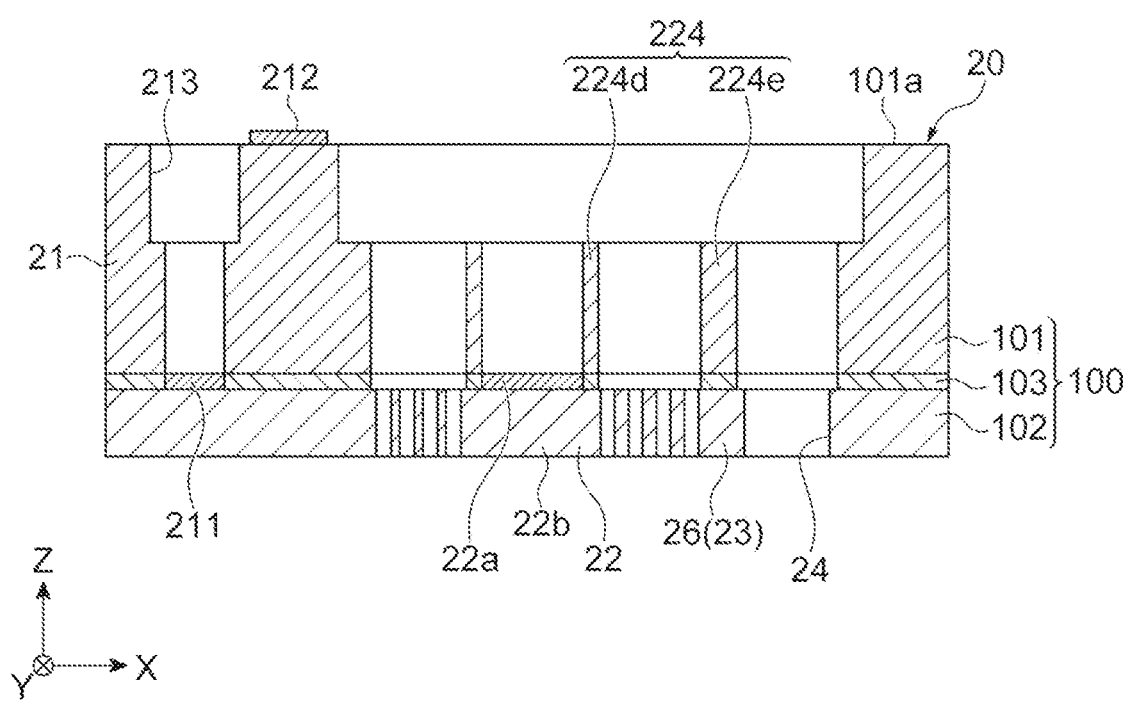
FIG. 12 is a schematic cross-sectional view of a mirror device of the first embodiment.

A method for manufacturing the mirror device 20 according to the first embodiment will be described with reference to FIG. 12 to FIG. 17B. In FIG. 12 to FIG. 17B, respective configurations of the mirror device 20 are schematically illustrated. In the mirror device 20 illustrated in FIG. 12, the rib portion 224 includes a first rib portion 224d provided in the movable unit 22b, and a second rib portion 224e provided in the first elastic support unit 26 and the second elastic support unit 27. For example, the first rib portion 224d and the second rib portion 224e has the same configuration as in the inner rib portion 224a, the outer rib portion 224b, and the connection rib portions 224c. For example, the second rib portion 224e may be disposed on each of the levers 261 and 271 illustrated in FIG. 6, or instead of or in addition to this, the second rib portion 224e may be disposed on each of the electrode support portions 269 and 279 illustrated in FIG. 6. The rib portion 224 may include only one of the first rib portion 224d and the second rib portion 224e. In FIG. 12, illustration of the second rib portion 224e provided in the second elastic support portion 27 is omitted.

In the manufacturing method according to the first embodiment, first, the SOI substrate 100 including portions corresponding to the base 21, the movable unit 22b, and the drive unit 23 is prepared (first step). In the first step, the SOI substrate 100 in which the support layer 101 is thicker than the device layer 102 is prepared. Note that, for example, the "portions corresponding to the base 21, the movable unit 22b, and the drive unit 23" represents portions which become the base 21, the movable unit 22b, and the drive unit 23 after processing.

Next, a first resist layer 104 is formed in a region corresponding to the base 21 on the surface 101a of the support layer 101 which is opposite to the intermediate layer 103 (second step, FIG. 13A). The first resist layer 104 is not formed in a region corresponding to a region, on which each of the electrode pads 211 is to be formed, on the surface 101a. Note that, a "region corresponding to an element on an surface" represents, for example, a region that overlaps the element on the surface when viewed from the Z-axis direction. For example, a region corresponding to the base 21 on the surface 101a represents a region that overlaps the base 21 on the surface 101a when viewed from the Z-axis direction.

Next, the support layer 101 is etched up to an intermediate portion in the thickness direction (Z-axis direction) using the first resist layer 104 as a mask to form a depression 105 in the support layer 101 (third step). Next, the first resist layer 104 is peeled off (FIG. 13B). In other words, in the third step, the support layer 101 is etched so as not to reach the intermediate layer 103. The depth of the depression 105 is determined in accordance with the thickness of the rib portion 224. In the case of forming the mirror device 20, a plurality of the depressions 105 are formed in the third step. One of the depressions 105 is formed at a position corresponding to the movable unit 22b and the drive unit 23. The other depressions 105 are formed at positions corresponding to positions where the electrode pads 211 are to be formed.

Next, a second resist layer 106 is formed in a region corresponding to the rib portion 224 in a bottom surface 105a of each of the depressions 105, on a side surface 105b of the depression 105, and on the surface 101a of the support layer 101 (forth step, FIG. 14A). The second resist layer 106 is formed on an entire surface of the side surface 105b and on an entire surface of the surface 101a. As illustrated in FIG. 14A, the second resist layer 106 is also formed in a region along a boundary with the side surface 105b in the bottom surface 105a. The reason for this is because a part of the second resist layer 106 remains along the boundary with the side surface 105b in the bottom surface 105a when patterning the second resist layer 106. For example, the second resist layer 106 is formed by a spray coating method, but may be formed by a dip coating method.

Next, the support layer 101 is etched until reaching the intermediate layer 103 using the second resist layer 106 as a mask to form the rib portion 224 (fifth step). Next, after peeling off the second resist layer 106, the exposed intermediate layer 103 is peeled off (FIG. 14B). Since the second resist layer 106 is formed to reach the bottom surface 105a from the side surface 105b of the depression 105, in the fifth step, a stepped surface 107 is formed in the base 21. The stepped surface 107 extends along an edge of each of the depressions 105 when viewed from the Z-axis direction. In FIG. 5 and FIG. 6, the stepped surface 107 is illustrated. In addition, in the second step to the fifth step, the opening 213 and the groove 216 (FIG. 11) described above are formed in parallel with the formation of the rib portion 224. The stepped surface 107 corresponds to the above-described stepped surface 215b.

Figure 15A:
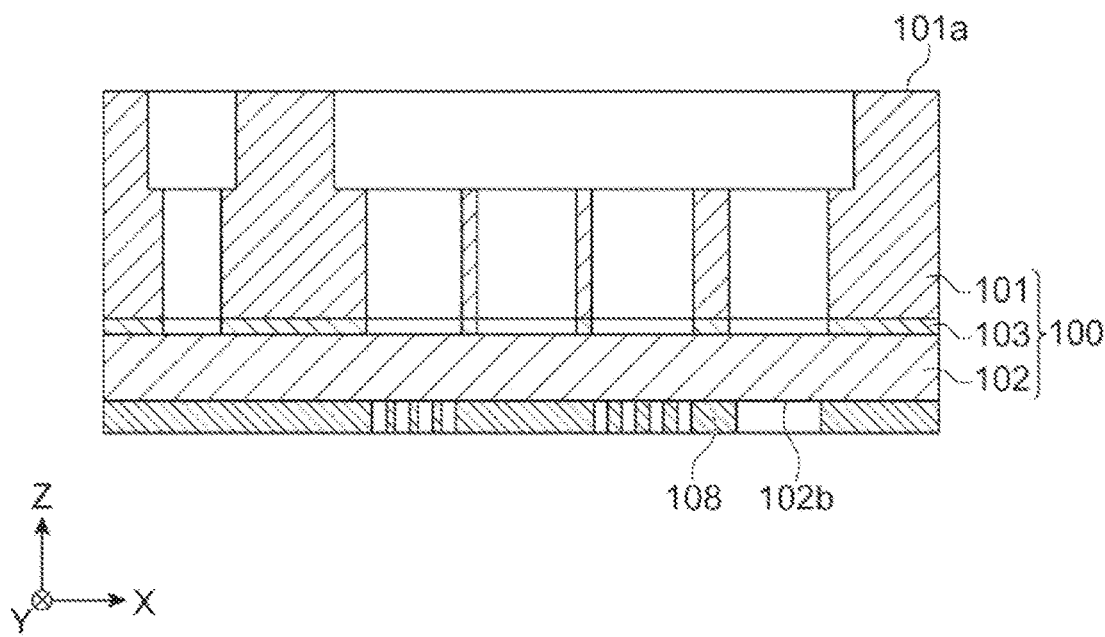
FIG. 15A and FIG. 15B are views for describing the method for manufacturing the mirror device according to the first embodiment.
Figure 15B:
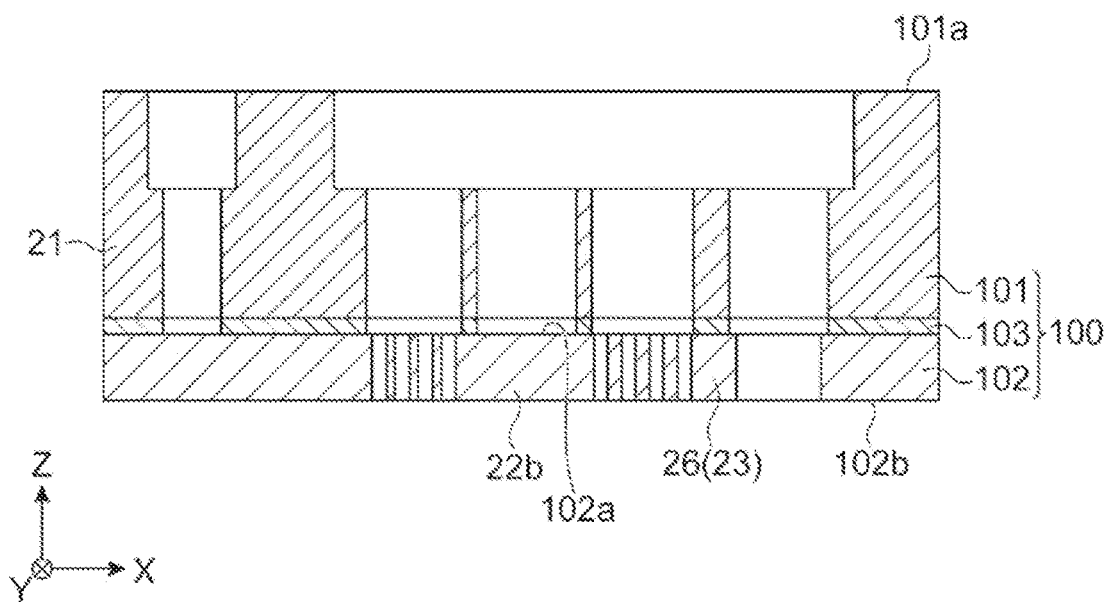

Next, a third resist layer 108 is formed in a region corresponding to the base 21, the movable unit 22b, and the drive unit 23 on a surface 102b of the device layer 102 which is opposite to the intermediate layer 103 (FIG. 15A). Next, the device layer 102 is etched through using the third resist layer 108 as a mask. Accordingly, the base 21, the movable unit 22b, and the drive unit 23 are separated from each other. Next, the third resist layer 108 is peeled off (FIG. 15B).

Next, the mirror surface 22a is formed on the surface 102a of the device layer 102 on the intermediate layer 103 side (sixth step). For example, the mirror surface 22a is formed through sputtering using a hard mask. Next, the electrode pads 211 are formed on the surface 102a of the device layer 102, and the electrode pads 212 are formed on the surface 101a of the support layer 101 (FIG. 12). For example, the electrode pads 211 and 212 are formed through sputtering using a hard mask. Through the above-described processes, the mirror device 20 illustrated in FIG. 12 is obtained.

Note that, the order of the processes is not limited to the above-described example. For example, formation of the third resist layer 108 and etching of the device layer 102 may be carried out before the second step or before the fourth step. Formation of the electrode pads 211 and electrode pads 212 may be carried out before forming the mirror surface 22a. Formation of the electrode pads 211 and 212 may be carried out between the fifth step and the sixth step. In the above description, it is explained with focus given to the one mirror device 20, but each of processing steps may be performed with respect to a wafer (semiconductor substrate) including a plurality of the portions corresponding to the SOI substrate 100, and mirror devices 20 which have been processed may be diced along a dicing line set to a boundary between the portions corresponding to the SOI substrate 100 to collectively form a plurality of the mirror devices 20. In this case, for example, the wafer is cut off in a state in which the wafer is fixed by adhering the surface 101a of the support layer 101 to a dicing tape.

Function and Effect of First Embodiment

Figure 17A:
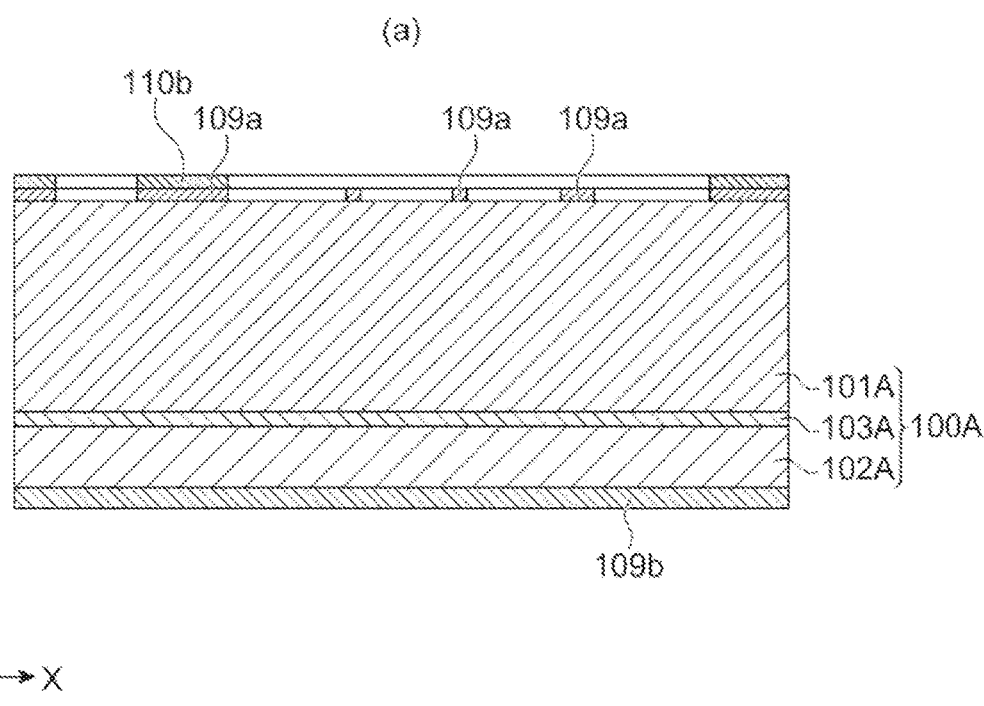
FIG. 17A and FIG. 17B are views for describing the method for manufacturing the mirror device according to the comparative example.
Figure 17B:
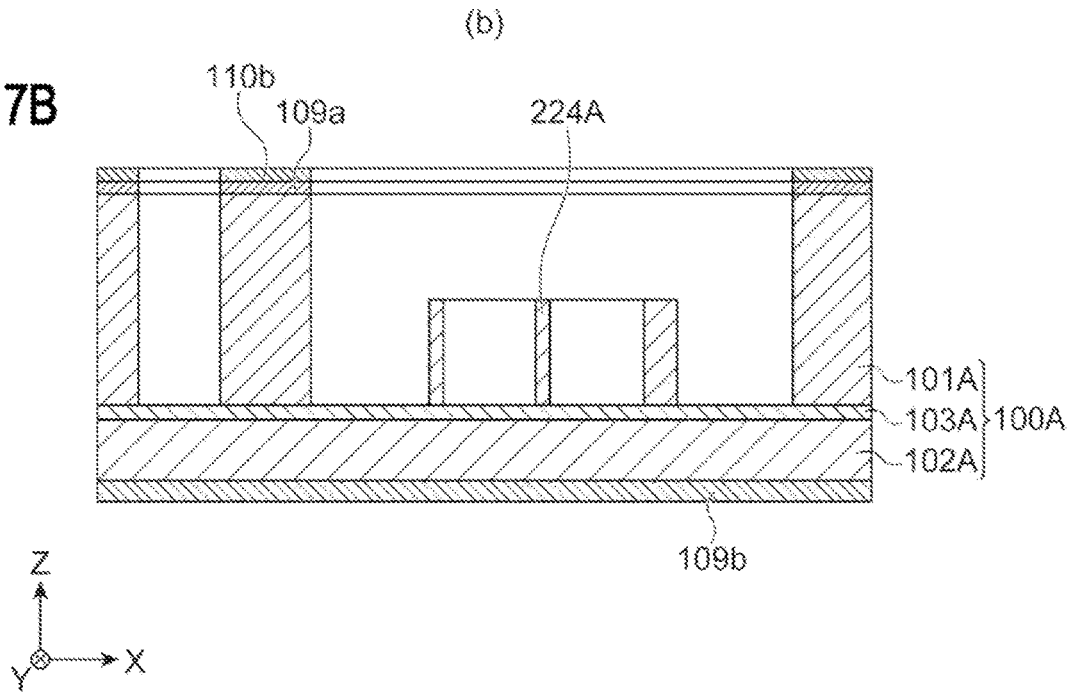
Figure 18:
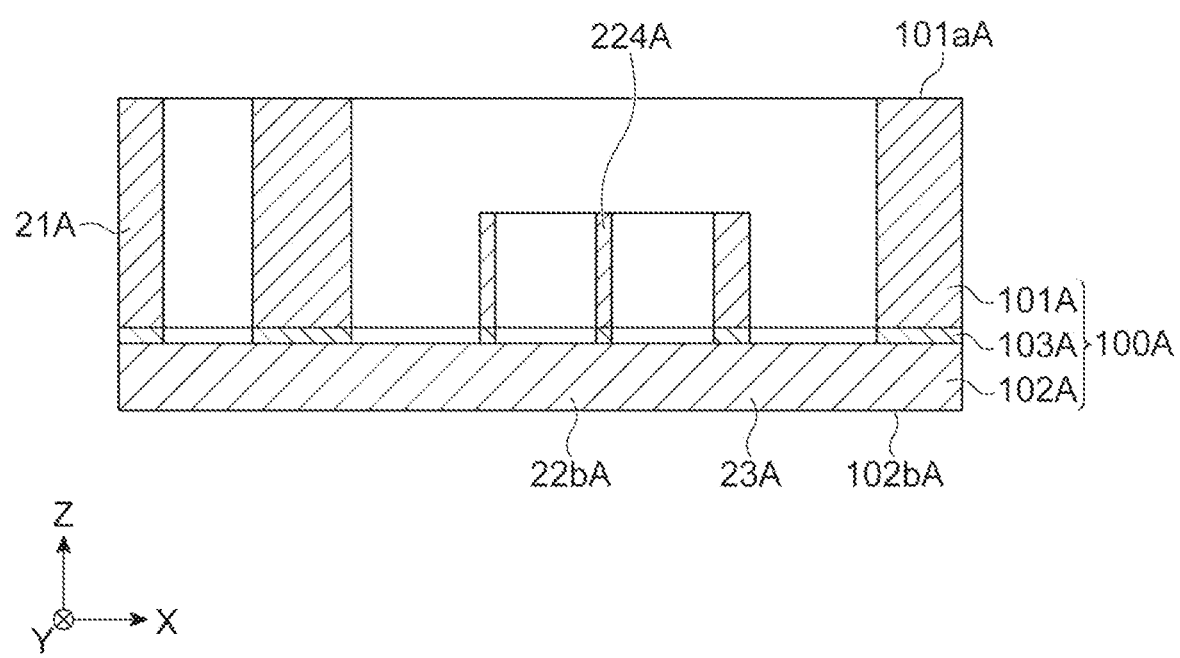
FIG. 18 is a view for describing the method for manufacturing the mirror device according to the comparative example.

A method for manufacturing a mirror device according to a comparative example will be described with reference to FIG. 16A to FIG. 18. The mirror device manufactured by the manufacturing method of the comparative example has a similar configuration as in the mirror device 20 of the first embodiment. That is, the mirror device of the comparative example includes a base 21A, a movable unit 22bA, and a drive unit 23A (FIG. 18). The movable unit 22bA includes a rib portion 224A. In the manufacturing method of the comparative example, first, an SOI substrate 100A including a support layer 101A, a device layer 102A, and an intermediate layer 103A is prepared. The SOI substrate 100A includes portions corresponding to the base 21A, the movable unit 22bA, and the drive unit 23A. Next, an oxide film 109a is formed on a surface 101aA of the support layer 101A which is opposite to the intermediate layer 103A, and an oxide film 109b is formed on a surface 102bA of the device layer 102A which is opposite to the intermediate layer 103A.

Figure 16A:
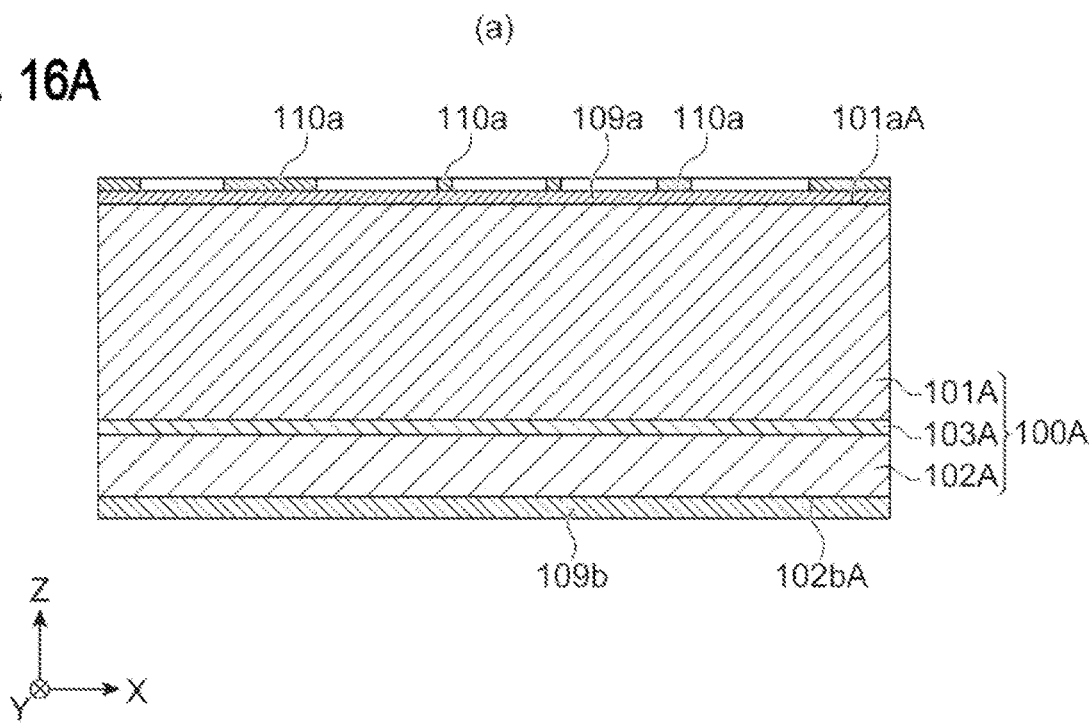
FIG. 16A and FIG. 16B are views for describing a method for manufacturing a mirror device according to a comparative example.
Figure 16B:
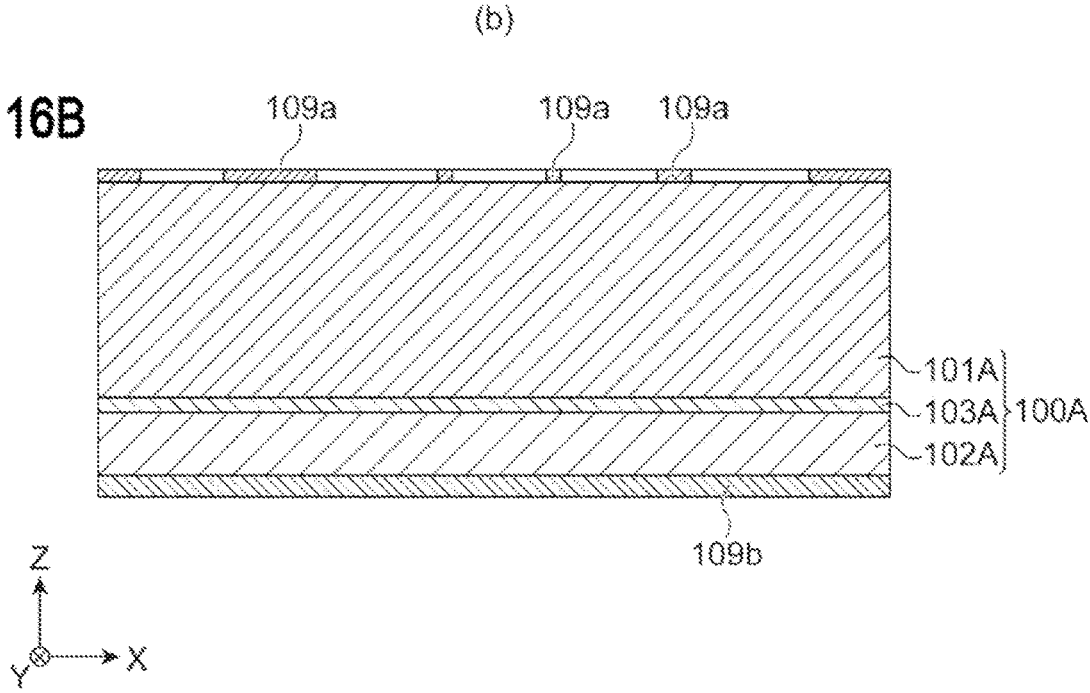

Next, a resist layer 110a is formed in regions corresponding to the base 21A and the rib portion 224A on a surface of the oxide film 109a (FIG. 16A). Next, after the oxide film 109a is etched using the resist layer 110a as a mask, the resist layer 110a is peeled off (FIG. 16B). Next, a resist layer 110b is formed in a region corresponding to the base 21 on the surface of the oxide film 109a (FIG. 17A). Next, when the support layer 101A is etched up to the intermediate layer 103A using the resist layer 110b as a mask, the rib portion 224A is formed (FIG. 17B). The reason for this is as follows. At the time of the etching, the exposed oxide film 109a is simultaneously etched, and thus in the region in which the oxide film 109a is formed, an etching rate is slower in comparison to a region in which the oxide film 109a is not formed. Next, after the resist layer 110b, the oxide film 109a, and the oxide film 109b are peeled off, the exposed intermediate layer 103A is removed (FIG. 18).

Figure 19A:
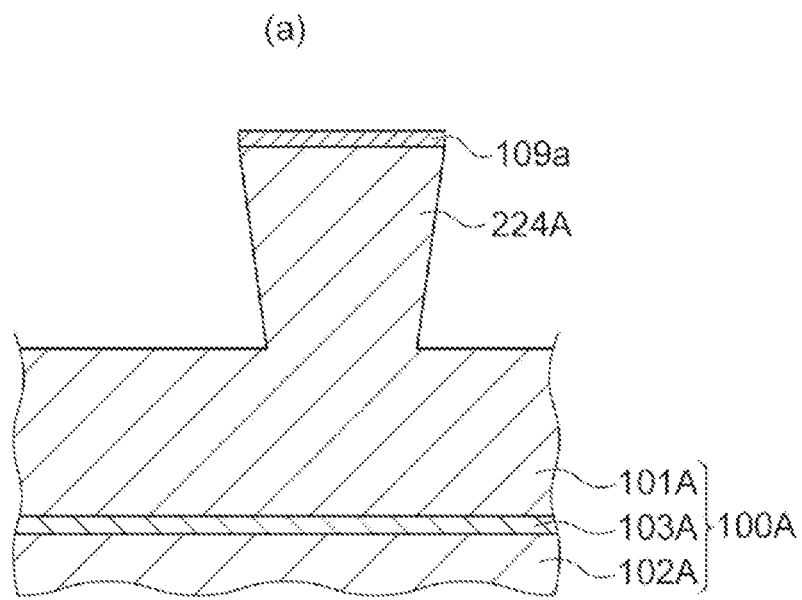
FIG. 19A and FIG. 19B are views for describing an operational effect of the method for manufacturing the mirror device according to the first embodiment.

It is also possible to obtain a mirror device including the rib portion 224A by the manufacturing method of the comparative example, but in the manufacturing method of the comparative example, it is difficult to form the rib portion 224A with accuracy. The reason for this will be described with reference to FIG. 19A to FIG. 21B. FIG. 19A, FIG. 20A, and FIG. 21A schematically illustrate a state in the middle of the etching for forming the rib portion 224A, and FIG. 19B, FIG. 20B, and FIG. 21B schematically illustrate a state after the etching.

Figure 19B:
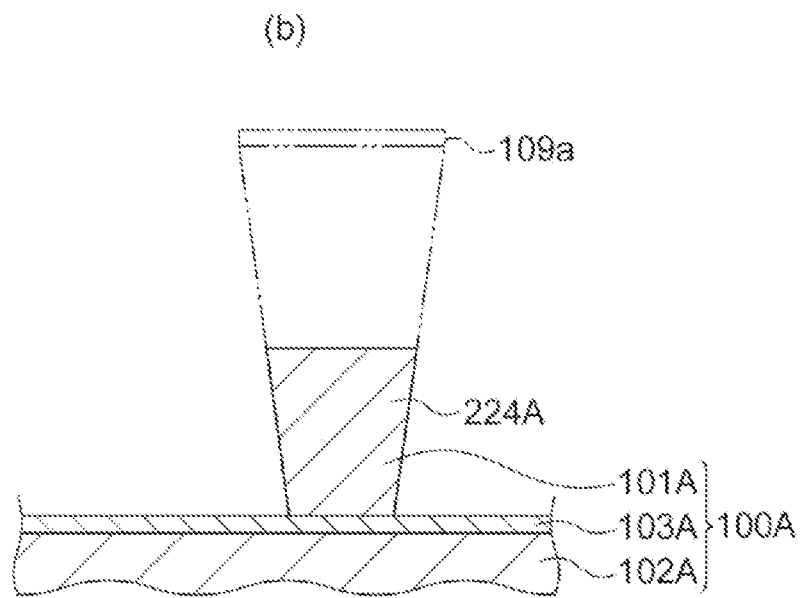
Figure 20A:
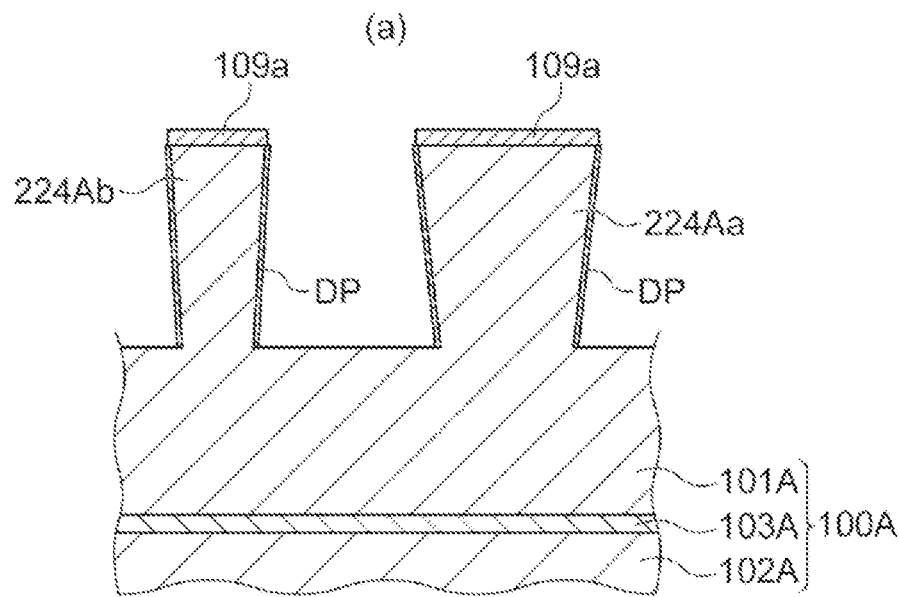
FIG. 20A and FIG. 20B are views for describing the operational effect of the method for manufacturing the mirror device according to the first embodiment.

As illustrated in FIG. 19A and FIG. 19B, in the manufacturing method of the comparative example (silicon deep digging etching, Bosch process), the rib portion 224A is likely to be formed in an inverted taper shape in which a width of a tip end is wider than a width of a base end. Accordingly, it is difficult to control the width of the rib portion 224A to a desired width. Depending on a type of an applied etching process (for example, in a case where a non-Bosch process is used), the rib portion 224A may be likely to be formed in a forward taper shape in which the width of the tip end is narrower than the width of the base end, but it is also difficult to control the width of the rib portion 224A.

Figure 20B:
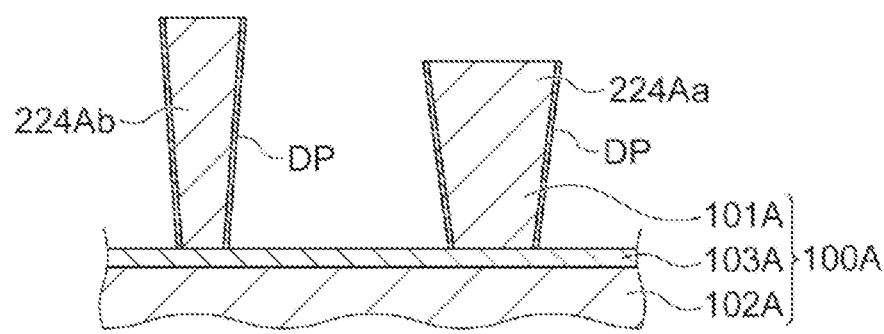
Figure 21A:
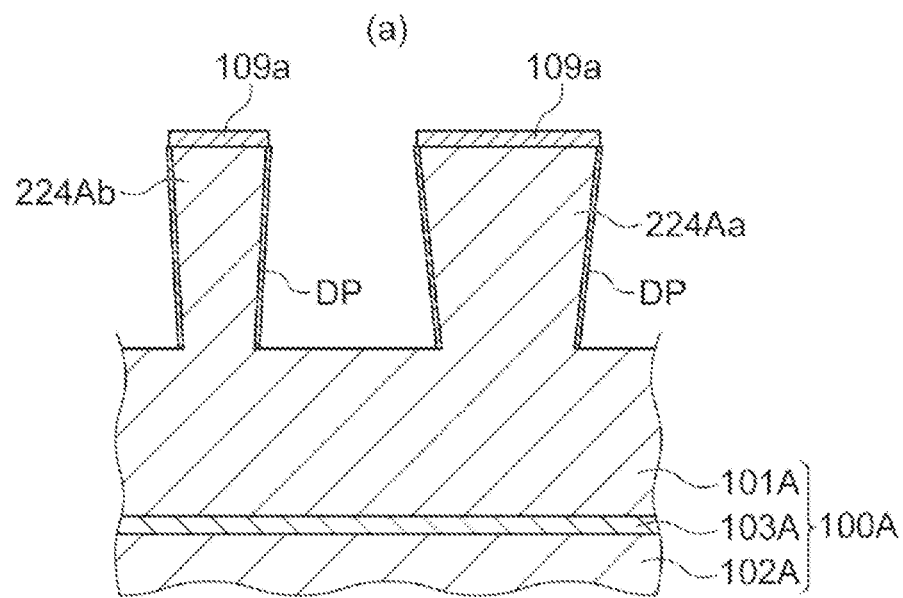
FIG. 21A and FIG. 21B are views for describing the operational effect of the method for manufacturing the mirror device according to the first embodiment.

In addition, as illustrated in FIG. 20A and FIG. 20B, in the manufacturing method of the comparative example, in a case where the rib portion 224A includes portions 224Aa and 224Ab having widths different from each other, there is a concern that a difference occurs in an etching rate between the portions 224Aa and 224Ab, and thus a height of the portion 224Aa and a height of the portion 224Ab may be different from each other. A reference numeral DP indicates a deposited layer formed on a side surface of the rib portion 224A during the etching. The difference in the etching rate between the portions 224Aa and 224Ab occurs due to a microloading effect in which the etching rate decreases as an aspect ratio (a ratio between pattern dimensions and a depth) of a groove portion surrounding the rib porting 224A increases. In a case where the height of the rib portion 224A is same, as the width of the groove portion is narrower, the aspect ratio increases, and thus etching is slower.

Figure 21B:
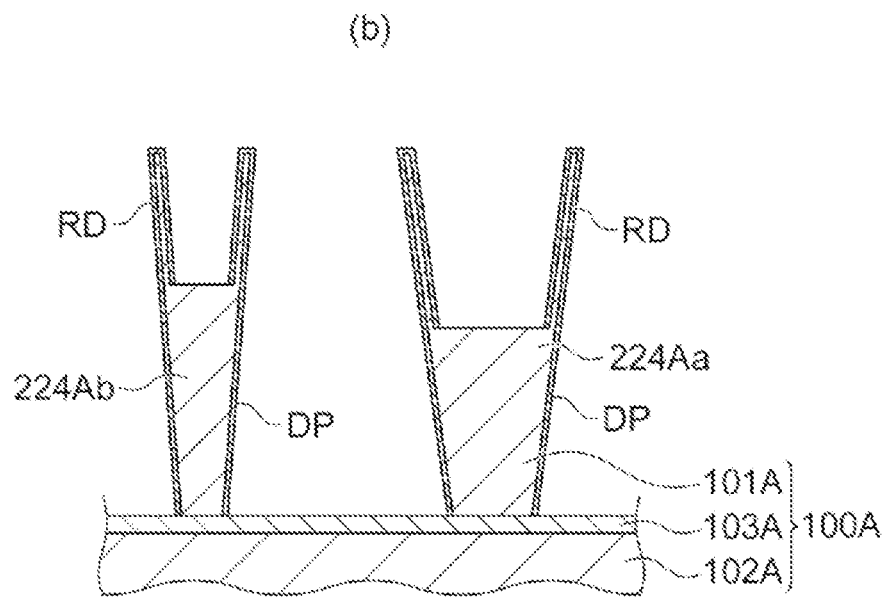
Figure 22:
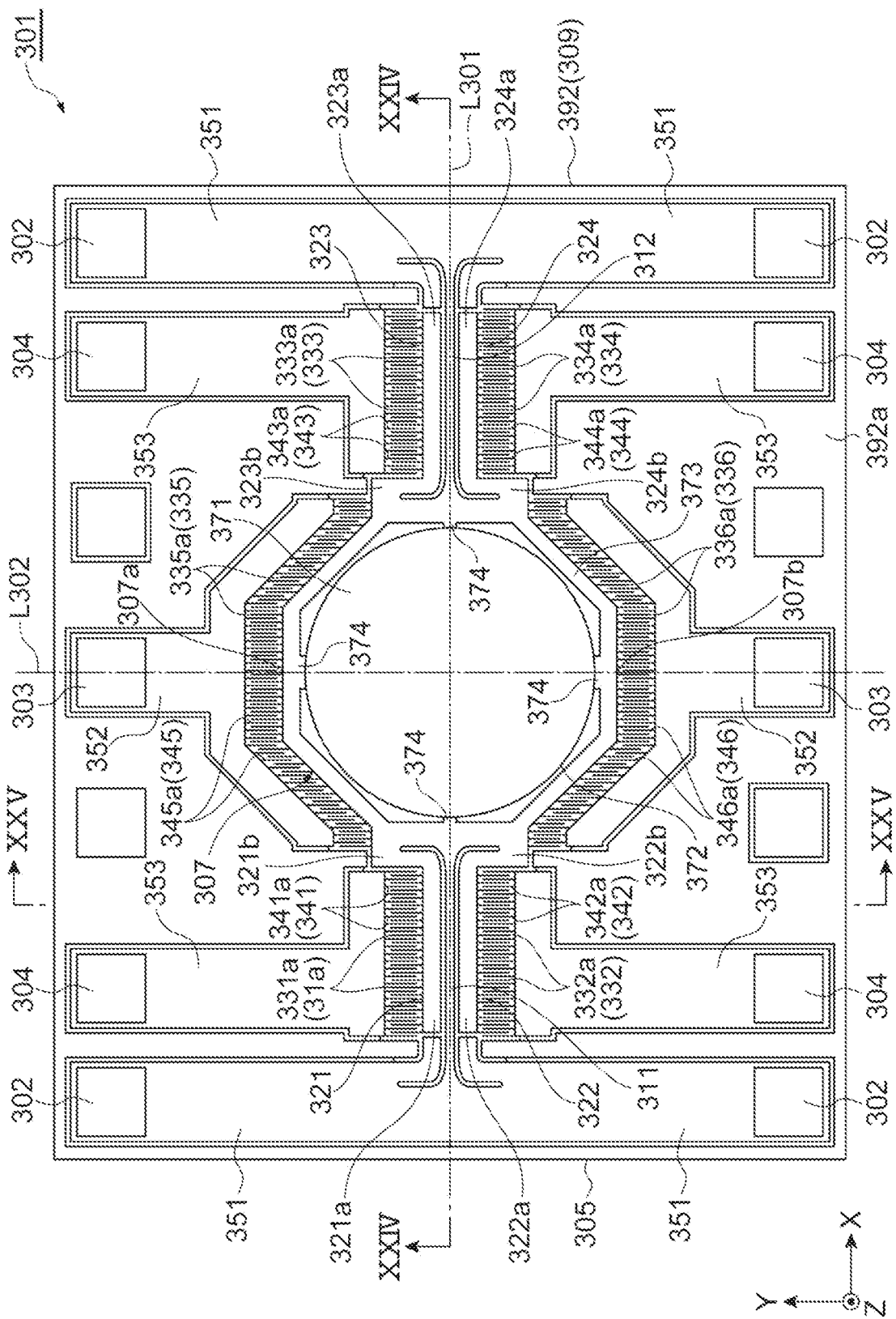
FIG. 22 is a plan view of an optical device of a second embodiment.

In addition, as illustrated in FIG. 21A and FIG. 21B, in the manufacturing method of the comparative example, the oxide film 109a is completely removed in the middle of the etching for forming the rib portion 224A, but in a case where the etching is continuously progressed, a residue RD is likely to occur in an edge portion of the rib portion 224A. The reason for this is considered as follows. When the aspect ratio of the groove portion surrounding the rib portion 224A is high, an etching rate is slow, and the rib portion 224A is likely to be formed in a forward taper shape. In the case of the forward taper shape, particularly, as the etching is progressed, removal of the deposited layer DP on a top surface of the rib portion 224A is difficult, and the deposited layer DP is likely to remain near a peripheral edge of the top surface. The deposited layer DP that remains near the peripheral edge serves as a mask, and the support layer 101A is not etched. As a result, the residue RD occurs.

As described above, in the manufacturing method of the comparative example, it is difficult to form the rib portion 224A with accuracy. In contrast, in the method for manufacturing the mirror device 20 according to the first embodiment, as described above, the rib portion 224 is formed by two-stage etching using the first resist layer 104 and the second resist layer 106 as a mask. Accordingly, it is possible to form the rib portion 224 with accuracy. That is, in the manufacturing method of the first embodiment, it is easy to control the width of the rib portion 224 in comparison to the manufacturing method of the comparative example. In addition, in a case where the rib portion 224 includes portions having widths different from each other, it is easy to form the portions in the same height. In addition, it is possible to suppress occurrence of a residue at an edge portion of the rib portion 224.

In addition, in the mirror device 20, the support layer 101 constituting the rib portion 224 is thinner than the support layer 101 constituting the base 21. Accordingly, the rib portion 224 is suppressed from protruding from the base 21, and thus it is possible to realize protection of the rib portion 224. More specifically, at least during stoppage of the movable unit 22b, the rib portion 224 does not protrude from the base 21, and thus it is possible to realize protection of the rib portion 224 during stoppage of the movable unit 22b. In addition, since the rib portion 224 does not protrude from the base 21 during movement of the movable unit 22b, it is possible to realize protection of the rib portion 224 during movement of the movable unit 22b. In addition, since the rib portion 224 is suppressed from protruding from the base 21, it is possible to increase a movement amount of the movable unit 22b in the Z-axis direction. In addition, in a case where the thickness of the support layer 101 constituting the rib portion 224 is the same as the thickness of the support layer 101 constituting the base 21, when dicing the SOI substrate 100, the rib portion 224 is adhered to the dicing tape. Accordingly, there is a concern that the rib portion 224 may be broken during peeling-off. However, in the mirror device 20, it is possible to avoid the problem.

In the first step of the manufacturing method according to the first embodiment, the SOI substrate 100 in which the support layer 101 is thicker than the device layer 102 is prepared. In the mirror device 20 obtained, it is possible to secure the thickness of the rib portion 224, and it is possible to more appropriately suppress deformation of the movable unit 22b.

In the sixth step of the manufacturing method according to the first embodiment, the mirror surface 22a is formed on the surface 102a of the device layer 102 on the intermediate layer 103 side. Accordingly, it is possible to protect mirror surface 22a by the base 21 and the rib portion 224, and it is possible to suppress damage of the mirror surface 22a due to direct contact, for example, during transportation or the like.

In the mirror device 20, the rib portion 224 includes a plurality of portions (the inner rib portion 224a, the outer rib portion 224b, and the connection rib portion 224c, or the first rib portion 224d and the second rib portion 224e) having widths different from each other. In the manufacturing method of the first embodiment, even in a case where the rib portion 224 includes a plurality of portions having widths different from each other, it is possible to form the rib portion 224 with accuracy.

In the mirror device 20, the first elastic support unit 26 and the second elastic support unit 27 support the movable unit 22b so that the movable unit 22b can move along the Z-axis direction. In the manufacturing method of the first embodiment, in the case of manufacturing the mirror device 20, it is possible to form the rib portion 224 with accuracy.

The mirror device 20 includes the fixed comb electrodes 281 and 283 and the movable comb electrodes 282 and 284. In the manufacturing method of the first embodiment, in the case of manufacturing the mirror device 20, it is possible to form the rib portion 224 with accuracy.

Modification Example of First Embodiment

In the first embodiment, materials and shapes of respective configurations are not limited to the above-described materials and shapes, and various materials and shapes can be employed. For example, each of the arrangement portion 221 and the mirror surface 22a may have any shape such as a rectangular shape and an octagonal shape when viewed from the Z-axis direction. The frame portion 222 may have any ring shape such as a rectangular ring shape and an octagonal ring shape when viewed from the Z-axis direction. Each of the light passage opening 24 and the light passage opening 25 may have any shape such as a circular shape and an octagonal shape when viewed from the Z-axis direction. The mirror device 20 may include a hole or a notch formed in the base 21 as a first light passage portion instead of the light passage opening 24 or the light passage opening 25. The semiconductor substrate that constitutes the mirror device 20 may not be an SOI substrate, and may be a substrate including a first semiconductor layer, a second semiconductor layer, and an insulating layer disposed between the first semiconductor layer and the second semiconductor layer.

Each of the inner rib portion 224a, the outer rib portion 224b, and the connection rib portion 224c may be formed in any shape. For example, the rib portions may extend obliquely with respect to X-axis direction or the Y-axis direction, or may extend in a zigzag shape. The arrangement, the number, the length, the width, and the thickness of the rib portions may be arbitrarily set. For example, the thicknesses of the inner rib portion 224a, the outer rib portion 224b, and the connection rib portion 224c may be different from each other. At least one of the rib portions may be omitted. The rib portion 224 may not surround the mirror surface 22a when viewed from the Z-axis direction. The shape of the first torsion bars 266 and 276, and the second torsion bars 267 and 277 are not limited, and may be any shape such as a rod shape. The mirror surface 22a may be disposed on a surface, which is opposite to the intermediate layer 103, in the device layer 102 that constitutes the movable unit 22b. In this case, for example, the surface, which is opposite to the intermediate layer 103, in the support layer 101 that constitutes the base 21 is joined to the third surface 13a of the optical function member 13. The second surface 21b of the base 21 and the third surface 13a of the optical function member 13 may be joined to each other with means (for example, an adhesive such as a UV-curable resin) other than the direct bonding. In a case where the fixed mirror 16 is disposed on a side opposite to the mirror device 20 with respect to the optical function member 13, the fixed mirror 16 may be separated from the fourth surface 13b of the optical function member 13.

In the first embodiment, the rib portion 224 is constituted by the support layer 101 and the intermediate layer 103, but the rib portion 224 may be constituted by at least the support layer 101. For example, the rib portion 224 may be constituted by only the support layer 101. For example, the intermediate layer 103 may be disposed over the device layer 102 that constitutes the movable unit 22b and the drive unit 23. In this case, the mirror surface 22a is provided on the intermediate layer 103. When manufacturing the mirror device 20, after forming the rib portion 224 in the fifth step, the intermediate layer 103 is not removed. According to the method for manufacturing the mirror device 20, as in the first embodiment, it is possible to form the rib portion 224 with accuracy. Here, the intermediate layer 103 functions as an etching stopper layer, and thus a variation is likely to occur in the thickness of the intermediate layer 103. In the first embodiment, since the exposed intermediate layer 103 is removed, it is possible to suppress the variation of the thickness.

The optical device of the present disclosure is not limited to the mirror device, and may be an optical device in which another optical function unit other than the mirror surface 22a is disposed on the movable unit 22b. Examples of the other optical function unit include a lens and the like. The drive unit 23 of the mirror device 20 may include three or more elastic support portions which elastically support the movable mirror 22. In the mirror device 20, the movement direction of the movable unit 22b is a direction perpendicular to the first surface 21a of the base 21, but the movement direction of the movable unit 22b may be a direction that intersects the first surface 21a. The actuator unit 28 is not limited to the electrostatic actuator, and may be, for example, a piezoelectric type actuator, an electromagnetic type actuator, or the like. The mirror device 20 is not limited to a device that constitutes the FTIR, and may constitute another optical system.

Second Embodiment

An optical device 301 according to a second embodiment will be described with reference to FIG. 22 to FIG. 25. The optical device 301 includes a base 305, a movable unit 307, a first torsion bar (elastic support portion) 311, and a second torsion bar (elastic support portion) 312. The first and second torsion bars 311 and 312 supports the movable unit 307 so that the movable unit 307 can swing around an axial line L301 to be described later. The optical device 301 is constituted as an MEMS device by a silicon on insulator (SOI) substrate (semiconductor substrate) 309. For example, the optical device 301 has a rectangular plate shape. For example, the optical device 301 has a size of approximately 9 mm×7 mm×0.4 mm.

The base 305 is formed by parts of a handle layer (first semiconductor layer) 391, a device layer (second semiconductor layer) 392, and an intermediate layer 393 which constitute the SOI substrate 309. The handle layer 391 is a first silicon layer. The device layer 392 is a second silicon layer. The intermediate layer 393 is an insulating layer disposed between the handle layer 391 and the device layer 392.

The movable unit 307 is disposed in a state in which an intersection between the axial line L301 and an axial line L302 is set as a central position (gravity center position). The axial line L301 is a straight line that extends in the X-axis direction (a direction parallel to the X-axis, a first direction). The axial line L302 is a straight line that extends in the Y-axis direction (a direction parallel to the Y-axis, a second direction perpendicular to the first direction). When viewed from a Z-axis direction (a direction parallel to the Z-axis, a third direction perpendicular to the first direction and the second direction), the movable unit 307 has a shape linearly symmetric to the axial line L301 and is linearly symmetric to the axial line L302.

The movable unit 307 includes an optical function unit 371, a fifth main body portion 372, a frame 373, a plurality of fifth connection portions 374, a main body rib portion 375, a frame rib portion 376, and a plurality of connection rib portions 377. The optical function unit 371 is provided in the fifth main body portion 372. The optical function unit 371 is a mirror formed on a surface 392a, which is opposite to the handle layer 391, in the device layer 392 that constitutes the fifth main body portion 372. For example, the mirror is obtained by forming a metallic film on the surface 392a of the device layer 392 that constitutes the fifth main body portion 372 through vapor deposition.

The fifth main body portion 372 is formed by a part of the device layer 392. For example, the fifth main body portion 372 has a circular shape when viewed from the Z-axis direction. The frame 373 surrounds the fifth main body portion 372 when viewed from the z-axis direction. The frame 373 is formed by a part of the device layer 392. For example, the frame 373 has an octagonal ring shape when viewed from the Z-axis direction. The plurality of fifth connection portions 374 are respectively disposed on both sides of the fifth main body portion 372 on the axial line L301, and both sides of the fifth main body portion 372 on the axial line L2. Specifically, the plurality of fifth connection portions 374 are disposed at a position corresponding to a first end 307a (position between the first end 307a and a central position of the movable unit 307), a position corresponding to a second end 307b (position between the second end 307b and a central position of the movable unit 307), a position on an extending line of the first torsion bar 311, and a position on an extending line of the second torsion bar 312. Each of the fifth connection portions 374 is connected to the fifth main body portion 372 and the frame 373. Each of the fifth connection portions 374 is bridged between the fifth main body portion 372 and the frame 373. The fifth connection portion 374 is formed by a part of the device layer 392.

The main body rib portion 375 extends along an outer edge of the fifth main body portion 372. The main body rib portion 375 is formed by parts of the handle layer 391 and the intermediate layer 393. The main body rib portion 375 is formed on a surface 392b on the handle layer 391 side in the device layer 392 that constitutes the fifth main body portion 372. For example, the main body rib portion 375 has a circular ring shape when viewed from the Z-axis direction. The frame rib portion 376 extends along the frame 373. The frame rib portion 376 is formed by parts of the handle layer 391 and the intermediate layer 393. The frame rib portion 376 is formed on the surface 392b of the device layer 392 that constitutes the frame 373. For example, the frame rib portion 376 has an octagonal ring shape when viewed from the Z-axis direction. The plurality of connection rib portions 377 are respectively disposed in the plurality of fifth connection portions 374. Each of the connection rib portion 377 is connected to the main body rib portion 375 and the frame rib portion 376. Each of the connection rib portions 377 is bridged between the main body rib portion 375 and the frame rib portion 376. Each of the connection rib portions 377 is formed by parts of the handle layer 391 and the intermediate layer 393. Each of the connection rib portions 377 is formed on the surface 392b of the device layer 392 that constitutes the fifth connection portion 374. The handle layer 391 that constitutes the main body rib portion 375, the frame rib portion 376, and each of the connection rib portions 377 is thinner than the handle layer 391 that constitutes the base 305.

The first torsion bar 311 is disposed on one side of the movable unit 307 in the X-axis direction. The first torsion bar 311 extends on the axial line L301 along the X-axis direction. The first torsion bar 311 is formed by a part of the device layer 392. The first torsion bar 311 is connected to the base 305 and the movable unit 307. The first torsion bar 311 is bridged between the base 305 and the movable unit 307 (the frame 373 in the optical device 301). The first torsion bar 311 is connected to the movable unit 307 in such a manner that curvatures of an outer edge of the first torsion bar 311 and an outer edge of the movable unit 307 (an outer edge of the frame 373 in the optical device 301) are continuous when viewed from the Z-axis direction. Specifically, in the first torsion bar 311, a portion connected to the movable unit 307 has a shape in which both side surfaces of the portion are curved in a concave shape so that a width of the portion in the Y-axis direction increases as it approaches the movable unit 307. Similarly, in the first torsion bar 311, a portion connected to the base 305 has a shape in which both sides surfaces of the portion are curved in a concave shape so that a width of the portion in the Y-axis direction increases as it approaches the base 305.

The second torsion bar 312 is disposed on the other side of the movable unit 307 in the X-axis direction. The second torsion bar 312 extends on the axial line L301 along the X-axis direction. The second torsion bar 312 is formed by a part of the device layer 392. The second torsion bar 312 is connected to the base 305 and the movable unit 307. The second torsion bar 312 is bridged between the base 305 and the movable unit 307 (the frame 373 in the optical device 301). The second torsion bar 312 is connected to the movable unit 307 in such a manner that curvatures of an outer edge of the second torsion bar 312 and an outer edge of the movable unit 307 (the outer edge of the frame 373 in the optical device 301) are continuous when viewed from the Z-axis direction. Specifically, in the second torsion bar 312, a portion connected to the movable unit 307 has a shape in which both side surfaces of the portion are curved in a concave shape so that a width of the portion in the Y-axis direction increases as it approaches the movable unit 307. Similarly, in the second torsion bar 312, a portion connected to the base 305 has a shape in which both sides surfaces of the portion are curved in a concave shape so that a width of the portion in the Y-axis direction increases as it approaches the base 305.

The optical device 301 further includes a first support portion 321, a second support portion 322, a third support portion 323, and a fourth support portion 324. The first support portion 321 is disposed on one side of the first torsion bar 311 in the Y-axis direction, and is connected to the movable unit 307. The second support portion 322 is disposed on the other side of the first torsion bar 311 in the Y-axis direction, and is connected to the movable unit 307. The third support portion 323 is disposed on one side of the second torsion bar 312 in the Y-axis direction, and is connected to the movable unit 307. The fourth support portion 324 is disposed on the other side of the second torsion bar 312 in the Y-axis direction, and the fourth support portion 324 is connected to the movable unit 307.

The first support portion 321 includes a first main body portion 321a, a first connection portion 321b, and a first rib portion 321c. The first main body portion 321a extends along the X-axis direction in a state in which a gap is formed between the first main body portion 321a and the first torsion bar 311. The first main body portion 321a is formed by a part of the device layer 392. The first connection portion 321b is connected to the first main body portion 321a and the movable unit 307. The first connection portion 321b is bridged between the first main body portion 321a and the movable unit 307 (the frame 373 in the optical device 301). The first connection portion 321b is formed by a part of the device layer 392. The first connection portion 321b has a shape bent to be spaced apart from the portion of the first torsion bar 311 which is connected to the movable unit 307. The first rib portion 321c is formed in the first main body portion 321a and the first connection portion 321b so that the thickness of the first support portion 321 in the Z-axis direction becomes larger than the thickness of the first torsion bar 311 in the Z-axis direction. The first rib portion 321c extends over the first main body portion 321a and the first connection portion 321b, and is connected to the frame rib portion 376. The first rib portion 321c is formed by a part of the handle layer 391 and the intermediate layer 393. A width of the first rib portion 321c in the Y-axis direction is smaller than a width of the first main body portion 321a in the Y-axis direction. The first rib portion 321c is formed on the surface 392b of the device layer 392 that constitutes the first main body portion 321a and the first connection portion 321b. In the optical device 301, the first rib portion 321c is a portion that protrudes from the surface 392b of the device layer 392 that constitutes the first and second torsion bars 311 and 312 in the Z-axis direction. The handle layer 391 that constitutes the first rib portion 321c is thinner than the handle layer 391 that constitutes the base 305.

The second support portion 322 includes a second main body portion 322a, a second connection portion 322b, and a second rib portion 322c. The second main body portion 322a extends along the X-axis direction in a state in which a gap is formed between the second main body portion 322a and the first torsion bar 311. The second main body portion 322a is formed by a part of the device layer 392. The second connection portion 322b is connected to the second main body portion 322a and the movable unit 307. The second connection portion 322b is bridged between the second main body portion 322a and the movable unit 307 (the frame 373 in the optical device 301). The second connection portion 322b is formed by a part of the device layer 392. The second connection portion 322b has a shape bent to be spaced apart from the portion of the first torsion bar 311 which is connected to the movable unit 307. The second rib portion 322c is formed in the second main body portion 322a and the second connection portion 322b so that the thickness of the second support portion 322 in the Z-axis direction becomes larger than the thickness of the first torsion bar 311 in the Z-axis direction. The second rib portion 322c extends over the second main body portion 322a and the second connection portion 322b, and is connected to the frame rib portion 376. The second rib portion 322c is formed by a part of the handle layer 391 and the intermediate layer 393. A width of the second rib portion 322c in the Y-axis direction is smaller than a width of the second main body portion 322a in the Y-axis direction. The second rib portion 322c is formed on the surface 392b of the device layer 392 that constitutes the second main body portion 322a and the second connection portion 322b. In the optical device 301, the second rib portion 322c is a portion that protrudes from the surface 392b of the device layer 392 that constitutes the first and second torsion bars 311 and 312 in the Z-axis direction. The handle layer 391 that constitutes the second rib portion 322c is thinner than the handle layer 391 that constitutes the base 305.

The third support portion 323 includes a third main body portion 323a, a third connection portion 323b, and a third rib portion 323c. The third main body portion 323a extends along the X-axis direction in a state in which a gap is formed between the third main body portion 323a and the second torsion bar 312. The third main body portion 323a is formed by a part of the device layer 392. The third connection portion 323b is connected to the third main body portion 323a and the movable unit 307. The third connection portion 323b is bridged between the third main body portion 323a and the movable unit 307 (the frame 373 in the optical device 301). The third connection portion 323b is formed by a part of the device layer 392. The third connection portion 323b has a shape bent to be spaced apart from the portion of the second torsion bar 312 which is connected to the movable unit 307. The third rib portion 323c is formed in the third main body portion 323a and the third connection portion 323b so that the thickness of the third support portion 323 in the Z-axis direction becomes larger than the thickness of the second torsion bar 312 in the Z-axis direction. The third rib portion 323c extends over the third main body portion 323a and the third connection portion 323b, and is connected to the frame rib portion 376. The third rib portion 323c is formed by a part of the handle layer 391 and the intermediate layer 393. A width of the third rib portion 323c in the Y-axis direction is smaller than a width of the third main body portion 323a in the Y-axis direction. The third rib portion 323c is formed on the surface 392b of the device layer 392 that constitutes the third main body portion 323a and the third connection portion 323b. In the optical device 301, the third rib portion 323c is a portion that protrudes from the surface 392b of the device layer 392 that constitutes the first and second torsion bars 311 and 312 in the Z-axis direction. The handle layer 391 that constitutes the third rib portion 323c is thinner than the handle layer 391 that constitutes the base 305.

The fourth support portion 324 includes a fourth main body portion 324a, a fourth connection portion 324b, and a fourth rib portion 324c. The fourth main body portion 324a extends along the X-axis direction in a state in which a gap is formed between the fourth main body portion 324a and the second torsion bar 312. The fourth main body portion 324a is formed by a part of the device layer 392. The fourth connection portion 324b is connected to the fourth main body portion 324a and the movable unit 307. The fourth connection portion 324b is bridged between the fourth main body portion 324a and the movable unit 307 (the frame 373 in the optical device 301). The fourth connection portion 324b is formed by a part of the device layer 392. The fourth connection portion 324b has a shape bent to be spaced apart from the portion of the second torsion bar 312 which is connected to the movable unit 307. The fourth rib portion 324c is formed in the fourth main body portion 324a and the fourth connection portion 324b so that the thickness of the fourth support portion 324 in the Z-axis direction becomes larger than the thickness of the second torsion bar 312 in the Z-axis direction. The fourth rib portion 324c extends over the fourth main body portion 324a and the fourth connection portion 324b, and is connected to the frame rib portion 376. The fourth rib portion 324c is formed by a part of the handle layer 391 and the intermediate layer 393. A width of the fourth rib portion 324c in the Y-axis direction is smaller than a width of the fourth main body portion 324a in the Y-axis direction. The fourth rib portion 324c is formed on the surface 392b of the device layer 392 that constitutes the fourth main body portion 324a and the fourth connection portion 324b. In the optical device 301, the fourth rib portion 324c is a portion that protrudes from the surface 392b of the device layer 392 that constitutes the first and second torsion bars 311 and 312 in the Z-axis direction. The handle layer 391 that constitutes the fourth rib portion 324c is thinner than the handle layer 391 that constitutes the base 305.

The optical device 301 further includes a first movable comb electrode 331, a second movable comb electrode 332, a third movable comb electrode 333, a fourth movable comb electrode 334, a fifth movable comb electrode 335, and a sixth movable comb electrode 336. The first movable comb electrode 331 is provided in the first main body portion 321a of the first support portion 321. The second movable comb electrode 332 is provided in the second main body portion 322a of the second support portion 322. The third movable comb electrode 333 is provided in the third main body portion 323a of the third support portion 323. The fourth movable comb electrode 334 is provided in the fourth main body portion 324a of the fourth support portion 324. The fifth movable comb electrode 335 is provided a portion including the first end 307a in movable unit 307. The first end 307a is an end on one side of the movable unit 307 in the Y-axis direction. In the optical device 301, the fifth movable comb electrode 335 is provided in a portion located between the first connection portion 321b of the first support portion 321 and the third connection portion 323b of the third support portion 323 in the frame 373, and includes the first end 307a. The sixth movable comb electrode 336 is provided in a portion including the second end 307b in the movable unit 307. The second end 307b is an end on the other side of the movable unit 307 in the Y-axis direction. In the optical device 301, the sixth movable comb electrode 336 is provided in a portion located between the second connection portion 322b of the second support portion 322 and the fourth connection portion 324b of the fourth support portion 324, and includes the second end 307b in the frame 373.

The first movable comb electrode 331 is formed by a part of the device layer 392. The first movable comb electrode 331 is disposed between the first main body portion 321a of the first support portion 321 and the first end 307a of the movable unit 307 when viewed from the X-axis direction. The first movable comb electrode 331 includes a plurality of first movable comb fingers 331a. Each of first movable comb fingers 331a is provided on a side surface, which is opposite to the first torsion bar 311, in the first main body portion 321a of the first support portion 321. Each of the first movable comb fingers 331a extends along a plane perpendicular to the X-axis direction. The plurality of first movable comb fingers 331a are arranged in such a manner that an interval between the first movable comb fingers 331a adjacent to each other in the X-axis direction becomes constant.

The second movable comb electrode 332 is formed by a part of the device layer 392. The second movable comb electrode 332 is disposed between the second main body portion 322a of the second support portion 322 and the second end 307b of the movable unit 307 when viewed from the X-axis direction. The second movable comb electrode 332 includes a plurality of second movable comb fingers 332a. Each of the second movable comb fingers 332a is provided on a side surface, which is opposite to the first torsion bar 311, in the second main body portion 322a of the second support portion 322. Each of the second movable comb fingers 332a extends long a plane perpendicular to the X-axis direction. The plurality of second movable comb fingers 332a are arranged in such a manner that an interval between the second movable comb fingers 332a adjacent to each other in the X-axis direction becomes constant.

The third movable comb electrode 333 is formed by a part of the device layer 392. The third movable comb electrode 333 is disposed between the third main body portion 323a of the third support portion 323 and the first end 307a of the movable unit 307 when viewed from the X-axis direction. The third movable comb electrode 333 includes a plurality of third movable comb fingers 333a. Each of the third movable comb fingers 333a is provided on a side surface, which is opposite to the second torsion bar 312, in the third main body portion 323a of the third support portion 323. Each of the third movable comb fingers 333a extends along a plane perpendicular to the X-axis direction. The plurality of third movable comb fingers 333a are arranged in such a manner that an interval between the third movable comb fingers 333a adjacent to each other in the X-axis direction becomes constant.

The fourth movable comb electrode 334 is formed by a part of the device layer 392. The fourth movable comb electrode 334 is disposed between the fourth main body portion 324a of the fourth support portion 324 and the second end 307b of the movable unit 307 when viewed from the X-axis direction. The fourth movable comb electrode 334 includes a plurality of fourth movable comb fingers 334a. Each of the fourth movable comb fingers 334a is provided on a side surface, which is opposite to the second torsion bar 312, in the fourth main body portion 324a of the fourth support portion 324. Each of the fourth movable comb fingers 334a extends along a plane perpendicular to the X-axis direction. The plurality of fourth movable comb fingers 334a are arranged in such a manner that an interval between the fourth movable comb fingers 334a adjacent to each other in the X-axis direction becomes constant.

The fifth movable comb electrode 335 is formed by a part of the device layer 392. The fifth movable comb electrode 335 includes a plurality of fifth movable comb fingers 335a. Each of the fifth movable comb fingers 335a is provided on a side surface, which is opposite to the fifth main body portion 372, in a portion including the first end 307a in the frame 373. Each of the fifth movable comb fingers 335a extends along a plane perpendicular to the X-axis direction. The plurality of fifth movable comb fingers 335a are arranged in such a manner that an interval between the fifth movable comb fingers 335a adjacent to each other in the X-axis direction becomes constant.

The sixth movable comb electrode 336 is formed by a part of the device layer 392. The sixth movable comb electrode 336 includes a plurality of sixth movable comb fingers 336a. Each of the sixth movable comb fingers 336a is provided on a side surface, which is opposite to the fifth main body portion 372, in a portion including the second end 307b in the frame 373. Each of the sixth movable comb fingers 336a extends along a plane perpendicular to the X-axis direction. The plurality of the sixth movable comb fingers 336a are arranged in such a manner that an interval between the sixth movable comb fingers 336a adjacent to each other in the X-axis direction becomes constant.

The optical device 301 further includes a first fixed comb electrode 341, a second fixed comb electrode 342, a third fixed comb electrode 343, a fourth fixed comb electrode 344, a fifth fixed comb electrode 345, and a sixth fixed comb electrode 346. The first fixed comb electrode 341, the second fixed comb electrode 342, the third fixed comb electrode 343, the fourth fixed comb electrode 344, the fifth fixed comb electrode 345, and the sixth fixed comb electrode 346 are provided in the base 305.

The first fixed comb electrode 341 is formed by a part of the device layer 392. The first fixed comb electrode 341 includes a plurality of first fixed comb fingers 341a. Each of the first fixed comb fingers 341a is provided on a side surface of the base 305 which faces the side surface of the first main body portion 321a on which the plurality of first movable comb fingers 331a are provided. Each of the first fixed comb fingers 341a extends along a plane perpendicular to the X-axis direction. The plurality of first fixed comb fingers 341a are arranged in such a manner that an interval between the first fixed comb fingers 341a adjacent to each other in the X-axis direction becomes constant, and are disposed alternately with the plurality of first movable comb fingers 331a. The first movable comb finger 331a and the first fixed comb finger 341a adjacent to each other face each other in the X-axis direction. For example, an interval between the first movable comb finger 331a and the first fixed comb finger 341a adjacent to each other is approximately several μm.

The second fixed comb electrode 342 is formed by a part of the device layer 392. The second fixed comb electrode 342 includes a plurality of second fixed comb fingers 342a. Each of the second fixed comb fingers 342a is provided on a side surface of the base 305 which faces the side surface of the second main body portion 322a on which the plurality of second movable comb fingers 332a are provided. Each of the second fixed comb fingers 342a extends along a plane perpendicular to the X-axis direction. The plurality of second fixed comb fingers 342a are arranged in such a manner that an interval between the second fixed comb fingers 342a adjacent to each other in the X-axis direction becomes constant, and are deposed alternately with the plurality of second movable comb fingers 332a. The second movable comb finger 332a and the second fixed comb finger 342a which are adjacent face each other in the X-axis direction. For example, an interval between the second movable comb finger 332a and the second fixed comb finger 342a which are adjacent to each other is approximately several μm.

The third fixed comb electrode 343 is formed by a part of the device layer 392. The third fixed comb electrode 343 includes a plurality of third fixed comb fingers 343a. Each of the third fixed comb fingers 343a is provided on a side surface of the base 305 which faces the side surface of the third main body portion 323a on which the plurality of third movable comb fingers 333a are provided. Each of the third fixed comb fingers 343a extends along a plane perpendicular to the X-axis direction. The plurality of third fixed comb fingers 343a are arranged in such a manner that an interval between the third fixed comb fingers 343a adjacent to each other in the X-axis direction becomes constant, and are disposed alternately with the plurality of third movable comb fingers 333a. The third movable comb finger 333a and the third fixed comb finger 343a adjacent to each other face each other in the X-axis direction. For example, an interval between the third movable comb finger 333a and the third fixed comb finger 343a adjacent to each other is approximately several μm.

The fourth fixed comb electrode 344 is formed by a part of the device layer 392. The fourth fixed comb electrode 344 includes a plurality of fourth fixed comb fingers 344a. Each of the fourth fixed comb fingers 344a is provided on a side surface of the base 305 which faces the side surface of the fourth main body portion 324a on which the plurality of fourth movable comb fingers 334a are provided. Each of the fourth fixed comb fingers 344a extends along a plane perpendicular to the X-axis direction. The plurality of fourth fixed comb fingers 344a are arranged in such a manner that an interval between the fourth fixed comb fingers 344a adjacent to each other in the X-axis direction becomes constant, and are disposed alternately with the plurality of fourth movable comb fingers 334a. The fourth movable comb finger 334a and the fourth fixed comb finger 344a adjacent to each other face each other in the X-axis direction. For example, an interval between the fourth movable comb finger 334a and the fourth fixed comb finger 344a adjacent to each other is approximately several μm.

The fifth fixed comb electrode 345 is formed by a part of the device layer 392. The fifth fixed comb electrode 345 includes a plurality of fifth fixed comb fingers 345a. Each of the fifth fixed comb fingers 345a is provided on a side surface of the base 305 which faces the side surface of the frame 373 on which the plurality of fifth movable comb fingers 335a are provided. Each of the fifth fixed comb fingers 345a extends along a plane perpendicular to the X-axis direction. The plurality of fifth fixed comb fingers 345a are arranged in such a manner that an interval between the fifth fixed comb fingers 345a adjacent to each other in the X-axis direction becomes constant, and are disposed alternately with the plurality of fifth movable comb fingers 335a. The fifth movable comb finger 335a and the fifth fixed comb finger 345a adjacent to each other face each other in the X-axis direction. For example, an interval between the fifth movable comb finger 335a and the fifth fixed comb finger 345a adjacent to each other is approximately several μm.

The sixth fixed comb electrode 346 is formed by a part of the device layer 392. The sixth fixed comb electrode 346 includes a plurality of sixth fixed comb fingers 346a. Each of the sixth fixed comb fingers 346a is provided on a side surface of the base 305 which faces the side surface of the frame 373 on which the plurality of sixth movable comb fingers 336a are provided. Each of the sixth fixed comb fingers 346a extends along a plane perpendicular to the X-axis direction. The plurality of sixth fixed comb fingers 346a are arranged in such a manner that an interval between the sixth fixed comb fingers 346a adjacent to each other in the X-axis direction becomes constant, and are disposed alternately with the plurality of sixth movable comb fingers 336a. The sixth movable comb finger 336a and the sixth fixed comb finger 346a which are adjacent to each other face each other in the X-axis direction. For example, an interval between the sixth movable comb finger 336a and the sixth fixed comb finger 346a adjacent to each other is approximately several μm.

A plurality of electrode pads 302, 303, and 304 are provided on the surface 392a of the device layer 392 that constitutes the base 305. A plurality of wiring portions 351, 352, and 353 are formed in the device layer 392 that constitutes the base 305 by defining parts of the device layer 392 with grooves. The electrode pads 302 are electrically connected to the first movable comb electrode 331, the second movable comb electrode 332, the third movable comb electrode 333, the fourth movable comb electrode 334, the fifth movable comb electrode 335, and the sixth movable comb electrode 336 through the wiring portions 351. The electrode pad 303 located near the fifth fixed comb electrode 345 is electrically connected to the fifth fixed comb electrode 345 through the wiring portion 352 located near the fifth fixed comb electrode 345. The electrode pad 303 located near the sixth fixed comb electrode 346 is electrically connected to the sixth fixed comb electrode 346 through the wiring portion 352 located near the sixth fixed comb electrode 346. The electrode pad 304 located near the first fixed comb electrode 341 is electrically connected to the first fixed comb electrode 341 through the wiring portion 353 located near the first fixed comb electrode 341. The electrode pad 304 located near the second fixed comb electrode 342 is electrically connected to the second fixed comb electrode 342 through the wiring portion 353 located near the second fixed comb electrode 342. The electrode pad 304 located near the third fixed comb electrode 343 is electrically connected to the third fixed comb electrode 343 through the wiring portion 353 located near the third fixed comb electrode 343. The electrode pad 304 located near the fourth fixed comb electrode 344 is electrically connected to the fourth fixed comb electrode 344 through the wiring portion 353 located near the fourth fixed comb electrode 344. Note that the plurality of electrode pads 302, 303, and 304 are not illustrated in FIG. 24 and FIG. 25.

The fifth movable comb electrode 335 and the fifth fixed comb electrode 345, and the sixth movable comb electrode 336 and the sixth fixed comb electrode 346 are used as electrodes for driving. Specifically, a voltage is periodically applied to between the fifth movable comb electrode 335 and the fifth fixed comb electrode 345, and between the sixth movable comb electrode 336 and the sixth fixed comb electrode 346 through the plurality of electrode pads 302 and 303, respectively. Accordingly, an electrostatic force is generated between the fifth movable comb electrode 335 and the fifth fixed comb electrode 345 and between the sixth movable comb electrode 336 and the sixth fixed comb electrode 346, and an elastic force is generated in the first torsion bar 311 and the second torsion bar 312. In the optical device 301, it is possible to cause the movable unit 307 to swing at an oscillation frequency level with the axial line L301 set as a central line by applying a periodic electric signal to the plurality of electrode pads 302 and 303 (that is, the optical function unit 371 swings).

The first movable comb electrode 331 and the first fixed comb electrode 341, the second movable comb electrode 332 and the second fixed comb electrode 342, the third movable comb electrode 333 and the third fixed comb electrode 343, and the fourth movable comb electrode 334 and the fourth fixed comb electrode 344 are used as electrode for monitoring. Specifically, electrostatic capacitance between the first movable comb electrode 331 and the first fixed comb electrode 341, between the second movable comb electrode 332 and the second fixed comb electrode 342, between the third movable comb electrode 333 and the third fixed comb electrode 343, and between the fourth movable comb electrode 334 and the fourth fixed comb electrode 344 is detected through the plurality of electrode pads 302 and 304. The electrostatic capacitance varies in correspondence with a swing angle of the movable unit 307 (that is, a swing angle of the optical function unit 371). Accordingly, it is possible to feedback-control the swing angle of the movable unit 307 (that is, the swing angle of the optical function unit 371) by adjusting the drive signal (magnitude, a cycle, and the like of an application voltage) in correspondence with detected electrostatic capacitance.

In the optical device 301, a portion except for the optical function unit 371 and the plurality of electrode pads 303 and 304 is integrally formed in the SOI substrate 309 with an MEMS technology (patterning and etching). In the optical device 301, at least, the portion integrally formed in the SOI substrate 309 has a shape linearly symmetric to the axial line L301 and is linearly symmetric to the axial line L302 when viewed from the z-axis direction.

Figure 23:
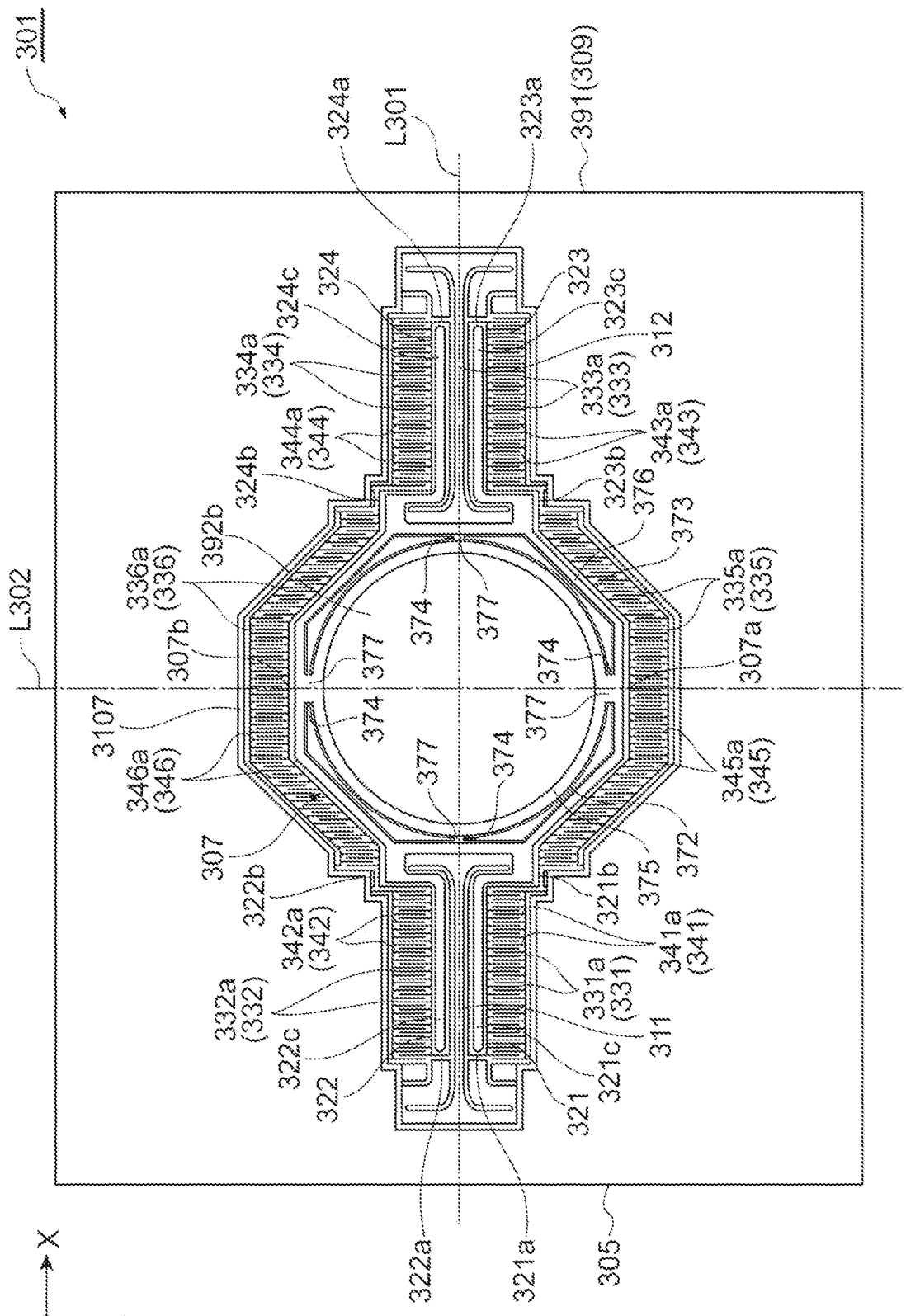
FIG. 23 is a bottom view of the optical device illustrated in FIG. 22.
Figure 24:
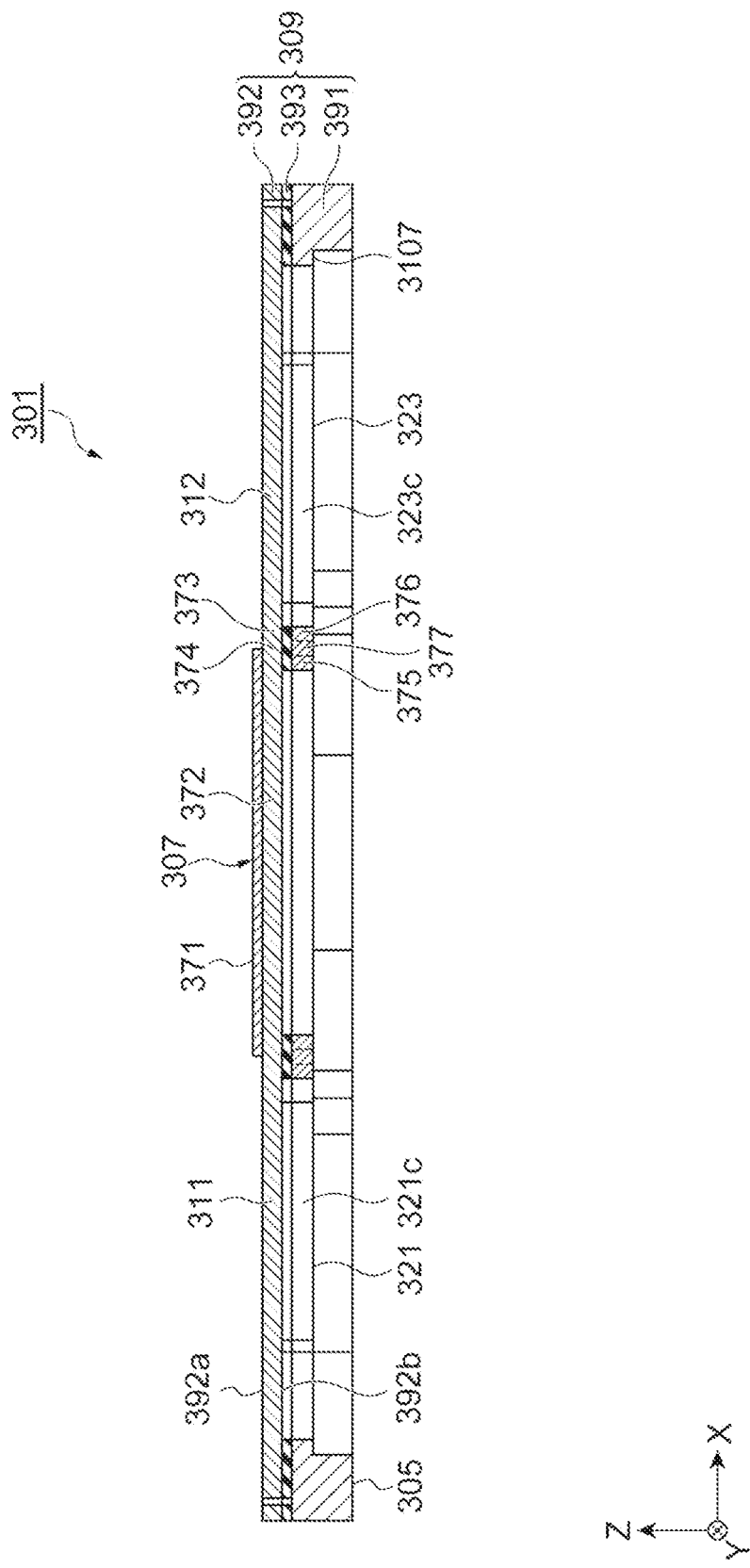
FIG. 24 is a cross-sectional view of the optical device along line XXIV-XXIV illustrated in FIG. 22.
Figure 25:
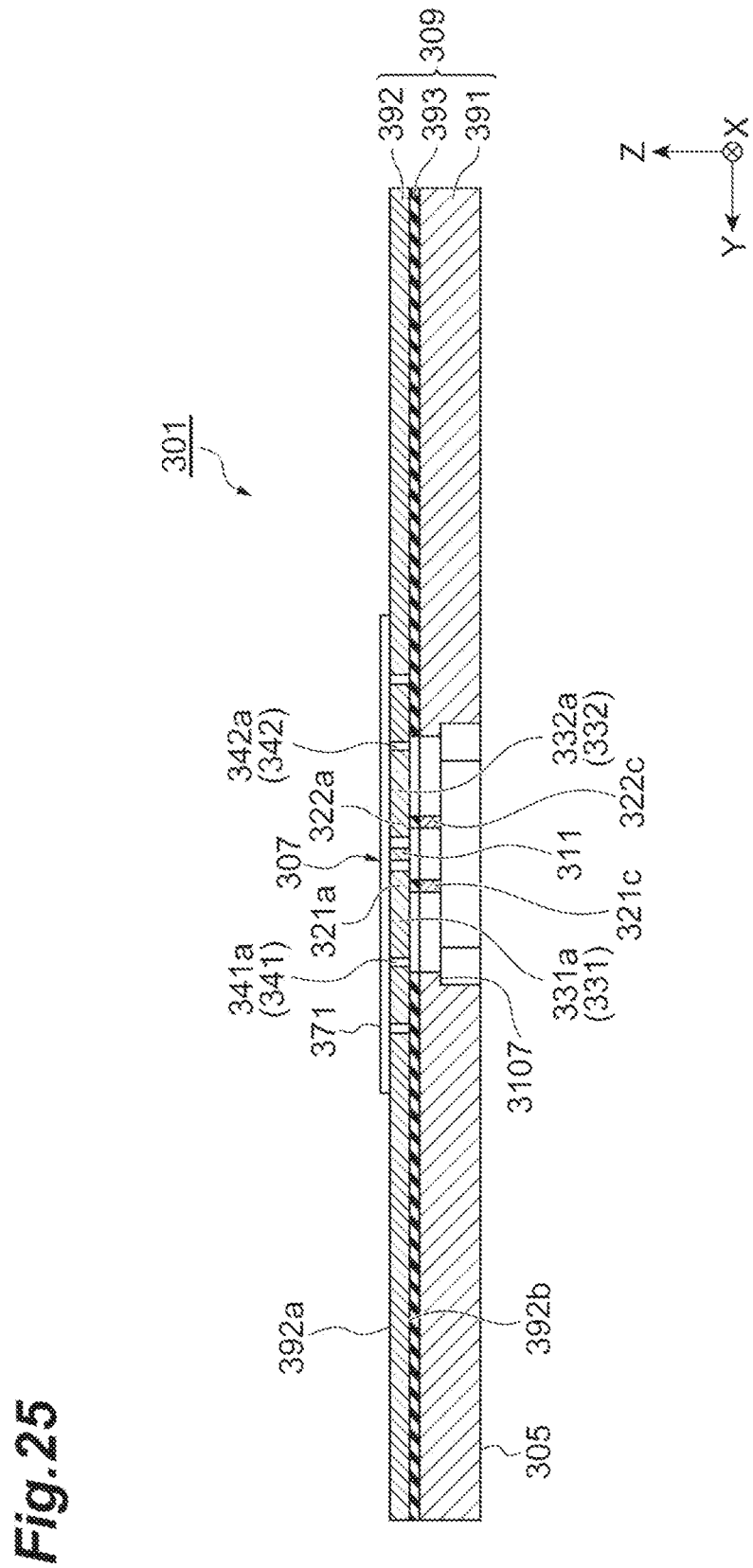
FIG. 25 is a cross-sectional view of the optical device along line XXV-XXV illustrated in FIG. 22.

The optical device 301 of the second embodiment can be manufactured by a manufacturing method similar to the method of manufacturing the mirror device 20 according to the first embodiment. That is, the rib portion (main body rib portions 375, the frame rib portion 376, the connection rib portion 377, and the first, second, third, and fourth rib portions 321c, 322c, 323c, and 324c) can be formed by two-stage etching using the first and second resist layers as a mask. In this case, as in the first embodiment, it is possible to form the rib portions with accuracy. Note that, a stepped surface 3107 corresponding to the above-described stepped surface 107 is illustrated in FIG. 23 to FIG. 25.

Third Embodiment

Figure 26:
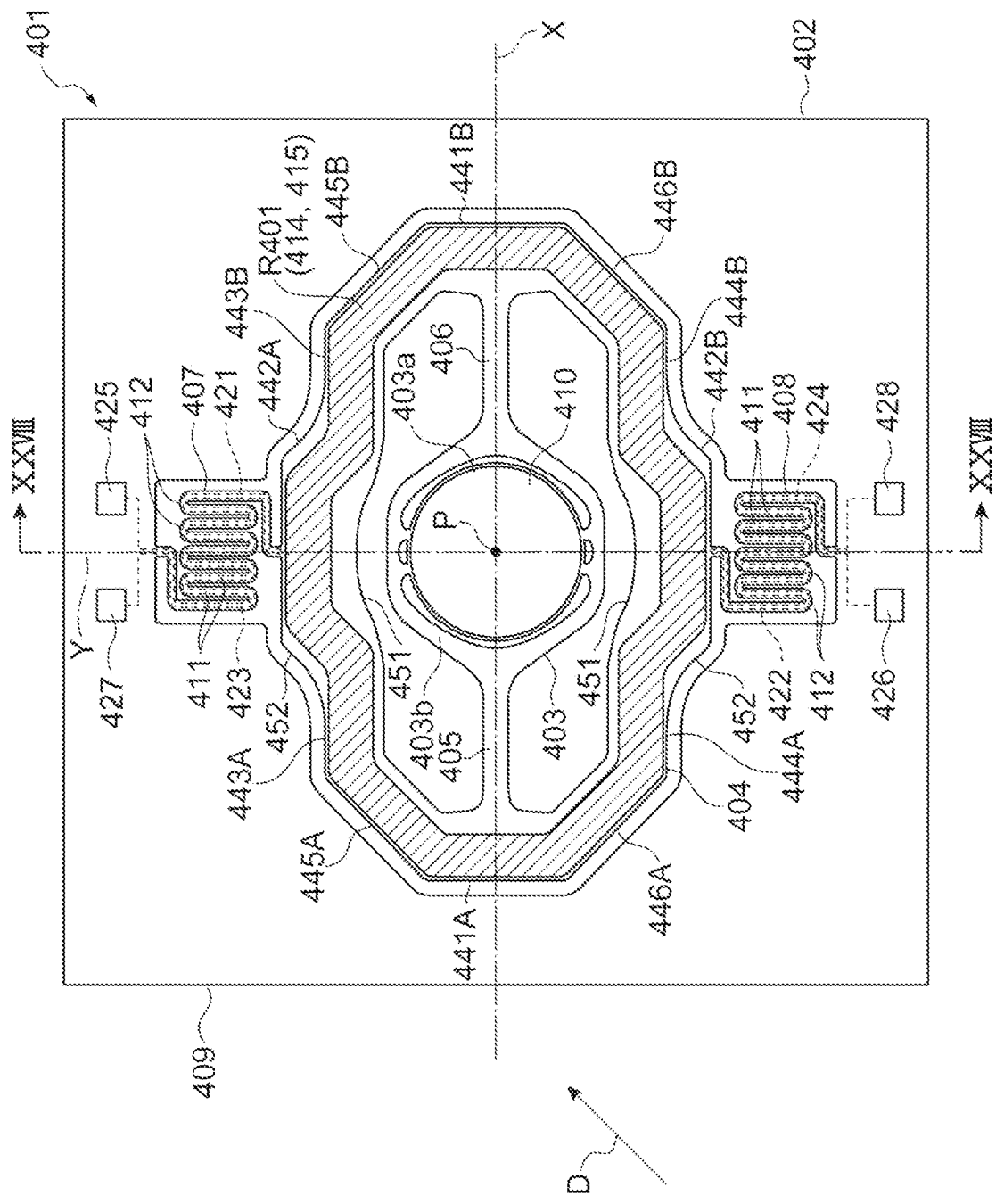
FIG. 26 is a plan view of an optical device of a third embodiment.
Figure 27:
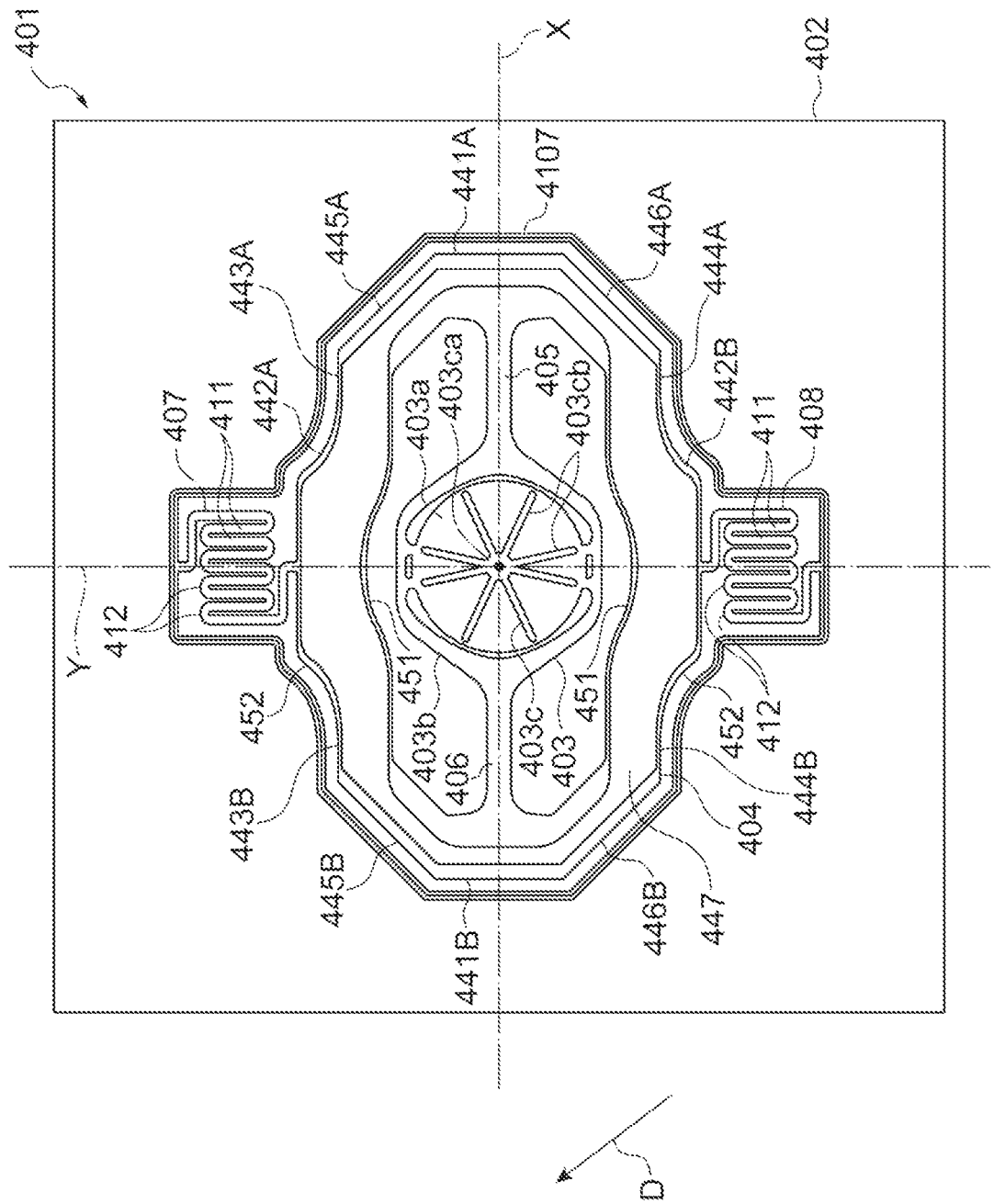
FIG. 27 is a bottom view of the optical device illustrated in FIG. 26.
Figure 28:
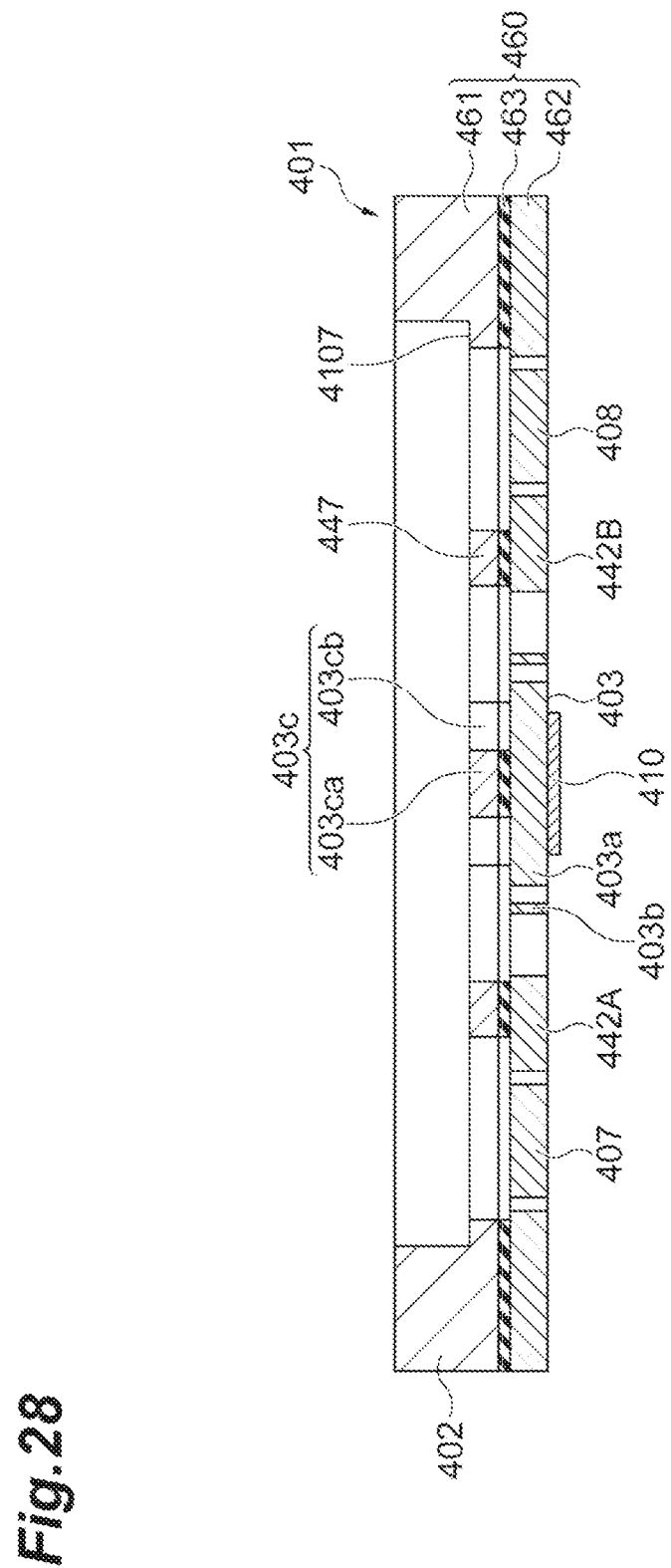
FIG. 28 is a cross-sectional view of the optical device along line XXVIII-XXVIII illustrated in FIG. 26.

An optical device 401 according to a third embodiment will be described with reference to FIG. 26 to FIG. 28. The optical device 401 includes a support portion (base) 402, a first movable unit 403, a second movable unit 404, a pair of first torsion bars (elastic support portions) 405 and 406, a pair of second torsion bars (elastic support portions) 407 and 408, and a magnetic field generation portion 409.

In the optical device 401, the first movable unit 403 on which a mirror surface (optical function unit) 410 is disposed is caused to swing around each of an X-axis (first axial line) and a Y-axis (second axial line perpendicular to the first axial line) which are perpendicular to each other. For example, the optical device 401 is used in an optical switch for optical communication, an optical scanner, and the like.

For example, the support portion 402, the first movable unit 403, the second movable unit 404, the pair of first torsion bars 405 and 406, and the pair of second torsion bars 407 and 408 are integrally formed by a silicon on insulator (SOI) substrate (semiconductor substrate) 460. That is, the optical device 401 is constituted as an MEMS device. The SOI substrate 460 includes a support layer 461, a device layer 462, and an intermediate layer 463. The support layer 461 is a first silicon layer (a first semiconductor layer). The device layer 462 is a second silicon layer (a second semiconductor layer). The intermediate layer 463 is an insulating layer disposed between the support layer 461 and the device layer 462.

For example, the magnetic field generation portion 409 is constituted by a permanent magnet having a Halbach array, or the like. For example, the magnetic field generation portion 409 generates a magnetic field in a direction D inclined by 45° with respect to each of the X-axis and the Y-axis in plan view, and causes the magnetic field to act on the coil 414. Note that, "in plan view" represents "when viewed from a direction perpendicular to the mirror surface 410", in other words, "when viewed from a direction perpendicular to the X-axis and the Y-axis". The direction D of the magnetic field generated by the magnetic field generation portion 409 may be inclined by an angle other than 45° with respect to the X-axis and the Y-axis in plan view.

For example, the support portion 402 has a square external shape in plan view, and is formed in a frame shape. The support portion 402 is disposed on one side in a direction perpendicular to the X-axis and the Y-axis with respect to the magnetic field generation portion 409. The support portion 402 supports the first movable unit 403, the second movable unit 404, and the like. The support portion 402 is constituted by parts of the support layer 461, the device layer 462, and the intermediate layer 463.

The first movable unit 403 is disposed on an inner side of the support portion 402 in a state of being spaced apart from the magnetic field generation portion 409. The first movable unit 403 has a shape symmetric with respect to the X-axis and the Y-axis in plan view. The first movable unit 403 includes a main body portion 403a, a ring-shaped portion 403b, and a rib portion 403c. The main body portion 403a and the ring-shaped portion 403b are constituted by parts of the device layer 462.

The main body portion 403a has a circular shape in plan view, but may be formed in any shape such as an elliptical shape, a square shape, and a rhomboidal shape. In plan view, a center P of the main body portion 403a matches an intersection between the X-axis and the Y-axis. For example, a circular mirror surface 410 is provided by a metal film formed from aluminum on a surface of the main body portion 403a which is opposite to the magnetic field generation portion 409 (on a surface opposite to the intermediate layer 463 in the device layer 462 that constitutes the main body portion 403a). The mirror surface 410 is provided on an approximately entire surface of the surface, but may be provided on a part of the surface. The ring-shaped portion 403b is formed in a ring shape to surround the main body portion 403a in plan view. The ring-shaped portion 403b has an octagonal external shape in plan view, but may have any external shape such as a circular shape, an elliptical shape, a square shape, and a rhomboidal shape. The ring-shaped portion 403b is connected to the main body portion 403a on both sides of the Y-axis direction parallel to the Y-axis.

The rib portion 403c is constituted by the support layer 461 and the intermediate layer 463 which are disposed on the device layer 462. The rib portion 403c includes a central portion 403ca, and a plurality of (eight in this example) extending portions 403cb. The central portion 403ca is disposed at the center P of the main body portion 403a and has an approximately circular shape in plan view. The plurality of extending portions 403cb straightly extend from the central portion 403ca in a radial direction. The support layer 461 that constitutes the central portion 403ca and the extending portion 403cb is thinner than the support layer 461 that constitutes the base 402.

The second movable unit 404 is formed in a frame shape, and is disposed on an inner side of the support portion 402 to surround the first movable unit 403 in a state of being spaced apart from the magnetic field generation portion 409. The second movable unit 404 includes a pair of first connection portions 441A and 441B, a pair of second connection portions 442A and 442B, a pair of first linear portions 443A and 443B, a pair of second linear portions 444A and 444B, a pair of third linear portions 445A and 445B, a pair of fourth linear portions 446A and 446B, and a rib portion 447. The connection portions 441A to 442B and the linear portions 443A to 446B are constituted by a part of the device layer 462. The second movable unit 404 has a symmetric shape with respect to each of the X-axis and the Y-axis in plan view. In the following description, symmetry with respect to the X-axis or the Y-axis represents symmetry in plan view.

The first connection portions 441A and 441B are located on both sides of the first movable unit 403 in the X-axis direction parallel to the X-axis. The first connection portions 441A and 441B extend along the Y-axis direction. The second connection portions 442A and 442B are located on both sides of the first movable unit 403 in the Y-axis direction parallel to the Y-axis. The second connection portions 442A and 442B extend along the X-axis direction. An inner edge of each of the second connection portions 442A and 442B in plan view includes a depression 451 recessed in the Y-axis direction, and an outer edge of each of the second connection portions 442A and 442B in plan view includes a protrusion 452 that protrudes in the Y-axis direction. The depression 451 and the protrusion 452 are located on the Y-axis in plan view.

The first linear portions 443A and 443B are located on both sides of the second connection portion 442A in the X-axis direction, and are connected to the second connection portion 442A. The first linear portions 443A and 443B extend along the X-axis direction. The first linear portions 443A and 443B are disposed to be symmetric to each other with respect to the Y-axis. The second linear portions 444A and 444B are located on both sides of the second connection portion 442B in the X-axis direction, and is connected to the second connection portion 442B. The second linear portions 444A and 444B extend along the X-axis direction. The second linear portions 444A and 444B are disposed to be symmetric to each other with respect to the Y-axis.

The third linear portions 445A and 445B are located on a side opposite to the second connection portion 442A with respect to the first linear portions 443A and 443B, and are connected to the first linear portions 443A and 443B, and the first connection portions 441A and 441B. The third linear portion 445A extends in a direction inclined by 45° with respect to each of the X-axis and the Y-axis in plan view. The third linear portion 445B extends to be symmetric to the third linear portion 445A with respect to the Y-axis.

The fourth linear portions 446A and 446B are located on a side opposite to the second connection portion 442B with respect to the second linear portions 444A and 444B, and are connected to the second linear portions 444A and 444B and the first connection portions 441A and 441B. The fourth linear portion 446A extends to be symmetric to the third linear portion 445A with respect to the X-axis. The fourth linear portion 446B extends to be symmetric to the fourth linear portion 446A with respect to the Y-axis, and extends to be symmetric to the third linear portion 445B with respect to the X-axis.

The rib portion 447 is constituted by the support layer 461 and the intermediate layer 463 which are disposed on the device layer 462. The rib portion 447 is disposed on the connection portions 441A to 442B and the linear portions 443A to 446B, and extends in an annular shape to surround the first movable unit 403 in plan view. A width of the rib portion 447 in the first connection portions 441A and 441B and the linear portions 445A to 446B is narrower than a width of the rib portion 447 in the second connection portions 442A and 442B and the linear portions 443A to 444B. The support layer 461 that constitutes the rib portion 447 is thinner than the support layer 461 that constitutes the base 402.

The first torsion bars 405 and 406 are disposed on both sides of the first movable unit 403 on the X-axis. The first torsion bars 405 and 406 connect the first movable unit 403 (ring-shaped portion 403b) and the second movable unit 404 to each other on the X-axis so that the first movable unit 403 can swing around the X-axis (with the X-axis set as a central line). As to be described later, the first torsion bars 405 and 406 are connected to the support portion 402 through the second movable unit 404 and the second torsion bars 407 and 408. That is, it may be regarded that the first torsion bars 405 and 406 connect the first movable unit 403 and the support portion 402 so that the first movable unit 403 can swing around the X-axis. The first torsion bars 405 and 406 are connected to the second movable unit 404 in the first connection portions 441A and 441B. Each of the first torsion bars 405 and 406 is twisted and deformed when the first movable unit 403 swings around the X-axis. The first torsion bars 405 and 406 have a plate shape that extends along a plane parallel to the mirror surface 410. The entirety of the first torsion bars 405 and 406 are located on the X-axis. The first torsion bar 406 is disposed to be symmetric to the first torsion bar 405 with respect to the Y-axis. The first torsion bars 405 and 406 are constituted by a part of the device layer 462.

The second torsion bars 407 and 408 are disposed on both sides of the second movable unit 404 on the Y-axis. The second torsion bars 407 and 408 connect the second movable unit 404 and the support portion 402 on the Y-axis so that the second movable unit 404 can swing around the Y-axis (with the Y-axis set as a central line). The second torsion bars 407 and 408 are connected to the second movable unit 404 in the second connection portions 442A and 442B. The second torsion bars 407 and 408 are twisted and deformed when the second movable unit 404 swings around the Y-axis. The second torsion bars 407 and 408 extend in a zigzag manner in plan view. Each of the second torsion bars 407 and 408 includes a plurality of linear portions 411 and a plurality of folded portions 412. The plurality of linear portions 411 extend along the Y-axis direction and are aligned in the X-axis direction. The plurality of folded portions 412 alternately connect both ends of the linear portions 411 which are adjacent to each other. The second torsion bars 407 and 408 are constituted by a part of the device layer 462.

The optical device 401 further includes a pair of coils 414 and 415, a first wiring 421, a second wiring 422, a third wiring 423, a fourth wiring 424, a first external terminal 425, a second external terminal 426, a third external terminal 427, and a fourth external terminal 428. Each of the coils 414 and 415 is provided in the second movable unit 404 to surround the first movable unit 403, and has a spiral shape in plan view. Each of the coils 414 and 415 is disposed along a plane including the X-axis and the Y-axis. Each of the coils 414 and 415 wound around the first movable unit 403 a plurality of times. The pair of coils 414 and 415 are disposed to be alternately aligned in a width direction of the second movable unit 404 in plan view. In FIG. 26, a disposition region R401 in which the coils 414 and 415 are disposed is indicated by hatching. For example, the coils 414 and 415 are damascene wiring embedded in the second movable unit 404.

Each of the external terminals 425 to 428 is, for example, an electrode pad provided in the support portion 402. The first wiring 421 is electrically connected to an inner end of the coil 414 and the first external terminal 425. The first wiring 421 extends from the inner end of the coil 414 up to the first external terminal 425 through the second torsion bar 407. The second wiring 422 is electrically connected to an outer end of the coil 414 and the second external terminal 426. For example, the second wiring 422 is connected to the outer end of the coil 414 on the Y-axis. The second wiring 422 extends from the outer end of the coil 414 up to the second external terminal 426 through the second torsion bar 408.

The third wiring 423 is electrically connected to an inner end of the coil 415 and the third external terminal 427. The third wiring 423 extends from the inner end of the coil 415 up to the third external terminal 427 through the second torsion bar 407. The fourth wiring 424 is electrically connected to an outer end of the coil 415 and the fourth external terminal 428. For example, the fourth wiring 424 is connected to an outer end of the coil 415 on the Y-axis. The fourth wiring 424 extends from the outer end of the coil 415 up to the fourth external terminal 428 through the second torsion bar 408.

In the optical device 401 configured as described above, when a drive signal for a linear operation is input to the coil 414 through each of the external terminals 425 and 426 and each of the wiring 421 and 422, a Lorenz force acts on the coil 414 by a mutual interaction with a magnetic field generated by the magnetic field generation portion 409. It is possible to cause the mirror surface 410 (first movable unit 403) to linearly operate around the Y-axis together with the second movable unit 404 by using balance between the Lorenz force and the elastic force of the second torsion bars 407 and 408.

On the other hand, when a drive signal for an oscillation operation is input to the coil 415 through each of the external terminals 427 and 428 and each of the wirings 423 and 424, a Lorenz force acts on the coil 415 by a mutual interaction with the magnetic field generated by the magnetic field generation portion 409. It is possible to cause the mirror surface 410 (first movable unit 403) to oscillate around the X-axis at an oscillation frequency by using oscillation of the first movable unit 403 in addition to the Lorenz force. Specifically, when a drive signal of the same frequency as the oscillation frequency of the first movable unit 403 around the X-axis is input to the coil 415, the second movable unit 404 slightly vibrates around the X-axis at the frequency. When the vibration is transmitted to the first movable unit 403 through the first torsion bars 405 and 406, it is possible to cause the first movable unit 403 to swing around the X-axis at the frequency.

The optical device 401 of the third embodiment can be manufactured by a manufacturing method similar to the method for manufacturing the mirror device 20 according to the first embodiment. That is, it is possible to form the rib portions (rib portion 403c and the rib portion 447) by two-stage etching using the first and second resist layers as a mask. In this case, as in the first embodiment, it is possible to form the rib portions with accuracy. Note that, a stepped surface 4107 corresponding to the above-described stepped surface 107 is illustrated in FIG. 27 and FIG. 28.

In the optical device 401, driving of the first movable unit 403 is performed by an electromagnetic force, but the driving of the first movable unit 403 may be performed by a piezoelectric element. In this case, for example, in the second movable unit 404, a first piezoelectric film for causing the first movable unit 403 to swing around the X-axis is provided in the second movable unit 404 instead of the coils 414 and 415. For example, the first piezoelectric film is disposed on the first connection portions 441A and 441B, the third linear portions 445A and 445B, and the fourth linear portions 446A and 446B so as to extend along a direction parallel to the Y-axis. In addition, a third movable unit may be provided on an outer side of the second movable unit 404 to surround the second movable unit 404, and a second piezoelectric film for causing the second movable unit 404 to swing around the Y-axis may be provided in the third movable unit. For example, the second piezoelectric film extends along a direction parallel to the X-axis. The magnetic field generation portion 409 is omitted. Respective configurations in the first, second, and third embodiments, or the modification example may be applied to respective configurations in another embodiment or another modification example.

REFERENCE SIGNS LIST

20: mirror device (optical device), 21: base, 21a: first surface (main surface), 21b: second surface (main surface), 22a: mirror surface (optical function unit), 22b: movable unit, 224: rib portion, 26: first elastic support portion, 27: second elastic support portion, 100: SOI substrate (semiconductor substrate), 101: support layer (first semiconductor layer), 101a: surface, 102: device layer (second semiconductor layer), 102a: surface, 103: intermediate layer (insulating layer), 104: first resist layer, 105: depression, 105a: bottom surface, 105b: side surface, 106: second resist layer, 281, 283: fixed comb electrode, 281a, 283a: fixed comb finger, 282, 284: movable comb electrode, 282a, 284a: movable comb finger, 301: optical device, 305: base, 307: movable unit, 311: first torsion bar (elastic support portion), 312: second torsion bar (elastic support portion), 309: SOI substrate (semiconductor substrate), 375: main body rib portion, 376: frame rib portion, 377: connection rib portion, 321c: first rib portion, 322c: second rib portion, 323c: third rib portion, 324c: fourth rib portion, 331: first movable comb electrode, 331a: first movable comb finger, 332: second movable comb electrode, 332a: second movable comb finger, 333: third movable comb electrode, 333a: third movable comb finger, 334: fourth movable comb electrode, 334a: fourth movable comb finger, 335: fifth movable comb electrode, 335a: fifth movable comb finger, 336: sixth movable comb electrode, 336a: sixth movable comb finger, 341: first fixed comb electrode, 341a: first fixed comb finger, 342: second fixed comb electrode, 342a: second fixed comb finger, 343: third fixed comb electrode, 343a: third fixed comb finger, 344: fourth fixed comb electrode, 344a: fourth fixed comb finger, 345: fifth fixed comb electrode, 345a: fifth fixed comb finger, 346: sixth fixed comb electrode, 346a: sixth fixed comb finger, 371: optical function unit, 391: handle layer (first semiconductor layer), 392: device layer (second semiconductor layer), 393: intermediate layer (insulating layer), 401: optical device, 402: support portion (base), 403: first movable unit, 403c: rib portion, 404: second movable unit, 405, 406: first torsion bar (elastic support portion), 407, 408: second torsion bar (elastic support portion), 410: mirror surface (optical function unit), 414, 415: coil, 447: rib portion, 460: SOT substrate (semiconductor substrate), 461: support layer (first semiconductor layer), 462: device layer (second semiconductor layer), 463: intermediate layer (insulating layer).

The invention claimed is:

1. An optical device comprising:
a support portion;
a movable unit; and
a pair of torsion bars disposed on both sides of the movable unit on a first axis and connecting the support portion and the movable unit to each other so that the movable unit can swing around the first axis,
wherein the movable unit includes a main body portion at which an optical function unit is disposed, a ring-shaped portion formed in a ring shape to surround the main body portion when viewed from a predetermined direction perpendicular to the first axis, two connection portions connecting the main body portion and the ring-shaped portion to each other, and a rib portion provided to the main body portion,
each of the two connection portions includes two connection regions that are separated from each other by a space and the each of the two connection region connects the main body portion and the ring-shaped portion to each other, and
the rib portion includes four extending portions radially extending between a center of the main body portion and the four connection regions respectively when viewed from the predetermined direction.

2. The optical device according to claim 1,
wherein when setting a direction parallel to the first axis as a first axis direction, setting an axis that passes through the center of the main body portion and is perpendicular to the first axis and the predetermined direction as a second axis, and setting a direction parallel to the second axis as a second axis direction, the two connection portions are disposed on both sides of the main body portion in the second axis direction.

3. The optical device according to claim 2,
wherein in each of the two connection portions, the two connection regions are disposed on both sides in the first axis direction with respect to the second axis.

4. The optical device according to claim 1,
wherein the four extending portions are connected at the center of the main body portion.

5. The optical device according to claim 1,
wherein the rib portion further includes a central portion, and
the four extending portions extend from the central portion.

6. The optical device according to claim 5,
wherein the central portion is disposed at the center of the main body portion.

7. The optical device according to claim 1,
wherein the four extending portions straightly extend between the center of the main body portion and the four connection regions respectively when viewed from the predetermined direction.

8. The optical device according to claim 2,
wherein the rib portion further includes two extending portions that extend radially toward one side in the first axis direction and two extending portions that extend radially toward the other side in the first axis direction.

9. The optical device according to claim 1,
wherein the support portion, the movable unit, and the pair of torsion bars are constituted by a semiconductor substrate including a first semiconductor layer, a second semiconductor layer, and an insulating layer disposed between the first semiconductor layer and the second semiconductor layer, the main body portion and the ring-shaped portion are constituted by the second semiconductor layer, and the rib portion is constituted by the first semiconductor layer.

10. The optical device according to claim 9, wherein each of the pair of torsion bars has a plate shape and is constituted by the second semiconductor layer.

* * * * *